(12) United States Patent
Ke et al.

(10) Patent No.: US 12,514,113 B2
(45) Date of Patent: *Dec. 30, 2025

(54) ORGANIC-INORGANIC HYBRID PEROVSKITE COMPOUNDS

(71) Applicant: Northwestern University, Evanston, IL (US)

(72) Inventors: Weijun Ke, Evanston, IL (US); Konstantinos Stoumpos, Chicago, IL (US); Ioannis Spanopoulos, Evanston, IL (US); Mercouri G. Kanatzidis, Wilmette, IL (US)

(73) Assignee: Northwestern University, Evanston, IL (US)

( * ) Notice: Subject to any disclaimer, the term of this patent is extended or adjusted under 35 U.S.C. 154(b) by 1121 days.

This patent is subject to a terminal disclaimer.

(21) Appl. No.: 17/495,121

(22) Filed: Oct. 6, 2021

(65) Prior Publication Data

US 2022/0029114 A1 Jan. 27, 2022

Related U.S. Application Data

(63) Continuation of application No. 16/623,873, filed as application No. PCT/US2018/039264 on Jun. 25, 2018, now Pat. No. 11,171,297.

(60) Provisional application No. 62/527,409, filed on Jun. 30, 2017.

(51) Int. Cl.
| | |
|---|---|
| *H01L 51/42* | (2006.01) |
| *C07F 7/22* | (2006.01) |
| *C07F 7/24* | (2006.01) |
| *H01L 51/44* | (2006.01) |
| *H10K 85/50* | (2023.01) |
| *H10K 30/15* | (2023.01) |
| *H10K 30/86* | (2023.01) |
| *H10K 102/10* | (2023.01) |

(52) U.S. Cl.
CPC ........... *H10K 85/50* (2023.02); *C07F 7/2284* (2013.01); *C07F 7/24* (2013.01); *H10K 30/151* (2023.02); *H10K 30/152* (2023.02); *H10K 30/86* (2023.02); *H10K 2102/102* (2023.02)

(58) Field of Classification Search
None
See application file for complete search history.

(56) References Cited

U.S. PATENT DOCUMENTS 11,171,297 B2 * 11/2021 Ke .................. H10K 30/10
2016/0155974 A1 * 6/2016 Wang ................ H10K 85/50
136/265

* cited by examiner

*Primary Examiner* — Jay Yang
(74) *Attorney, Agent, or Firm* — Bell & Manning, LLC

(57) ABSTRACT

Photoactive materials comprising organic-inorganic hybrid halide perovskite compounds are provided. Photovoltaic cells and light-emitting devices incorporating the photoactive materials into their light-absorbing and light-emitting layers, respectively, are also provided. The halide perovskites have an amAMX$_3$ perovskite crystal structure, wherein am is an alkyl diamine cation, an aromatic diamine cation, an aromatic azole cation, a cyclic alkyl diamine cation or a hydrazinediium cation; A is a monovalent alkylammonium cation or an alkali metal cation; X is a halide ion or a combination of halide ions; and M is an octahedrally coordinated bivalent metal atom.

17 Claims, 33 Drawing Sheets

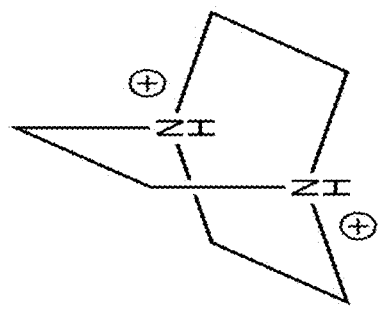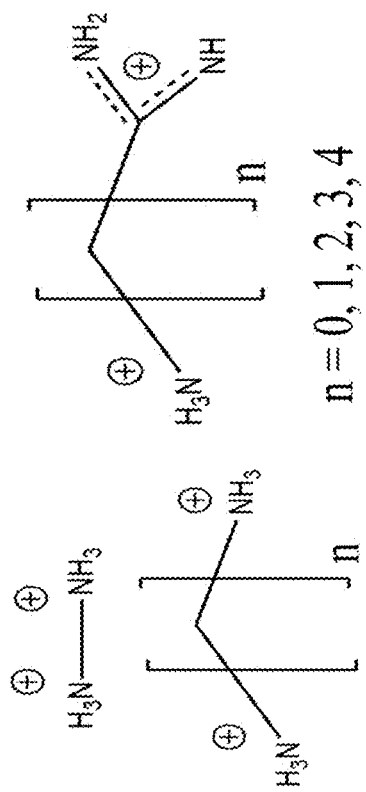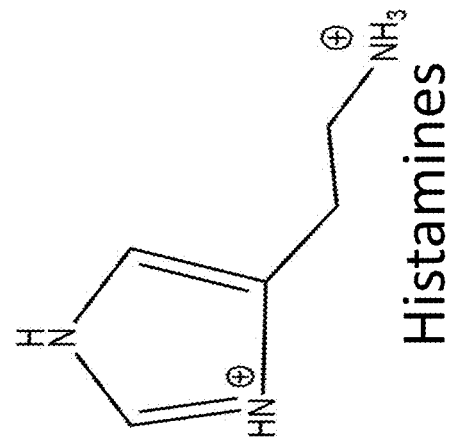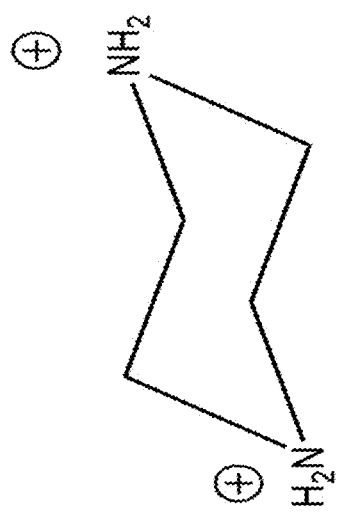
n = 0, 1, 2, 3, 4
Primary alkyl diamines
Tertiary alkyl diamines
Secondary alkyl diamines
Histamines
FIG. 5A

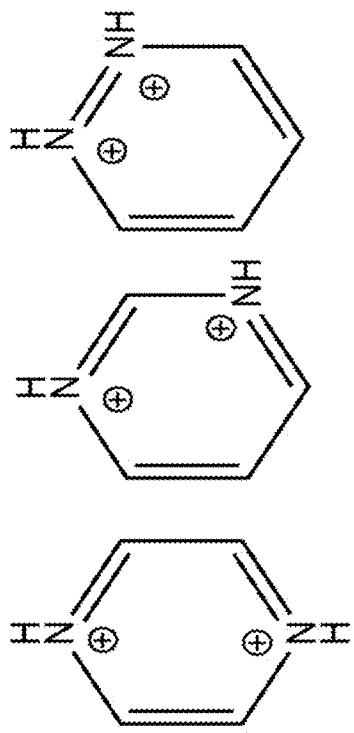
Aromatic diamines
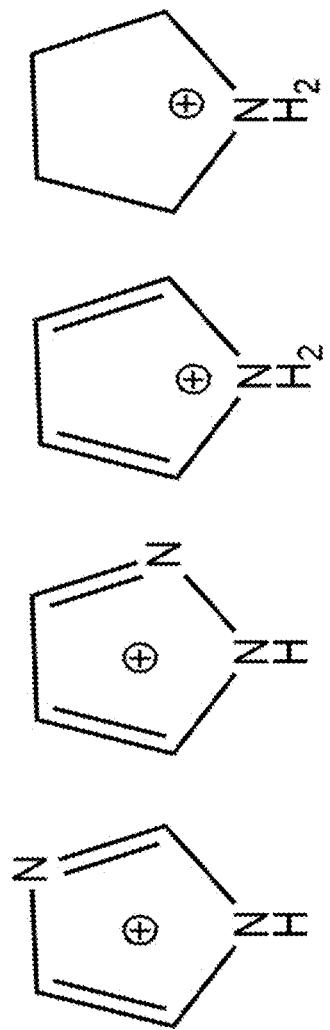
Aromatic azoles
FIG. 5B

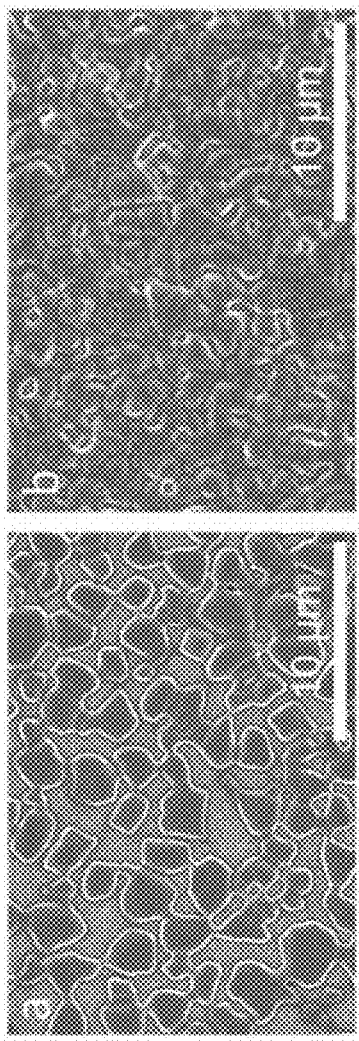
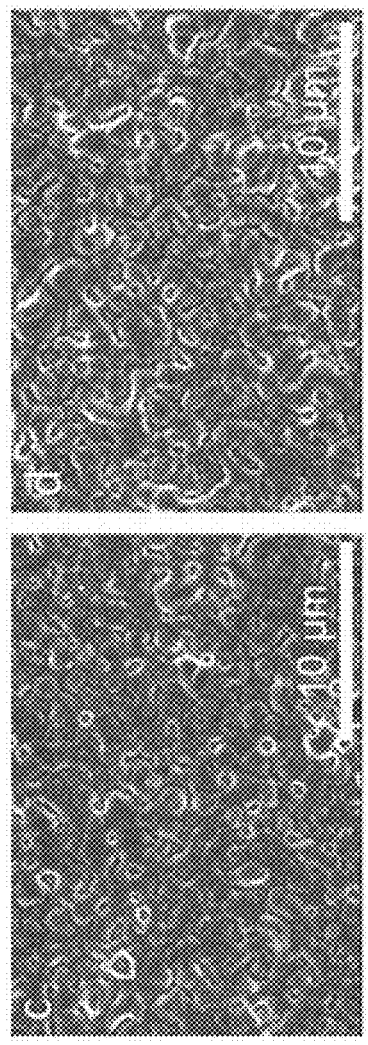
FIG. 7A
FIG. 7B
FIG. 7C
FIG. 7D

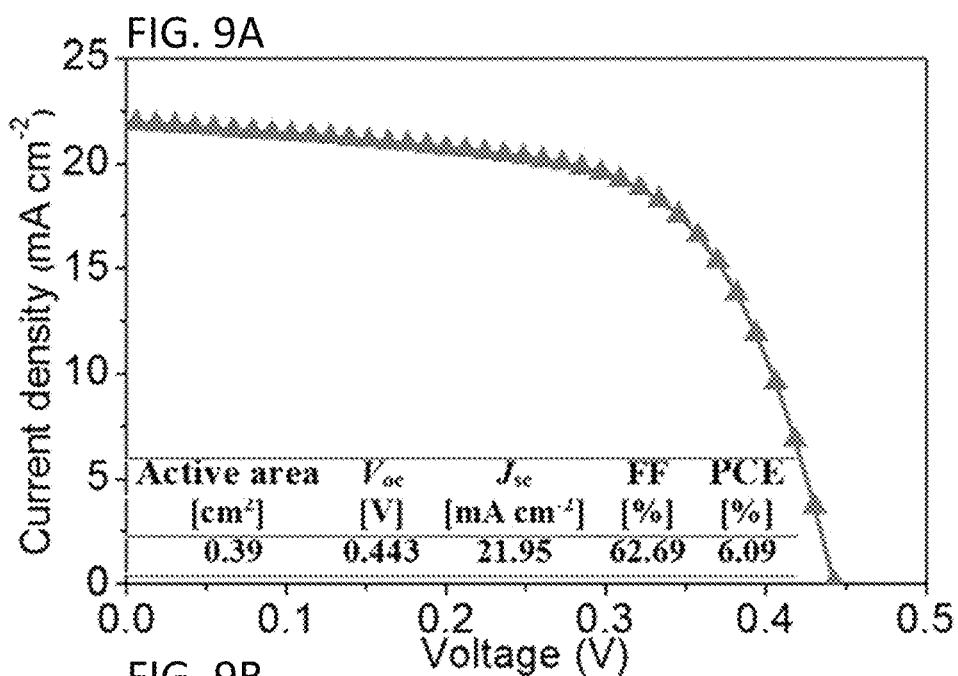
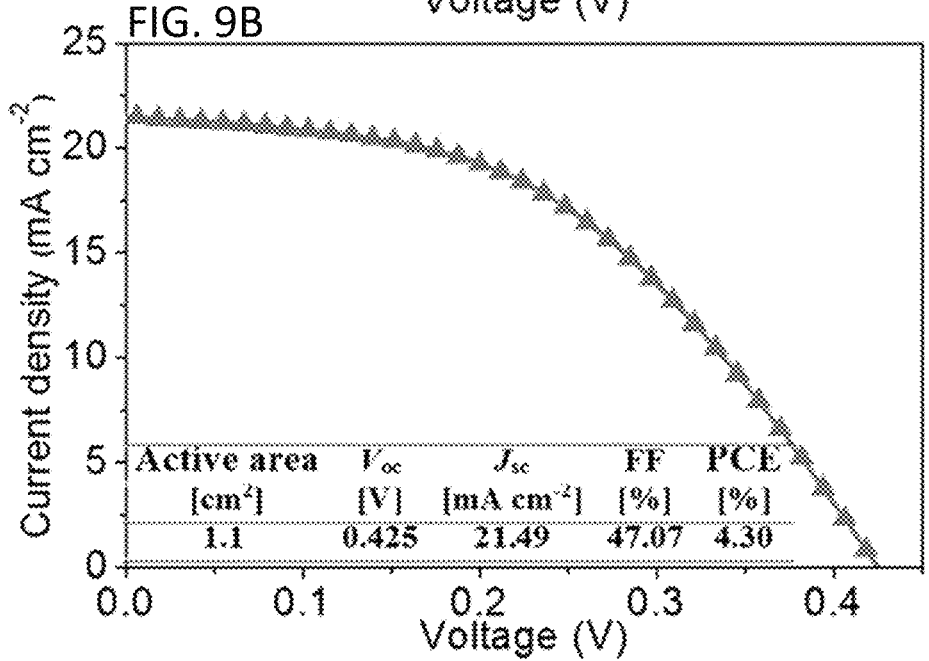

ORGANIC-INORGANIC HYBRID PEROVSKITE COMPOUNDS

CROSS-REFERENCE TO RELATED APPLICATIONS

The present application is a continuation of U.S. patent application Ser. No. 16/623,873 that was filed on Dec. 18, 2019, the entire contents of which are incorporated herein by reference, which is a National Stage of International Application number PCT/US2018/039264 that was filed on Jun. 25, 2018, the entire contents of which are hereby incorporated by reference, which claims priority to U.S. Provisional Patent Application No. 62/527,409 that was filed on Jun. 30, 2017, the entire contents of which are hereby incorporated herein by reference.

REFERENCE TO GOVERNMENT RIGHTS

This invention was made with government support under SC0012541 awarded by the U.S. Department of Energy. The government has certain rights in the invention.

BACKGROUND

Halide perovskites have the $A^+M^{2+}X^-_3$ structural formula, where $A^+$ represent a nonbonding univalent cation, $M^{2+}$ is an octahedrally coordinated bivalent metal ion, and $X^-$ is a monoanionic halide ion. Pb, Sn and Ge can form the genuine perovskite structure, because they fulfill the coordination and charge balance prerequisites. Sn is an especially attractive candidate since its perovskite analogues possess similar, or even superior, optical and electronic characteristics compared to Pb, exhibiting narrower optical band gaps and higher charge-carrier mobilities. Lead-free methylammonium tin iodide ($MASnI_3$) perovskite solar cells and tin iodide ($FASnI_3$) perovskite solar cells have been reported. Thus far, the efficiency of Sn-based perovskite solar cells has been low, and the stability of Sn-based perovskite solar cells is usually very poor in air. The low photovoltaic performance and poor environmental stability of the solar cells comes from the low redox potential of $Sn^{2+}$, which tends to oxidize to $Sn^{4+}$ when exposed to the atmosphere.

SUMMARY

Photoactive materials comprising discrete single crystals of organic-inorganic hybrid halide perovskite compounds are provided. Electronic devices, including optoelectronic devices, incorporating the photoactive materials into their light-absorbing and light-emitting layers, respectively, are also provided. The devices include photovoltaic cells; radiation detectors; light-emitting devices, such as light-emitting diodes; and transistors, including phototransistors.

The halide perovskites have an $amAMX_3$ crystal structure, where am is an alkyl diamine cation (for example, an alkyl diammonium cation), an aromatic diamine cation, an aromatic azole cation, or a cyclic alkyl diamine cation. A is a monovalent alkylammonium cation or an alkali metal cation (Group I cation), X is a halide ion, and M is an octahedrally coordinated bivalent metal atom. The diamines can be primary, secondary, or tertiary diamines. Am can also represent a hydrazinediium cation. In some embodiments, am is an alkyl amine-functionalized aromatic azole, such as a histamine. In some embodiments, the am cation is an alkylene diammonium cation. In some embodiments, am is ethylene diammonium, en. In these embodiments, the halide perovskites can be represented by the formula $enAMX_3$, wherein en is the ethylene diammonium cation ($[NH_3CH_2CH_2NH_3]$).

One embodiment of an electronic device comprises: (a) a first electrically conductive contact (for example, a first electrode); (b) a second electrically conductive contact (for example, a second electrode); (c) a photoactive material in electrical communication with the first and second electrically conductive contacts, the photoactive material comprising a halide perovskite as described herein. The electrically conductive contacts can be configured to pass a current through the photoactive material and/or to apply an electric field across the photoactive material. The optoelectronic devices include devices, such as photovoltaic cells and radiation detectors, that convert incident radiation (photons) into an electrical current or signal. The radiation detectors can further include a detector configured to detect a photocurrent generated in the photoactive material as the result of the absorption of the incident radiation. The optoelectronic devices also include devices that convert electrical energy into light energy, as in the case of a light-emitting diode. In a transistor, the first and second electrically conductive contacts can provide a source electrode and a drain electrode, respectively.

One embodiment of a photovoltaic cell comprises: (a) a first electrode comprising an electrically conductive material; (b) a second electrode comprising an electrically conductive material; (c) a photoactive material disposed between (including partially between), and in electrical communication with, the first and second electrodes, the photoactive material comprising a halide perovskite as described herein; and (d) a hole transporting material disposed between the first and second electrodes and configured to facilitate the transport of holes generated in the photoactive material to one of the first and second electrodes.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 5A depicts examples of diamine and histamine cations. FIG. 5B shows examples of aromatic diamine and aromatic azole cations.

FIG. 7A depicts a top view SEM image of an {en}$FASnI_3$ perovskite film prepared by the $FASnI_3$ precursors with 7.5% en loading grown on mesoporous $TiO_2$. FIG. 7B shows a top view SEM image of an {en}$FASnI_3$ perovskite film prepared by the $FASnI_3$ precursors with 10% en loading grown on mesoporous $TiO_2$. FIG. 7C depicts a top view SEM image of an {en}$FASnI_3$ perovskite film prepared by the $FASnI_3$ precursors with 12.5% en loading grown on mesoporous $TiO_2$. FIG. 7D depicts a top view SEM image of the {en}$FASnI_3$ perovskite film prepared by the $FASnI_3$ precursors with 15% en loading grown on mesoporous $TiO_2$.

FIG. 9A depicts the J-V curve of an {en}$FASnI_3$ solar cell with an active area of 0.39 $cm^2$ using perovskite absorbers with 10% en loading measured under a reverse voltage scan. FIG. 9B depicts the J-V curve of an {en}$FASnI_3$ solar cell with an active area of 1.1 $cm^2$ using perovskite absorbers with 10% en loading measured under reverse voltage scan.

FIG. 17A shows x values higher than 0.10 of en into $MAPbI_3$ at room temperature (RT) led to a β (left) to α (right) phase transformation. FIG. 17B shows x values of 0.39 of en into $FAPbI_3$ at RT, leading to an α (left) to β (right) phase transformation.

DETAILED DESCRIPTION

Figures 1A, 1B, 1C:
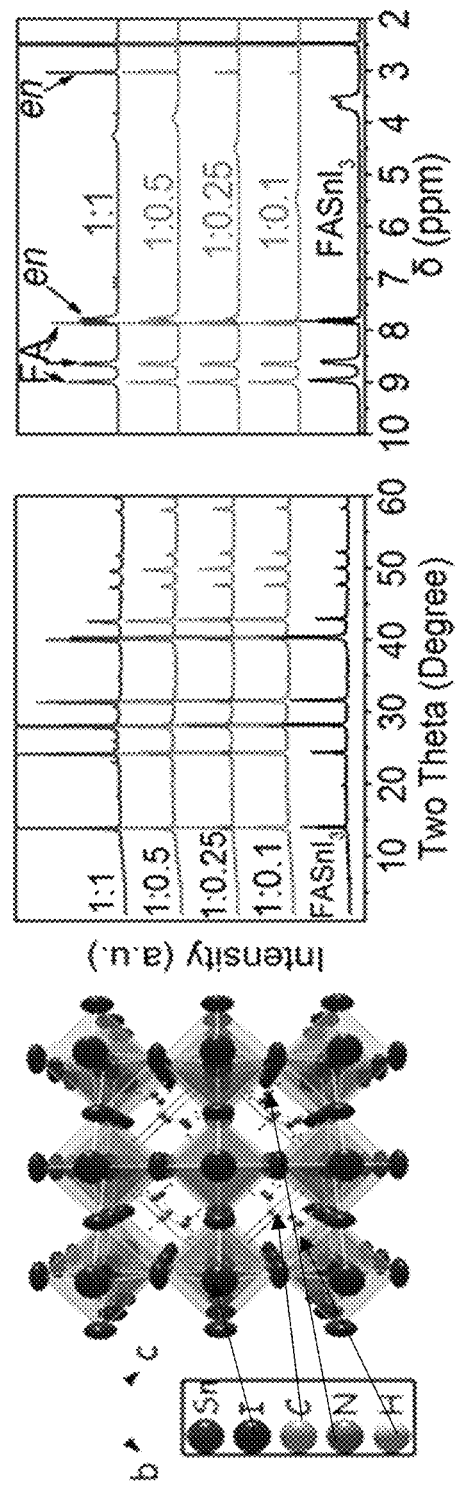
FIG. 1A shows the unit cell and crystal structure of an {en}$FASnI_3$ perovskite absorber.
FIG. 1B shows pXRD patterns for various {en}$FASnI_3$ perovskites.
FIG. 1C shows $^1H$ Nuclear Magnetic Resonance (NMR) spectra for {en}$FASnI_3$ perovskite crystals with various molar ratios of FA and en.

Photoactive materials comprising crystals of organic-inorganic hybrid halide perovskite compounds are provided. Electronic devices incorporating the photoactive materials into their light-absorbing, light-emitting layers; and semiconducting and/or electrically conducting materials are also provided. The devices include photovoltaic cells; radiation detectors; light-emitting devices, such as light-emitting diodes; and transistors, including phototransistors.

The crystals can be formed as a collection of discrete single-crystals—as opposed to a polycrystalline film composed of randomly oriented crystalline grains in a continuous film. For example, the perovskite crystals of the present disclosure can be synthesized unconnected crystals in a loose powder. Moreover, the crystals of the halide perovskites can be formed as pure crystals—that is crystals made from only a single halide perovskite, rather than a mixture of different forms of halide perovskites. The single crystals can then be formed into a film of crystals that has a higher purity than a halide perovskite film fabricated from components other than single crystals of the targeted material.

The halide perovskites have an amAMX$_3$ perovskite crystal structure, wherein am is an alkyl diamine cation, an aromatic diamine cation, an aromatic azole cation, a cyclic alkyl diamine cation, or a hydrazinediium cation; A is an alkali metal cation, such as a K, Rb, or Cs cation, or a monovalent organic cation, such as an alkylammonium cation; X is a halide ion or a combination of halide ions, and M is an octahedrally coordinated bivalent metal atom. Examples of monovalent alkylammonium cations include methylammonium (CH$_3$NH$_3^+$; MA), formamidinium (HC(NH$_2$)$_2^+$; FA), methylformamidinium (H$_3$CC(NH$_2$)$_2^+$), and guanidinium (C(NH$_2$)$_3^+$). X may be, for example, an iodide, a bromide, or a mixed iodide/bromide halide. Embodiments of the halide perovskites include tin halide perovskites and lead halide perovskites, such as amMASnI$_3$, amFASnI$_3$, amMAPbI$_3$, and amFAPbI$_3$.

It should be understood that, the term perovskite crystal structure refers to ideal cubic perovskite crystals structures and also to distorted and non-stoichiometric structural variants of the cubic perovskites crystal structure, including orthorhombic structures, tetragonal structures, and defect perovskite structures.

The alkyl group of the alkyl diamines can be a linear chain or a branched chain and can be substituted or unsubstituted. The length of the hydrocarbon chain in the alkyl group can be in the range from one to five carbon atoms and, thus, can be a methyl, ethyl, propyl, butyl, or pentyl group. However, the alkyl group can have more than five carbon atoms.

The aryl group of the aromatic diamines and azoles can be substituted or unsubstituted and can be, for example, monocyclic or bicyclic; the aromatic rings typically containing from six to 14 carbon atoms and, more typically, from six to ten carbon atoms.

The cyclic group of the cyclic alkyl diamines can be substituted or unsubstituted and can be, for example, monocyclic or bicyclic; the cyclic rings typically containing from six to 14 carbon atoms and, more typically, from six to ten carbon atoms.

Examples of amine cations (am) are shown in FIGS. 5A and 5B. In the cation structures, n represents the number of repeat units in an alkyl chain. As indicated in the figure, n can be 0, 1, 2, 3, and 4. However, n can also have a higher value. In some embodiments of the halide perovskites, n is not equal to zero; and in some embodiments, n is at least 2.

Am cations such as ethylenediamine are capable of increasing the bandgap of the compounds without the need to form solid solutions. In addition, increasing the organic content of the halide perovskites through the incorporation of am cations can increase their air stability and/or improve their photoelectric properties.

In some such embodiments, am is en. Various perovskites of such embodiments have the chemical formula (A)$_{1-x/2}$(en)$_{x/2}$(M)$_{1-x/2}$(X)$_{3-x/2}$, where x is in the range from 0.01 to 0.90 and, in some embodiments, in the range from 0.01 to 0.45. As discussed in detail in Example 3, these embodiments of the perovskites can be referred to as hollow perovskites because the incorporation of en into the three-dimensional (3D) perovskite structure results in M and X vacancies and discontinuities in the 3D [MX$_3$] framework. The bandgaps and optical properties of these perovskites can be tailored in a controlled and systematic manner through the loading of the en cation in the material, where a higher loading lead to a blue shift in the bandgap.

Because the perovskites in the crystals retain their 3D perovskite structure they are suitable for incorporation into electronic devices. For example, halide perovskites that are direct bandgap semiconductors can be used in photovoltaic cells as photoactive materials that absorb light, such as sunlight, and generate electron-hole pairs. Photovoltaic cells incorporating the halide perovskite single crystals as a photoactive material can take on a variety of forms. Generally, however, the cells will comprise a first electrode comprising an electrically conductive material; a second electrode comprising an electrically conductive material; a light absorbing layer comprising the halide perovskite compounds disposed between (including partially between) and in electrical communication with the first and second electrodes; a hole transporting material, which may be an organic or inorganic hole transport material, disposed between (including partially between) the first and second electrodes and configured to facilitate the transport of holes (that is, to provide preferential transport of holes relative to electrons) generated in the light absorbing layer to one of the first or second electrodes; and an electron transporting layer, disposed between (including partially between) the first and second electrodes and configured to facilitate the transport of electrons (that is, to provide preferential transport of electrons relative to holes) generated in the light absorbing layer to one of the first or second electrodes. In some cells, the light absorbing layer takes the form of a porous film (e.g., a film comprising a collection of semiconducting nanoparticles, such as titanium dioxide nanoparticles) coated with the halide perovskites, wherein the coating infiltrates into the pores of the porous film. Other layers commonly used in thin film photovoltaic cells, such as hole blocking layers and the like, may also be incorporated into the photovoltaic cells. In some embodiments of the photovoltaic cells, a hole transporting layer is disposed between the first electrode and the light absorbing layer and an electron transporting layer is disposed between the second electrode and the light absorbing layer.

Triarylamine derivatives, such as spiro-MeOTAD (2,2',7,7'-tetrakis(N,N-di-p-methoxyphenylamine)-9,9-spirobifluorene), and poly(triaryl amine) (PTAA) doped with 4-isopropyl-4'-methyldiphenyliodonium tetrakis(pentafluorophenyl)borate (TPFB) are examples of suitable organic hole transport materials for use in the present photovoltaic cells.

Various materials may be used as an electron transporting layer, provided the material is capable of transporting electrons generated by the halide perovskites. Metal oxides, metal sulfides, and organic semiconductors are suitable materials. Illustrative metal oxides include $TiO_2$, ZnO, $SnO_2$, $Nb_2O_5$ and $SrTiO_3$. Illustrative metal sulfides include ZnS and CdS. The metal oxides and sulfides may be doped. Illustrative organic semiconductors are n-type polymers, small molecules, and derivatives of small molecules. C60, C70, [6,6]-phenyl-C61-butyric acid methyl ester (PCBM), indene-C60 bisadduct (ICBA), indene C60 tris adduct (ICTA), bis-PCBM, and combinations thereof are some examples of organic electron transport materials.

At least one of the two electrodes is desirably transparent to the incident radiation (e.g., solar radiation). The transparent nature of the electrode can be accomplished by constructing the electrode from a transparent material or by using an electrode that does not completely cover the incident surface of the cell (e.g., a patterned electrode). One example of a transparent electrode comprises a transparent conducting oxide (e.g., fluorine-doped tin oxide (FTO)) coating on a transparent substrate.

The halide perovskite compounds are characterized by broad absorption spectra that can be tuned by adjusting the ratio of A to am in the halide perovskites. By way of illustration, some embodiments of films of the halide perovskites can absorb and/or emit radiation in the ultraviolet, visible, and/or infrared regions of the electromagnetic spectrum. For example, some embodiments of the films absorb radiation in the wavelength range from 300 nm to 1000 nm and/or emit photoluminescence with a photoluminescence peak in the wavelength range from 300 nm to 1000 nm upon excitation with incident radiation. These absorption and/or emission characteristics can be achieved using halide perovskites having an A to am molar ratio in the range from 1:0.05 to 1:1, including molar ratios in the range from 1:0.05 to 1:0.25, for example.

Photovoltaic cells comprising light-absorbing layers formed from the halide perovskite compounds can have high power conversion efficiencies. For example, photovoltaic cells having power conversion efficiencies of at least 4%, at least 5%, and at least 7% (for example, power conversion efficiencies in the range from 4% to 8%), as measured under AM 1.5 G standard conditions, are provided. These power conversion efficiencies can be obtained even using very thin light-absorbing layers having thicknesses of 500 nm or less. Methods for determining the power conversion efficiency of a photovoltaic cell are provided in the Example.

Photoluminescent light-emitting devices that incorporate the halide perovskites comprise an incident radiation source configured to generate incident radiation; and a light-emitting layer including a halide perovskite, configured such that it is irradiated by incident radiation from the incident radiation source when the source is on. In the photoluminescent light-emitting devices, the incident radiation and the halide perovskites are characterized in that the halide perovskite absorbs the incident radiation, which induces the emission photoluminescence. Optional components of the photoluminescent light-emitting devices include one or more filters configured to block emitted photoluminescence radiation having an undesired wavelength, while selectively transmitting emitted photoluminescence at other wavelengths. The source may also optionally include a photoluminescence detector configured such that photoluminescence from the light-emitting layer impinges on the detector when the source is in operation.

Throughout this disclosure, the designations $amMASnI_3$, $amFASnI_3$, $amMAPbI_3$, and $amFAPbI_3$ are synonymous with the designations $am/MASnI_3$, $am/FASnI_3$, $am/MAPbI_3$, and $am/FAPbI_3$ and with the designations $\{am\}MASnI_3$, $\{am\}FASnI_3$, $\{am\}MAPbI_3$, and $\{am\}FAPbI_3$.

EXAMPLE 1

This Example illustrates that ethylenediamine (en) can serve as an am cation in the 3D $FASnI_3$ perovskite structure to form crystals of a novel, hybrid 3D perovskite $\{en\}FASnI_3$. (A more detailed structural analysis of this perovskite is provided in Example 3.)

Conventional wisdom in the art is that the $ASnI_3$ perovskite structure is stable only with $A=MA^+$, $FA^+$ and $Cs^+$, and the only way to significantly increase the band gap is to use solid solutions such as $ASnI_{3-x}Br_x$. (See, e.g., Hao, F., et al., Lead-free solid-state organic-inorganic halide perovskite solar cells. Nat. Photon. 8, 489-494 (2014).) Changes in the A cation result only in small changes in the band gap. This example demonstrates that en can serve as a new cation capable of achieving band gap increases that compare in magnitude to those of $ASnI_{3-x}Br_x$ solid solutions. With support from first-principles theoretical calculations, these experimental studies indicated that a new band gap tuning mechanism was in effect that was strongly linked to en's ability to create massive Schottky defects in the 3D structure. Inclusion of en also lead to improved thin-film coverage and to inhibition of the $Sn^{2+}/Sn^{4+}$ oxidation process. The hybrid material displayed dramatically increased photovoltaic performance and drastically improved environmental stability compared to the neat $FASnI_3$ perovskite.

The new $\{en\}FASnI_3$ materials were obtained when en was used as an additive to fabricate $FASnI_3$-based perovskite solar cells. The obtained films showed very unusual characteristics, such as the retention of the 3D crystal structure of $FASnI_3$ with increasing amounts of en, showing only a small lattice expansion. In a series of parallel experiments, bulk samples of several $\{en\}FASnI_3$ compositions were synthesized in concentrated hydroiodic acid (HI). The synthesis protocol involved adding a stoichiometric mixture of FAI and en in a solution of $SnI_2$ to an aqueous $HI/H_3PO_2$ solvent mixture and varying the en ratio incrementally. Crystals with different amounts of en consistently showed a 3D-like morphology (FIGS. 6A through 6E).

Figures 1D, 1E, 1F:
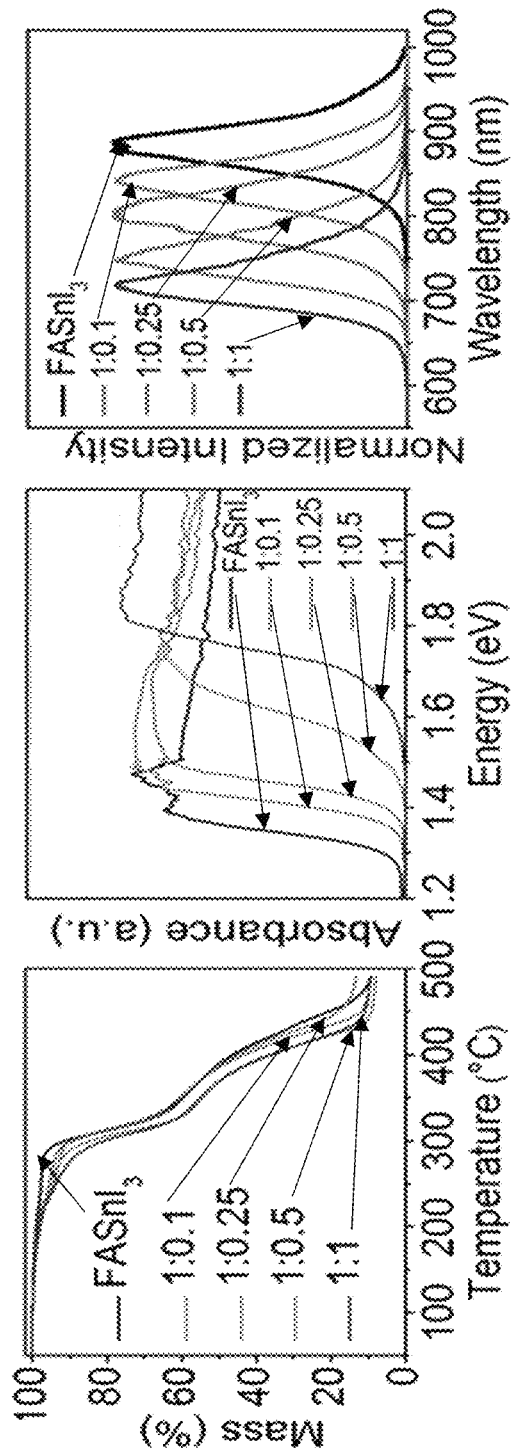
FIG. 1D shows thermogravimetric analysis (TGA) spectra for {en}$FASnI_3$ perovskite crystals with various molar ratios of FA and en.
FIG. 1E shows optical absorbance spectra for {en}$FASnI_3$ perovskite crystals with various molar ratios of FA and en.
FIG. 1F shows the photoluminescence (PL) spectra for {en}$FASnI_3$ perovskite crystals with various molar ratios of FA and en.

The crystal structure of $\{en\}FASnI_3$ was determined by single-crystal X-ray diffraction (XRD) (FIG. 1A). Similar to $FASnI_3$, $\{en\}FASnI_3$ adopted a pseudocubic, orthorhombic unit cell having the Amm2 polar space group. The observable change caused by en was a small but constant increase in the normalized unit cell volume from 251.9 Å$^3$ in pristine $FASnI_3$ to 261.1 Å$^3$ in the 1:1 en/$FASnI_3$ nominal composition, also seen as a peak shift in the powder XRD (pXRD) patterns of the bulk materials (FIG. 1B). Given that en is too large to fit in the perovskite cage, it was remarkable to see that it nevertheless incorporated into the 3D structure. Since the observed unit cell expansion was too small to account for the larger size of en compared to FA (the N—N distance was 3.75 Å in the trans configuration of $H_3NCH_2CH_2NH_3^{2+}$ in the $enI_2$ salt), this suggests that certain neutral fragments of suitable size must be removed from the structure instead. These are defined as Schottky defects; or if charged $\{SnI\}^+$ species are removed in place of en (2+), as point defects. Single-crystal refinements showed that the occupancy of the Sn-site was progressively reduced with increasing amounts of en. The presence of en in the structure was confirmed by proton nuclear magnetic resonance ($^1$H-NMR) (FIG. 1C). Crystals and films of {en}FASnI$_3$ materials could be dissolved in DMSO-d$_6$, and the en signals could be accurately quantified against the FA signals. The en/FA ratios determined by the NMR measurements are shown in Table 2. The presence of en in FASnI$_3$ is also supported by thermogravimetric data (TGA) (FIG. 1D) showing an increasing mass loss with increasing en incorporation at the ~300° C. step, which corresponds to a loss of FAI and enI$_2$ from the thermal decomposition of the perovskite. The loss of en at a high temperature indicates that, within the perovskite lattice, en existed in its (+2) form rather than its neutral en (0) form, which has a boiling point of ~116° C.

The optical properties of the {en}FASnI$_3$ materials were intriguing. Both of the emission spectra, extracted from diffuse reflectance measurements of the bulk materials (FIG. 1E) and the photoluminescence (PL) emission spectra obtained from crystals (FIG. 1F), showed a large blue shift of the absorption edges/emission maxima with increased en loading. The blue shift trend suggested an opening of the band gap $E_g$, from ~1.3 eV in the black FASnI$_3$ perovskite, all the way to $E_g$~1.9 eV for the 5:1 en/FASnI$_3$ molar ratio, resulting in an obvious color change from black to red. The observed blue shift in the band gap of a 3D [SnI$_3$]$^-$ perovskite was striking and could not be explained by a simple A cation replacement, where en and FA occupy the cage space in the structure. Such a dramatic blue shift has been observed only in solid solutions ASnI$_{3-x}$Br$_x$. (See, e.g., Hao, F., et. al., Lead-free solid-state organic-inorganic halide perovskite solar cells. *Nat. Photon.* 8, 489-494 (2014).) Therefore, to increase the gap to such a large extent, while keeping the 3D motif and a full iodide structure, the band widths of the valence and conduction bands had to be narrowed.

Figure 1I:
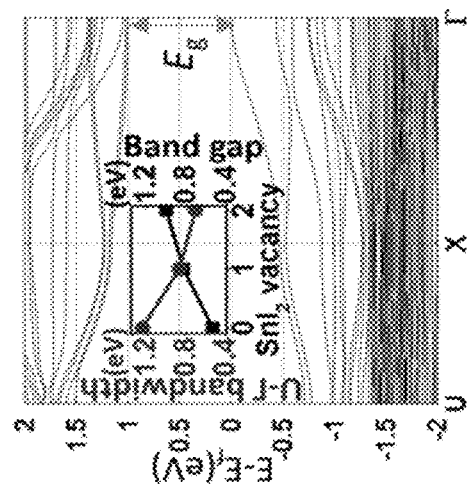
FIG. 1I inset) depicts a plot of the increase in the band gap and decrease of the band width as a function of $SnI_2$ vacancies in $FASnI_3$.
Figure 1H:
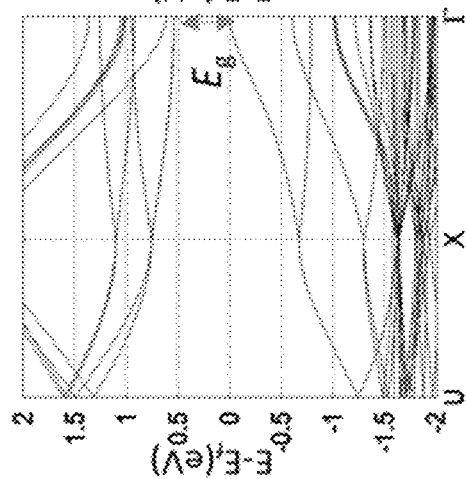
FIG. 1G shows a 2×2×2 supercell of $FASnI_3$, depicting a model of the hollow perovskite with $SnI_2$ vacancies ($FA_8Sn_5I_{18}$). The calculated band structure of the supercell for the full ($FA_8Sn_7I_{22}$) and hollow ($FA_8Sn_5I_{18}$) perovskites is shown in panels in FIGS. 1H and 1I, respectively.
Figure 1G:
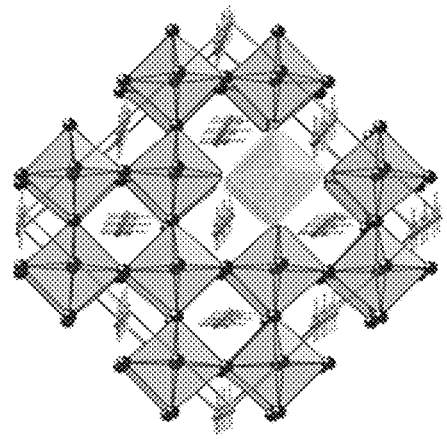

In order to account for the dramatic changes of the optical properties, the "hollow perovskite" concept based on the presence of massive Schottky defects was invoked (FIG. 1G). (See, e.g., Stoumpos, C. C., et. al., Halide perovskites: poor man's high-performance semiconductors. *Adv. Mater.* 28, 5778-5793 (2016).) If entire neutral fragments of SnI$_2$ are missing from the 3D structure, a hollow structure will emerge. This locally fragmented perovskite will feature several broken Sn—I bonds in a non-periodic fashion, so the average structure is a pseudocubic lattice. The elimination of neutral fragments leads to a "hollow" 3D [SnI$_3$]$^{1-}$ network with the degree of "hollowness" increasing with an increasing en/FA ratio. The orbital overlap among the remaining Sn/I atoms is reduced and, as a consequence, the band widths of the valence and conduction bands in such as hollow structure narrow, thereby producing the experimentally observed increase in the band gap. This exact picture is captured by Density Functional Theory (DFT) calculations for a 2×2×2 supercell where SnI$_2$ units have been removed (FIGS. 1G through 1I; see Methods for details). DFT calculations directly pointed to the reduction of the band widths upon structural relaxation, with the valence band (VB) showing a much larger decrease compared to the conduction band (CB). The calculated band gaps increased proportionally with the number of missing SnI$_2$ units, in agreement with the experimentally observed trend in the band gaps of {en}FASnI$_3$ (FIGS. 1H and 1I). The decrease of the energy levels of the VB maxima upon extrusion of SnI$_2$ units had further implications for the stability of the perovskite, since the absolute work function was shifted to lower energy and, as a result, the tendency of the materials towards oxidation was diminished. The model of the hollow perovskite was fully supported by the lower observed mass densities of the {en}FASnI$_3$ materials as determined by gas pycnometry. The mass density decreased with increasing en/FA ratios and, for any given composition, the experimentally measured density was consistently smaller than the theoretically predicted density, assuming full atom occupancy in the crystal structure (Table 1). Based on the above, it can be concluded that {en}FASnI$_3$ is an entirely new type of 3D perovskite that is very different from the classical ASnI$_{3-x}$Br$_x$ and APbI$_{3-x}$Br$_x$ systems.

TABLE 1

Comparison of experimental and theoretical crystal densities of all reported materials, along with standard deviation.

| Material/Density (g cm$^{-3}$) | Experiment | Single-Crystal (Full occupancy) | Single-Crystal (Sn refined) |
|---|---|---|---|
| FASnI$_3$ | 3.594(1) | 3.604(3) | 3.596(3) |
| 1:0.1 | 3.479(1) | 3.587(3) | 3.565(3) |
| 1:0.25 | 3.459(1) | 3.547(3) | 3.497(3) |
| 1:0.5 | 3.403(1) | 3.536(3) | 3.467(3) |
| 1:1 | 3.285(1) | 3.507(3) | 3.386(3) |

Figure 2B:
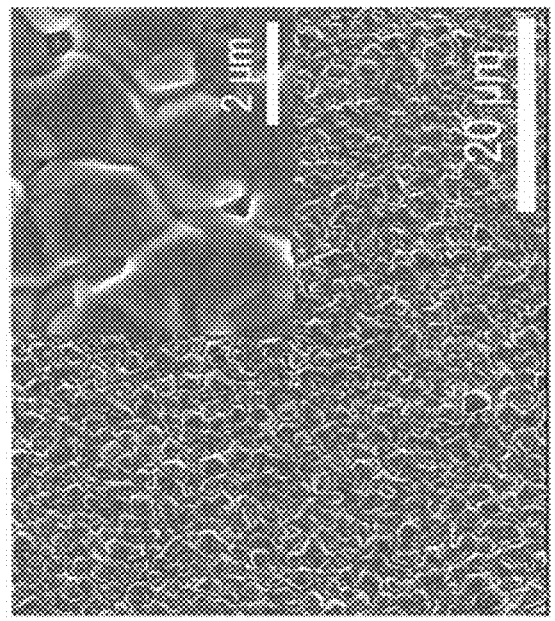
FIG. 2B shows a top view SEM image of the perovskite films with 10% en loading deposited on the mesoporous $TiO_2$ at low magnification. The insets show top view SEM images of the same films at high magnifications.
Figure 2A:
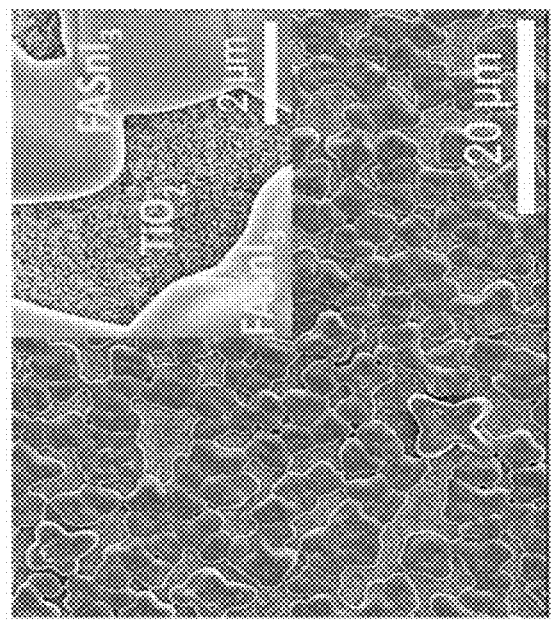
FIG. 2A shows a top view Scanning Electron Microscope (SEM) image of the perovskite films without en loading deposited on the mesoporous $TiO_2$ at low magnification.

Having established the fundamental properties of the new perovskites, the casting of thin films began. One of the major problems associated with the successful fabrication of Sn-films comes from the difficulty of preparing high-quality, high coverage thin films. Many different approaches for film deposition have been reported to improve the film quality, including thermal evaporation, vapor-assisted deposition, and solvent engineering methods. These methods, which normally involve complex processes that limit large-scale fabrication, were not necessary here since {en}FASnI$_3$ forms highly uniform films using a simple one-step method. FIGS. 2A and 2B show scanning electron microscopy (SEM) images comparing perovskite films prepared with FASnI$_3$ (FIG. 2A) and with {en}FASnI$_3$ (FIG. 2B) using the one-step method. As shown in FIG. 2A, the film coverage was poor for the FASnI$_3$ film, due to its fast crystallization. In stark contrast, the {en}FASnI$_3$ film was much smoother, with fewer pinholes, after adding 10% en in the precursor solution (FIG. 2B). The effect was consistent for several {en}FASnI$_3$ perovskite films with variable en loadings (FIGS. 7A through 7D).

Figures 2C, 2D:
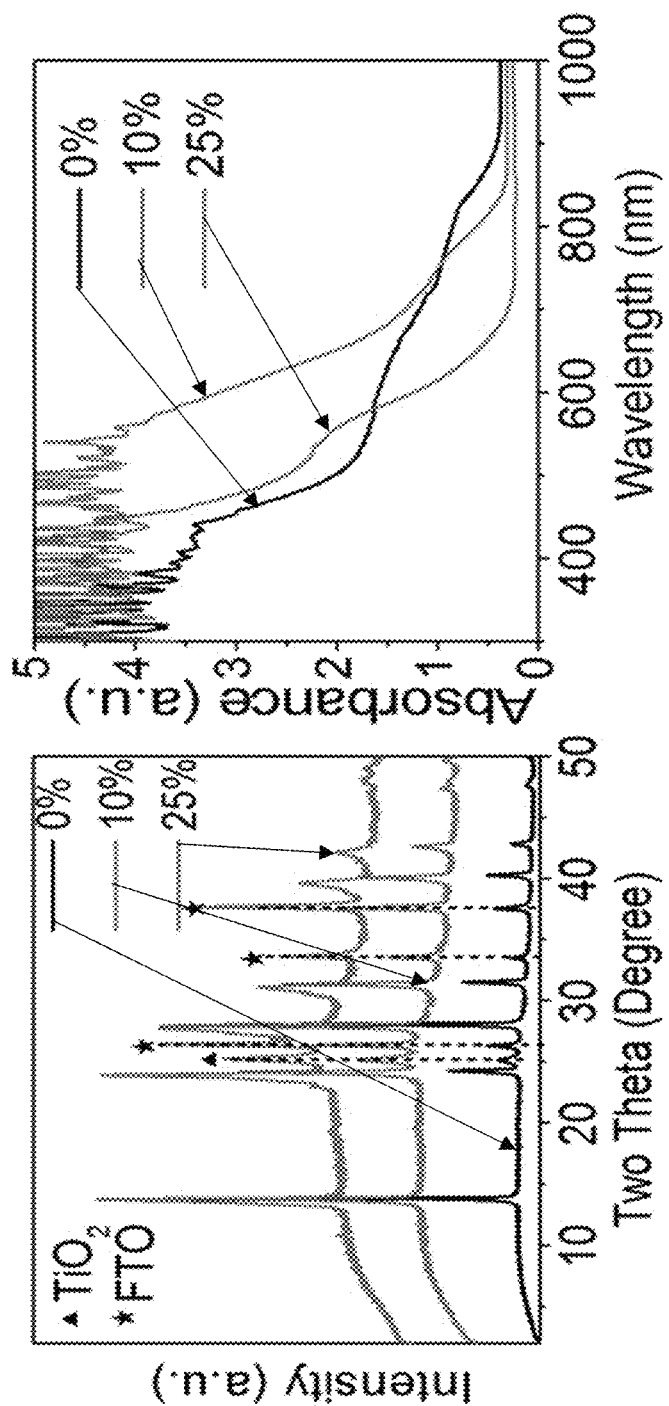
FIG. 2C shows X-Ray Diffraction (XRD) patterns of the perovskite films with various amounts of en loading deposited on mesoporous $TiO_2$.
FIG. 2D shows UV-vis absorption of the perovskite films with various amounts of en loading deposited on mesoporous $TiO_2$.

The actual composition of {en}FASnI$_3$ agreed very well with the stoichiometric addition of en to the precursor solution. The overall agreement was established by comparing the optical absorption, the NMR spectra of the films, and the lattice parameters of the unit cells, extracted from the XRD of the films. To quantify the amount of en in the perovskite films, the $^1$H-NMR spectra of the perovskite films prepared by the precursor with 0%, 10%, and 100% en were also measured. It could be estimated that the molar ratio of en and FA in the final film was very close to that in the precursor. FIG. 2C shows the XRD patterns of the perovskite films coated on mesoporous TiO$_2$ without and with en. The films with en exhibited a shift of the Bragg reflections to smaller 2θ angles, compared with the neat FASnI$_3$ film, suggesting an increase in the unit cell volume. The parameters on the {en}FASnI$_3$film were in good agreement with the XRD results of the bulk materials. Similar to the bulk materials, the absorption spectra of the {en}FASnI$_3$ films showed the same marked difference in bandgap. FIG. 2D shows the optical absorption spectra of the {en}FASnI$_3$ perovskite films with 0%, 10%, and 25% en loading. The absorption wavelength systematically decreased with increased en/FA ratio, and the absorption edge became sharper, indicating that the optical absorption coefficient increased. The estimated band gap of the perovskite absorbers with 0%, 10%, and 25% en were 1.4 eV, 1.5 eV, and 1.9 eV, respectively.

Figures 2E, 2F:
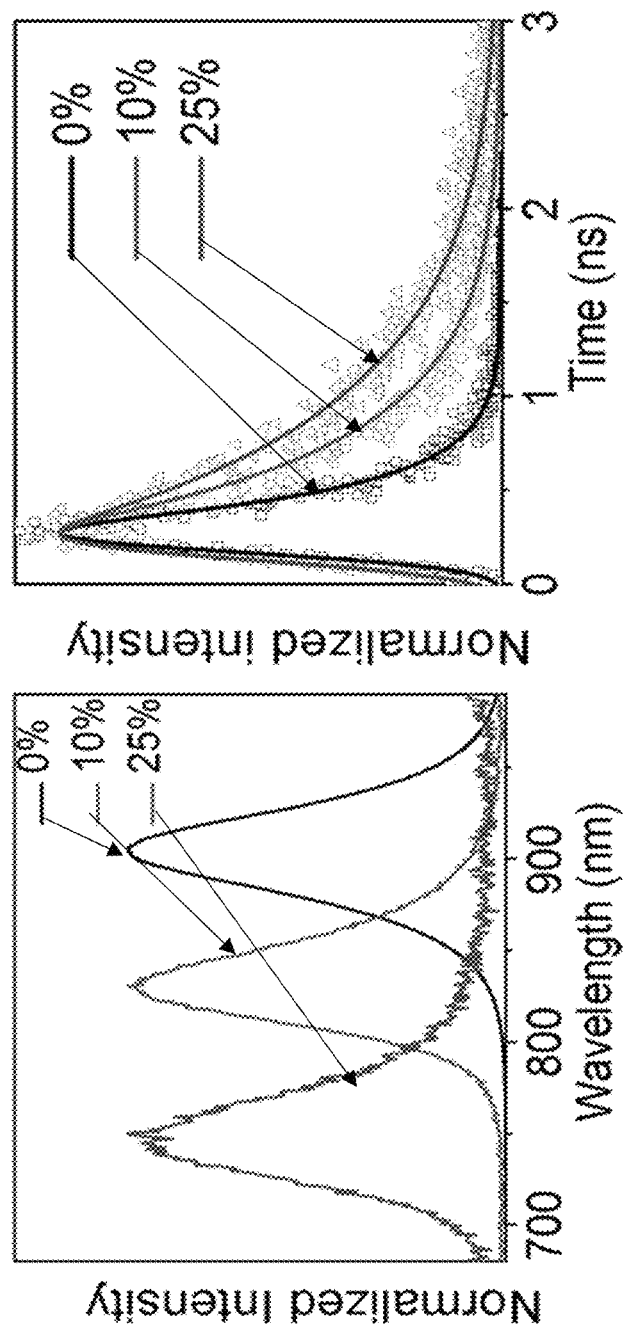
FIG. 2E shows PL spectra of the perovskite films with various amounts of en loading deposited on mesoporous $TiO_2$.
FIG. 2F shows Time-Resolved Photoluminescence (TRPL) kinetics of the perovskite films with various amounts of en loading deposited on mesoporous $TiO_2$.

FIG. 2E shows the PL spectra of the perovskite films of {en}FASnI$_3$ with various amounts of en deposited on mesoporous TiO$_2$. The neat FASnI$_3$ perovskite film displayed the typical emission peak at about 905 nm. The {en}FASnI$_3$ perovskite films with 10% and 25% en/FA ratio displayed emission peaks at about 830 nm and 746 nm, respectively. The blue-shifted emission spectra were consistent with the results obtained from the UV-vis absorption of the films. FIG. 2F shows the time-resolved PL (TRPL) kinetics of the {en}FASnI$_3$ perovskite films. The neat FASnI$_3$ perovskite film had an estimated carrier lifetime of 0.19 ns. In contrast, the carrier lifetimes of the perovskite films with 10% and 25% en loading were 0.46 ns and 0.68 ns, respectively. The longer carrier lifetime indicated a lower recombination rate, due to the better film quality and lower carrier density.

Figure 3A:
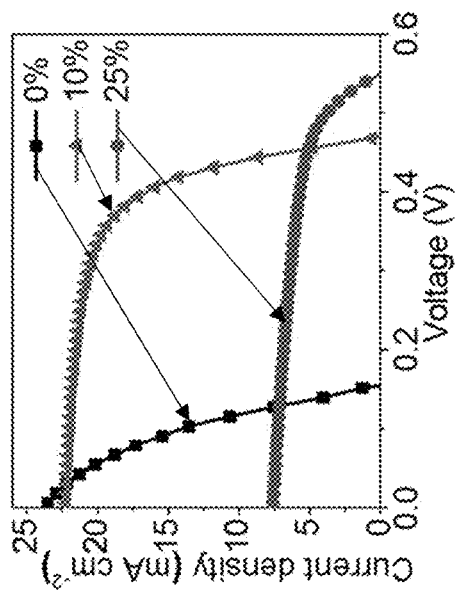
FIG. 3A is a cross-sectional SEM image of a completed device.
Figure 3B:
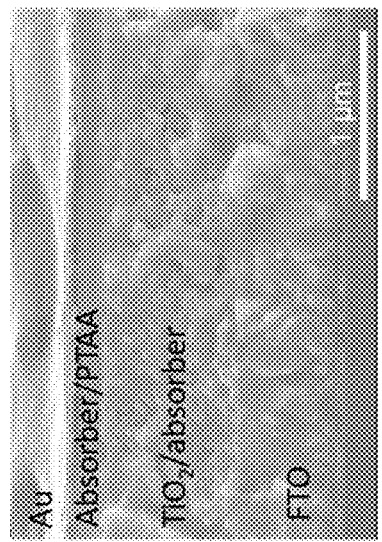
FIG. 3B shows J-V curves of solar cells using a perovskite absorber with various amounts of en added.

FIG. 3A shows a cross-sectional SEM image of a completed solar cell employing a perovskite absorber with 10% en loading. Two layers were observed between the Au electrode and the FTO with blocking TiO$_2$: a 150 nm thick capping layer of {en}FASnI$_3$ with a thin poly[bis(4-phenyl) (2,4,6-trimethylphenyl)amine] (PTAA) hole transporting layer; and a 1 µm thick mesoporous TiO$_2$ layer infiltrated with a perovskite absorber. The effect of en on the solar cell performance was then investigated. FIG. 3B shows the photocurrent density-voltage (J-V) curves of three representative solar cells using the perovskite absorbers with 0%, 10%, and 25% en loading. The neat FASnI$_3$ perovskite solar cell achieved a relatively low power conversion efficiency (PCE) of 1.40% with a $V_{oc}$ of 0.15V, a $J_{sc}$ of 23.76 mA cm$^{-2}$, and a fill factor (FF) of 38.24% when measured under a reverse voltage scan (that is, from $V_{oc}$ to 0 V). This poor performance can be attributed to poor film coverage and serious recombination inside the perovskite absorber. However, the solar cell performance was significantly improved when {en}FASnI$_3$ was used as an absorber. The material with 10% en loading achieved a high PCE of 6.94% with a $V_{oc}$ of 0.47V, a $J_{sc}$ of 22.29 mA cm$^{-2}$, and an FF of 66.41% when measured under reverse voltage scan. There was a significant enhancement in $V_{oc}$ and FF, while the $J_{sc}$ of the devices using the perovskite without and with en were comparable. The solar cells using the perovskite absorber with 25% en loading yielded a PCE of 2.34%, with a high $V_{oc}$ of 0.55V, a $J_{sc}$ of 7.64 mA cm$^{-2}$, and an FF of 55.80% under the same measurement conditions. As the en loading increased, the solar cells achieved a higher $V_{oc}$, but the obtained $J_{sc}$ was lower, a trend which probably can be attributed to the much wider band gap (up to 1.9 eV) and worse carrier transport. Therefore, it was found that the amount of en loading in the {en}FASnI$_3$ is very critical to the device performance. The highest device performance was obtained from the sample with 10% en loading (Table 3).

Figure 3C:
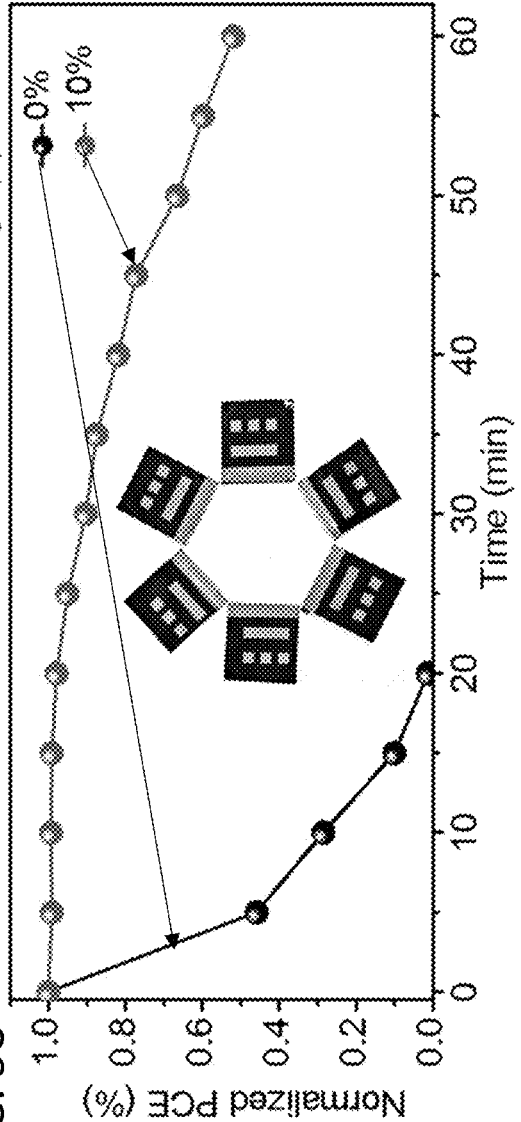
FIG. 3C depicts the aging test on the unencapsulated solar cells without and with 10% en under constant AM1.5G illumination in ambient air.

To evaluate the stability of the {en}FASnI$_3$ perovskite absorber in moisture and oxygen, the unencapsulated films (neat and with 10% en loading) were exposed to the ambient atmosphere. The absorption and XRD results showed that the {en}FASnI$_3$ perovskite film with 10% en loading had a much better environmental stability than the neat FASnI$_3$ film. The durability of the device performance as a function of the time under constant AM1.5G illumination in air at room temperature was also investigated (FIG. 3C). The plot shows that the unencapsulated solar cell using the classical FASnI$_3$ absorber degraded rapidly and after 20 min, and the efficiency decreased from 1.28% to 0% (short-circuit). However, the unencapsulated {en}FASnI$_3$ device with 10% en under the same conditions retained 50% of its initial efficiency of 6.23%.

Figure 4B:
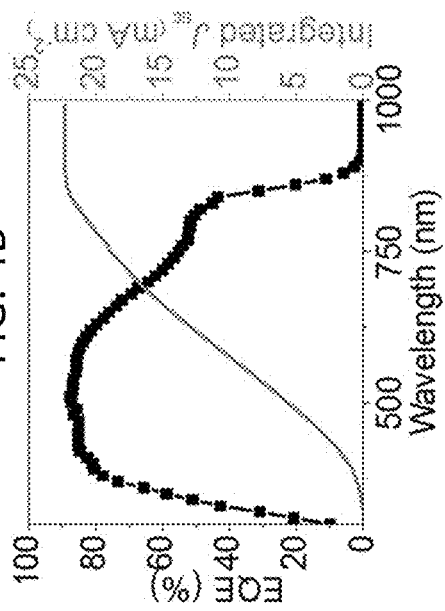
FIG. 4B shows EQE and integrated $J_{sc}$ measured from a solar cell with 10% en.
Figure 4D:
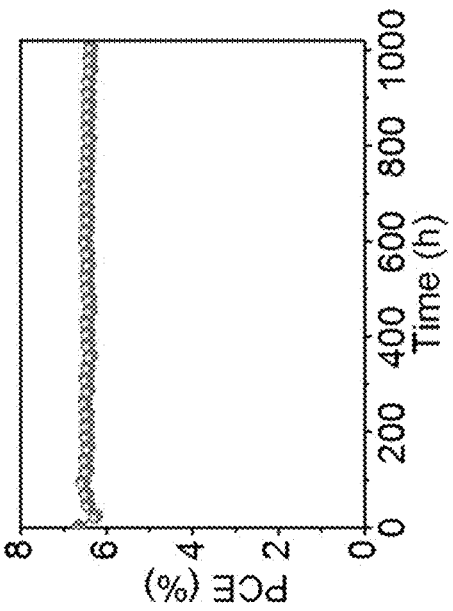
FIG. 4D depicts the efficiency of an encapsulated device with 10% en as a function of the storage time.
Figure 4A:
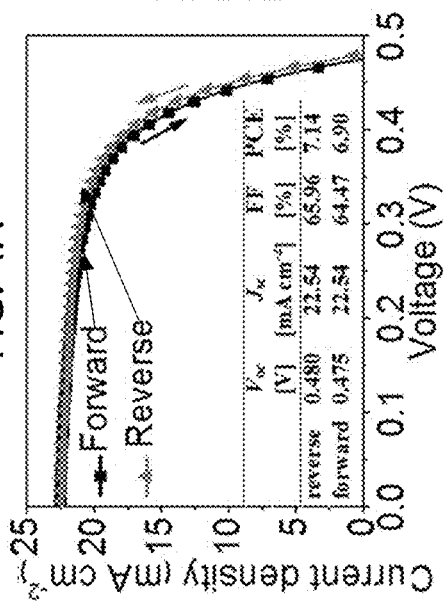
FIG. 4A shows J-V curves of the best-performing solar cell in Example 1 using an {en}$FASnI_3$ perovskite absorber with 10% en loading measured under reverse and forward voltage scans.
Figure 4C:
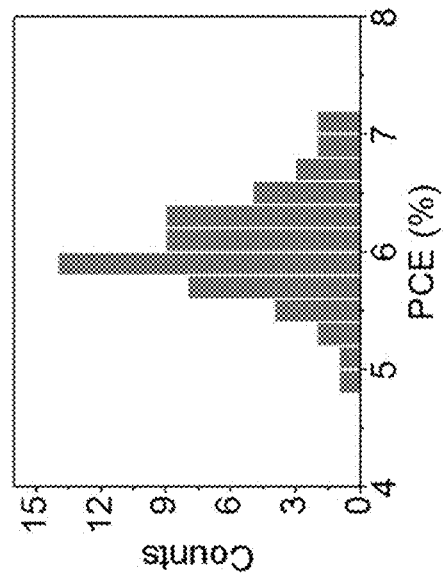
FIG. 4C shows histograms of PCEs for 60 solar cells with 10% en.
Figure 6B:
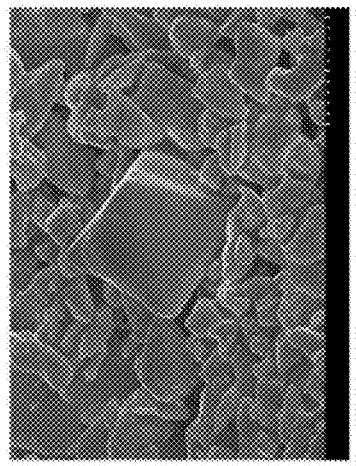
FIGS. 6A-6E depict top view SEM images of an {en}$FASnI_3$ perovskite crystals prepared by the mixed cations of FA and en with different molar ratios of 1:0 (FIG. 6A); 1:0.1 (FIG. 6B); 1:0.25 (FIG. 6C); 1:0.5 (FIG. 6D), and 1:1 (FIG. 6E).
Figure 6D:
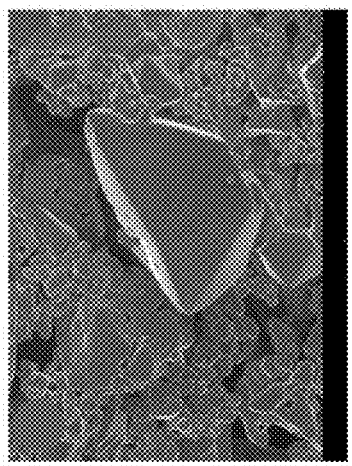
Figure 6A:
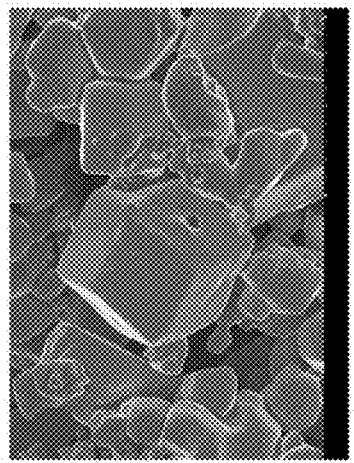
Figure 6C:
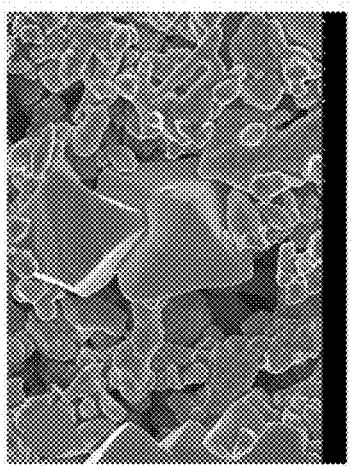
Figure 6E:
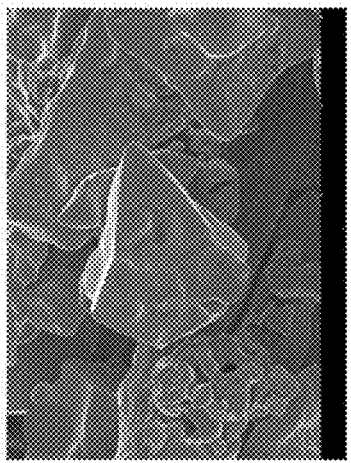
Figure 8:
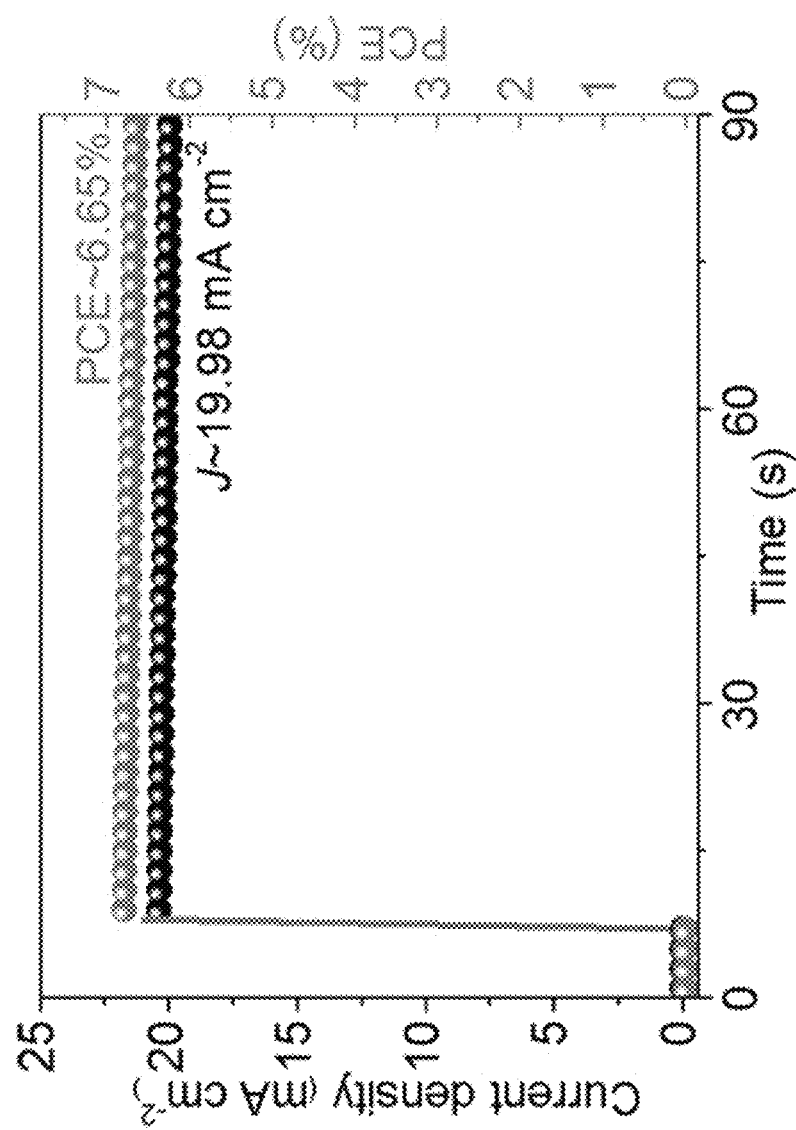
FIG. 8 depicts the steady-state efficiency of an {en}$FASnI_3$ solar cell with 10% en loading at a constant bias voltage of 0.333 V.

FIG. 4A shows the J-V curves of the best-performing solar cell using the perovskite absorber with 10% en, measured under reverse and forward voltage scans. This solar cell achieved a PCE of 7.14% with a $V_{oc}$ of 0.480 V; a $J_{sc}$ of 22.54 mA cm$^{-2}$; an FF of 65.96% when measured under reverse voltage scan; a PCE of 6.90% with a $V_{oc}$ of 0.475 V, a $J_{sc}$ of 22.54 mA cm$^{-2}$; and an FF of 64.47% when measured under forward voltage scan, showing a small hysteresis. FIG. 4B shows the measured external quantum efficiency (EQE) spectrum of the solar cell using the perovskite absorber with 10% en, displaying a high average value in the 300-850 nm wavelength range, which is consistent with the absorption spectrum of the {en}FASnI$_3$ perovskite with 10% en loading. The integrated $J_{sc}$ calculated from the EQE curve was about 22.29 mA cm$^{-2}$, which is very close to the $J_{sc}$ obtained from the J-V measurements. FIG. 4C shows the histograms of PCEs for 60 solar cells with 10% en. The average $V_{oc}$, $J_{sc}$, FF, and PCE were 0.43±0.02 V, 21.90±1.13 mA cm$^{-2}$, 63.83±2.16%, and 6.05±0.46%, respectively, showing high average performance and good reproducibility of the {en}FASnI$_3$ perovskite solar cells. To evaluate the stabilized power output of the {en}FASnI$_3$ device, the photocurrent of a typical device with 10% en at a maximum power voltage of voltage of 0.333 V was measured, showing a steady-state PCE of 6.65% with a steady-state current density of 19.98 mA cm$^{-2}$ (FIG. 8). Since the uniform {en}FASnI$_3$ film could be obtained by the simple one-step method, solar cells with a larger active area were also fabricated. FIGS. 9A and 9B show the solar cells using the {en}FASnI$_3$ absorbers (10% en) with active areas of 0.39 cm$^2$ and 1.1 cm$^2$ achieved PCEs of 6.09 and 4.30%, respectively. Finally, the long-term stability of the {en}FASnI$_3$ device was checked. FIG. 4D shows that the encapsulated device was very stable and, even after 1000 h, the device kept an efficiency of ~6.37%.

Methods

Preparation of Materials and Thin Films

The perovskite crystals were grown without and with en according to the method reported in the literature. (See, e.g., Stoumpos, C. C., et al., Semiconducting tin and lead iodide perovskites with organic cations: phase transitions, high mobilities, and near-infrared photoluminescent properties. Inorg. Chem. 52, 9019-9038 (2013).) 3 mmol of SnCl$_2$·2H$_2$O (Sigma, 98%) with various amounts of en (0-3 mmol) was dissolved in a mixture of 57% w/w aqueous HI solution (5.1 mL) and 50% aqueous H$_3$PO$_2$ (1.7 mL) by heating to boiling under constant magnetic stirring for about 5 min, which formed a bright yellow solution. Subsequently, 3 mmol of formamidine acetate salt (sigma, ≥98.0%) was added to the hot yellow solution, and the stirring continued for 10 min. After that, the solution was left to cool to room temperature, and the crystals were collected by suction filtration and dried in a vacuum oven at 125° C. for 12 h. For the red sample with a molar ratio of 1:5, the synthesis process was the same, except for the molar concentration (1 mmol of SnCl$_2$·2H$_2$O, 5 mmol of en, and 1 mmol of formamidine acetate salt).

The process of preparing compact and mesoporous TiO$_2$ layers on FTO has been reported elsewhere. (See, e.g., Cao, D. H., et al., 2D homologous perovskites as light-absorbing materials for solar cell applications. J. Am. Chem. Soc. 137, 7843-7850 (2015).) First, a compact TiO$_2$ layer was spin-coated onto an FTO substrate (Tec15, Hartford Glass) from an ethanol solution of titanium isopropoxide at 2000 rpm for 30 s, then annealed in air at 500° C. for 20 min. Subsequently, a mesoporous $TiO_2$ layer composed of 20 nm particles (Dyesol DSL 18NR-T) was spin-coated onto the compact layer using a diluted solution in anhydrous ethanol (1:3.5 weight ratio) at 500 rpm for 1 min, then annealed in air at 500° C. for 15 min. Finally, the annealed mesoporous $TiO_2$ film was dipped into a 0.02 M aqueous $TiCl_4$ solution at 70° C. for 30 min, and then annealed at 500° C. for 15 min. For the film fabrication, the $FASnI_3$ precursor solution, consisting of 372.5 mg of home-made $SnI_2$, 172 mg of FAI (Dyesol), and 24 mg of $SnF_2$ (Sigma, 99%), was dissolved in 723 μL of N,N-dimethylformamide and 81 μL of dimethyl sulfoxide. The $FASnI_3$ precursors with 7.5%, 10%, 12.5%, 15%, and 25% en (Sigma, 99.5%), respectively, included an extra 4.8 μL, 6.4 μL, 8 μL, 9.6 μL, and 16 μL of en, respectively. The precursors without or with added en were spin-coated onto the mesoporous layers with a spin rate of 1500 rpm for 60 s. The substrates were annealed at 70° C. for 5 min and then annealed at 120° C. for 10 min on a hot plate. The solution of hole transporting material, consisting of 32 mg of PTAA (Sigma Aldrich, 99%) and 3.6 mg of 4-isopropyl-4'-methyldiphenyliodonium tetrakis(pentafluorophenyl)borate (TPFB) (TCI America) in 1.6 mL of chlorobenzene, was spin-coated onto the perovskite films at 1500 rpm for 30 s and then annealed at 70° C. for 5 min. All these procedures were performed in a glove box with oxygen and moisture levels of 0 ppm. To complete the device, a 100 nm thick Au electrode was thermally evaporated on top of the hole transporting layer with a metal mask. The active area of the solar cells was 0.09 $cm^2$.

Materials, Film, and Device Characterization

The morphology of the crystals, films, and devices was characterized by a high-resolution field emission SEM (Hitachi SU8030). XRD spectra of the perovskite films and crystals without and with en were obtained on a Rigaku Miniflex600 pXRD (Cu Kα graphite, λ=1.5406 Å) operating at 40 kV/15 mA with a Kβ foil filter. Optical diffuse-reflectance measurements of the perovskite crystals and UV-vis absorption spectra of the films were performed at room temperature using a Shimadzu UV-3600 UV-vis NIR spectrometer operating in the 200-2000 nm region at room temperature. $BaSO_4$ was used as a non-absorbing reflectance reference. The generated reflectance-versus-wavelength data were used to estimate the band gap of the material by converting reflectance to absorbance data according to the Kubelka-Munk equation: $\alpha/S=(1-R)^2/2R$, where R is the reflectance and α and S are the absorption and scattering coefficients, respectively. PL spectra were collected on rhombic dodecahedral crystals of {en}$FASnI_3$ using a Horiba LabRam Evolution high-resolution confocal Raman microscope spectrometer (600 g/mm diffraction grating) equipped with a diode CW laser (473 nm, 25 mW) and a Synapse CCD camera. The incident laser beam was parallel to the (010) direction of the crystals and focused at a ~1 μm spot size. Unless stated otherwise, the maximum power output of the laser source was filtered to 1% of the maximum power output. $^1H$ NMR spectra were recorded on a 600 MHz Bruker, A600 spectrometer. All samples were prepared by dissolving a small portion of the dried solids (~10 mg) in 0.6 mL of DMSO-$d_6$ solution. Single crystals of appropriate size were selected for XRD experiments. After screening a few diffraction frames to ensure crystal quality, full sphere data were collected using a STOE IPDS 2 diffractometer with graphite-monochromatized Mo Kα radiation (λ=0.71073 Å), operating at 50 kV and 40 mA under $N_2$ flow. Integration and numerical absorption corrections on the data were performed using the STOE X-AREA programs. Crystal structures were solved by direct methods and refined by full-matrix least-squares on $F^2$ using the Jana2006 program package. (See, e.g., Petříček, V., et al., Crystallographic computing system JANA2006: general features. *Zeitschrift für Kristallographie-Crystalline Materials* 229, 345-352 (2014).) All data were collected at room temperature under nitrogen flow. TGA measurements were performed on a Netzsch's Simultaneous Thermal Analysis system. 30 mg of sample was placed inside an alumina cap and heated from 30° C. to 500° C. under He flow with a heating rate of 5° C./min. A Micromeritics AccuPyc II 1340 pycnometer was utilized for the density determination of all samples. 400 mg of dry sample was loaded into an aluminum cap (1 mL), and the volume determination was performed based on He displacement. Each sample was measured 5 times, and the sample volume was recorded along with its standard deviation. The average volume of each sample was used for the density calculations.

The EQE spectrum was characterized by an Oriel model QE-PV-SI instrument equipped with an NIST-certified Si diode. J-V curves were characterized by a Keithley model 2400 instrument under AM1.5G simulated irradiation with a standard solar simulator (Abet Technologies). The light intensity of the solar simulator was calibrated by an NREL-certified monocrystalline silicon solar cell. Steady-state efficiency calculations were performed on a CHI electrochemical workstation. TRPL lifetimes were measured with a streak camera setup (Hamamatsu C4334 Streakscope). The instrument response function was approximately 4% of the sweep window. A commercial direct diode-pumped 100 kHz amplifier (Spirit 1040-4, Spectra Physics) produced a fundamental beam of 1040 nm (350 fs, 4.5 W). This light was used to pump a non-collinear optical parametric amplifier (Spirit-NOPA, Spectra-Physics), which delivered high repetition rate pulses. The samples were excited with 560 nm, 0.3 nJ pulses.

TABLE 2

Comparison of initial and final FA/en ratio on NMR and density measurements.

| Nominal | NMR | Density |
|---------|-------|---------|
| 0.1 | 0.035 | 0.185 |
| 0.25 | 0.095 | 0.233 |
| 0.5 | 0.240 | 0.320 |
| 1 | 0.315 | 0.500 |

TABLE 3

Summary of the photovoltaic parameters of the {en}$FASnI_3$ solar cells with various amounts of en loading.

| | $V_{oc}$ [V] | $J_{sc}$ [mA cm$^{-2}$] | FF [%] | PCE [%] |
|---|---|---|---|---|
| 7.5% | 0.29 | 23.61 | 57.35 | 3.94 |
| 10% | 0.43 | 23.22 | 62.65 | 6.27 |
| 12.5% | 0.47 | 20.04 | 62.16 | 5.86 |
| 15% | 0.51 | 17.33 | 61.20 | 5.43 |

EXAMPLE 2

Synthesis of en/FASnI$_3$ (en: 0%, 10%, 25%, 50%, 100%)

3 mmol of SnCl$_2$·2H$_2$O (Sigma, 98%) with various amounts of ethylenediamine (0-3 mmol) were dissolved in a mixture of 57% w/w aqueous HI solution (5.1 mL) and 50% aqueous H$_3$PO$_2$ (1.7 mL) by heating to boiling under constant magnetic stirring for about 5 min, giving rise to a bright yellow solution. Following this, 3 mmol of formamidine acetate (sigma, ≥98.0%) were added to the hot yellow solution under continuous stirring. After that, the reaction was left to cool to room temperature, and resulted in black crystals being deposited in all cases. The crystals were collected by suction filtration and dried in a vacuum oven at 125° C. for 12 h.

Syntheses of en/MASnI$_3$ (en: 0%, 10%, 20%, 50%, 60%, 80%, 100%)

3 mmol of SnCl$_2$·2H$_2$O (Sigma, 98%) were dissolved in a 57% w/w aqueous HI solution (8 mL) by heating to boiling under constant magnetic stirring for about 5 minutes, forming a bright yellow solution. Various amounts of ethylenediamine (0-3 mmol) were then added to 50% aqueous H$_3$PO$_2$ (1.7 mL) at room temperature (RT; ~23° C.). This solution was added to the hot reaction solution. Following this, 3 mmol of methylamine hydrochloride (sigma, ≥98.0%) were added to the hot yellow solution. The solution was left to cool to RT and resulted in black crystals being deposited in all cases. The crystals were collected by suction filtration and dried in a vacuum oven at 125° C. for 12 h.

Syntheses of en/FAPbI$_3$ (en: 0%, 10%, 20%, 50%, 70%, 100%)

3 mmol of Pb(CH$_3$CO$_2$)$_2$·3H$_2$O (Sigma, 99%) were dissolved in a 57% w/w aqueous HI solution (8 mL) by heating to boiling under constant magnetic stirring for about 5 minutes. Various amounts of ethylenediamine (0-3 mmol) were then added to 50% aqueous H$_3$PO$_2$ (1.7 mL) at RT. This solution was added to the hot reaction solution. Following this, 3 mmol of formamidine acetate (sigma, ≥98.0%) were added to the reaction. The solution was left to cool to RT and resulted in black crystals being deposited in the case of 0%, 10%, 20%, 50% and 70% ethylenediamine. In the case of 100% en (3 mmol), dark red crystals were deposited. The crystals were collected by suction filtration and dried in a vacuum oven at 125° C. for 12 h.

Syntheses of en/MAPbI$_3$ (en: 0%, 10%, 20%, 50%, 60%, 70% 100%)

3 mmol of Pb(CH$_3$CO$_2$)$_2$·3H$_2$O (Sigma, 99%) were dissolved in a 57% w/w aqueous HI solution (8 mL) by heating to boiling under constant magnetic stirring for about 5 minutes. Various amounts of ethylenediamine (0-3 mmol) were then added to 50% aqueous H$_3$PO$_2$ (1.7 mL) at RT. This solution was added to the hot reaction solution. Following this, 3 mmol of methylamine hydrochloride (sigma, ≥98.0%) were added to the hot solution. The solution was left to cool to RT and resulted in black crystals being deposited in the case of 0%, 10%, 20% and 50% ethylenediamine. In the case of 60% (1.8 mmol) and 70% en (2.1 mmol), red crystals were deposited; while in the case of 100% en (3 mmol), orange crystals were deposited. The crystals were collected by suction filtration and dried in a vacuum oven at 125° C. for 12 h.

Characterization and Properties

Four novel families of 3-D hollow hybrid perovskites were synthesized, namely en/MASnI$_3$, en/FASnI$_3$, en/MAPbI$_3$, and en/FAPbI$_3$ containing various amounts of ethylenediamine (en). Incorporation of en in those materials allowed the fine tuning of their electronic properties, resulted in improved air and thermal stability, and enabled the assembly of devices with improved power conversion efficiencies.

The materials were characterized using single crystal XRD and powder XRD. In the case of en/MASnI$_3$, en/FASnI$_3$ and en/FAPbI$_3$, all materials containing various amounts of ethylenediamine were isostructural to the parent pure material containing 0% ethylenediamine, a phase, based on XRD. However, in the case of en/MAPbI$_3$, with increasing amounts of en it was also possible to stabilize the α phase at RT. Variable temperature XRD measurements were also performed. All materials were found to be thermally stable up to 200° C. In the case of some en/MASnI$_3$ and en/FASnI$_3$ compounds, improved stability in air was observed.

Figure 10:
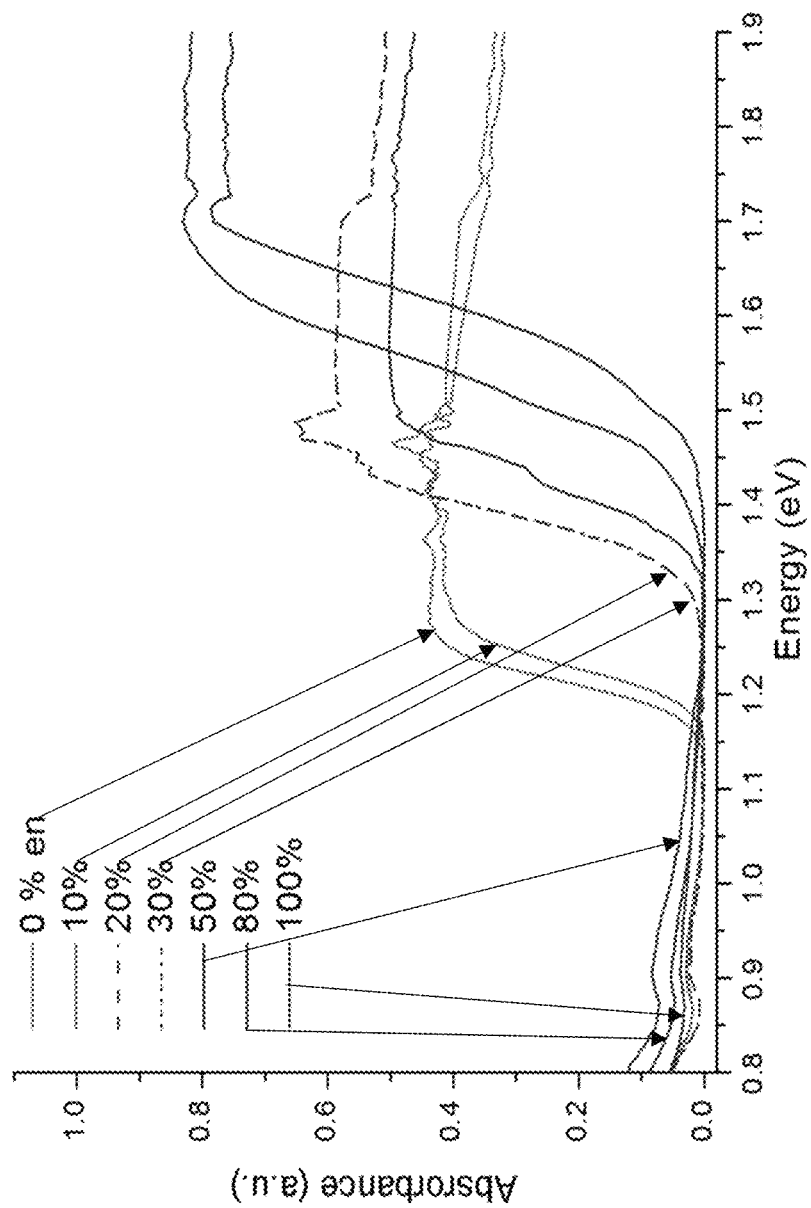
FIG. 10 depicts UV-VIS absorption spectra of en/$MASnI_3$ materials.
Figure 11:
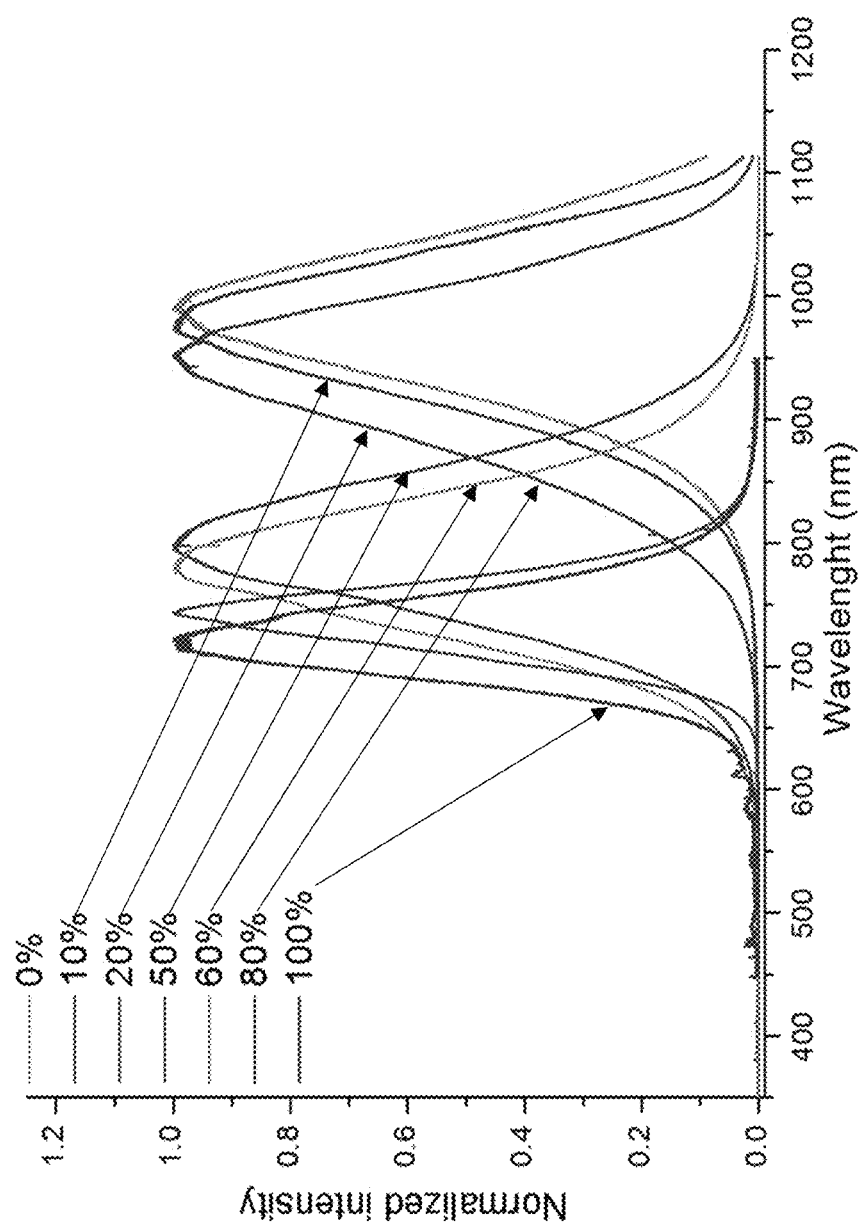
FIG. 11 depicts the photoluminescence spectra of all examined materials from Example 1.
Figure 12:
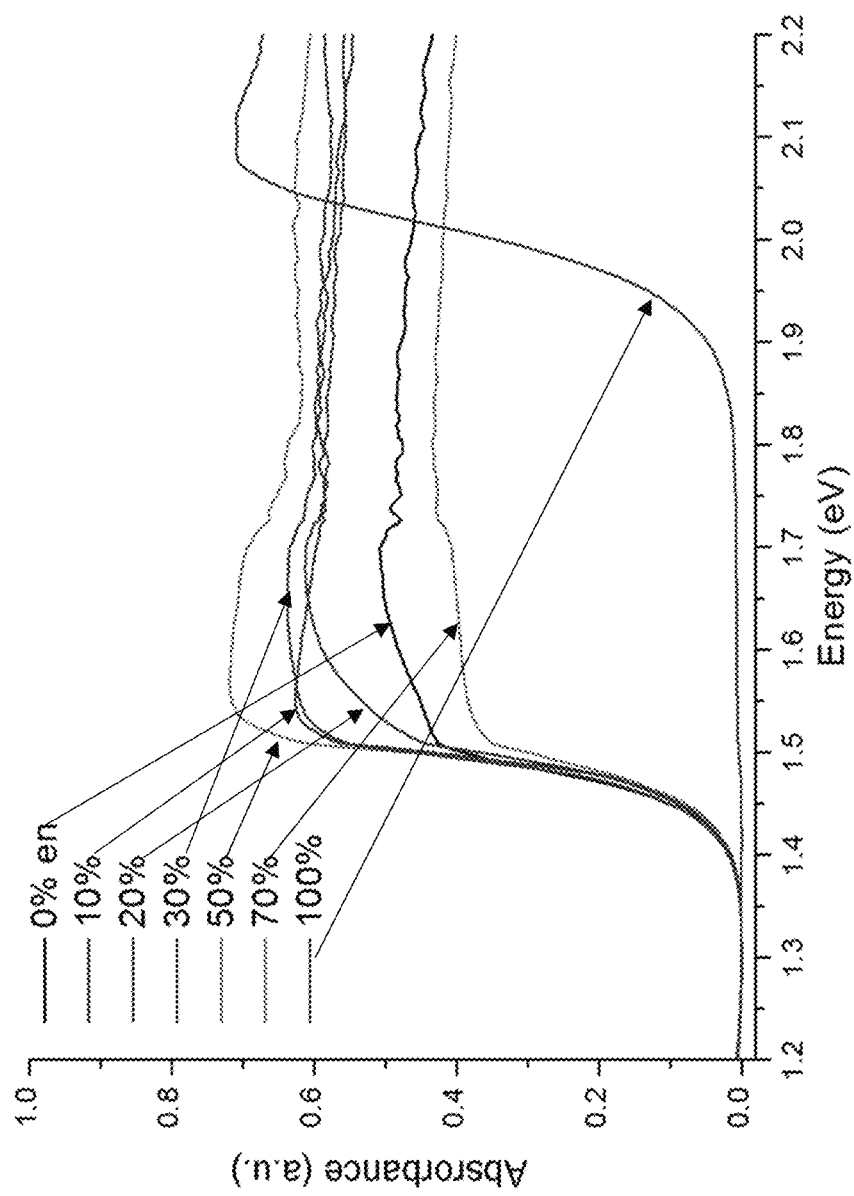
FIG. 12 shows UV-VIS absorption spectra of all materials from Example 1 along with the pure compound en/$FAPbI_3$.
Figure 13:
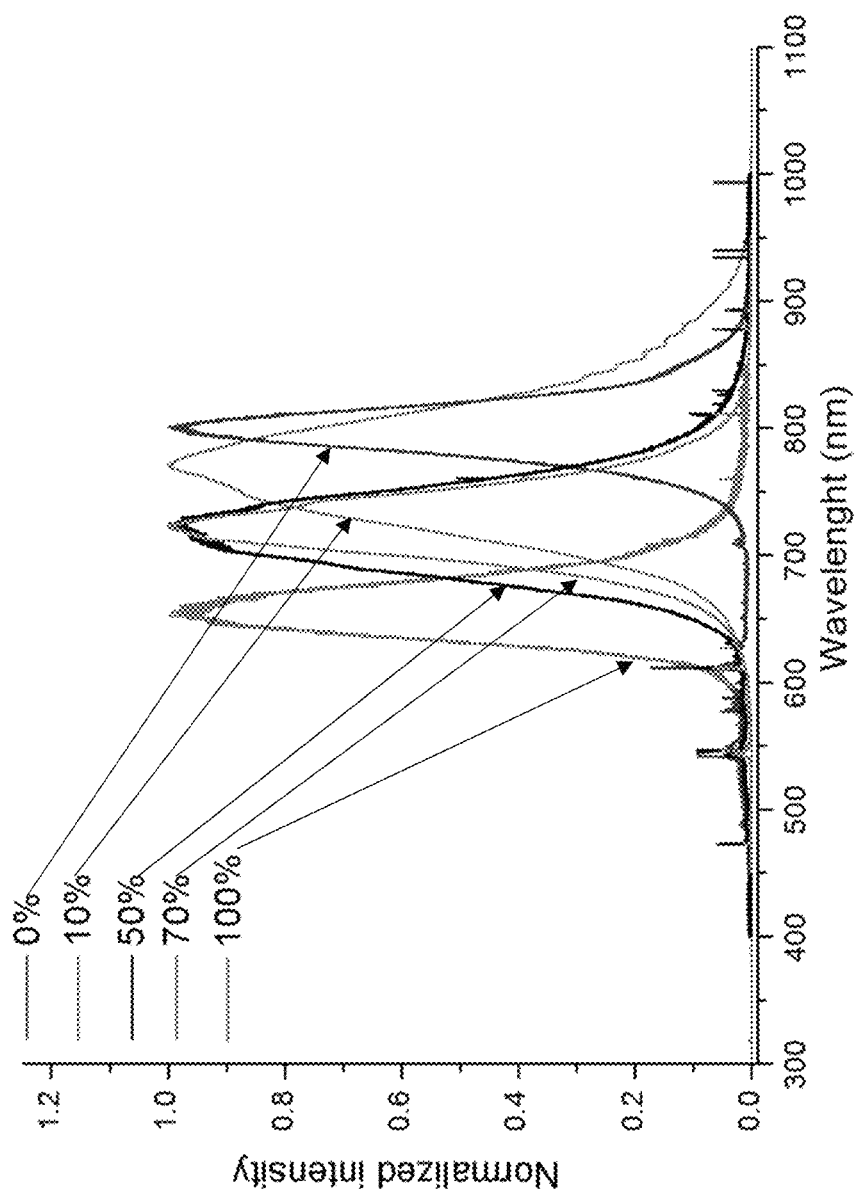
FIG. 13 depicts photoluminescence spectra of the examined materials from Example 1.
Figure 14:
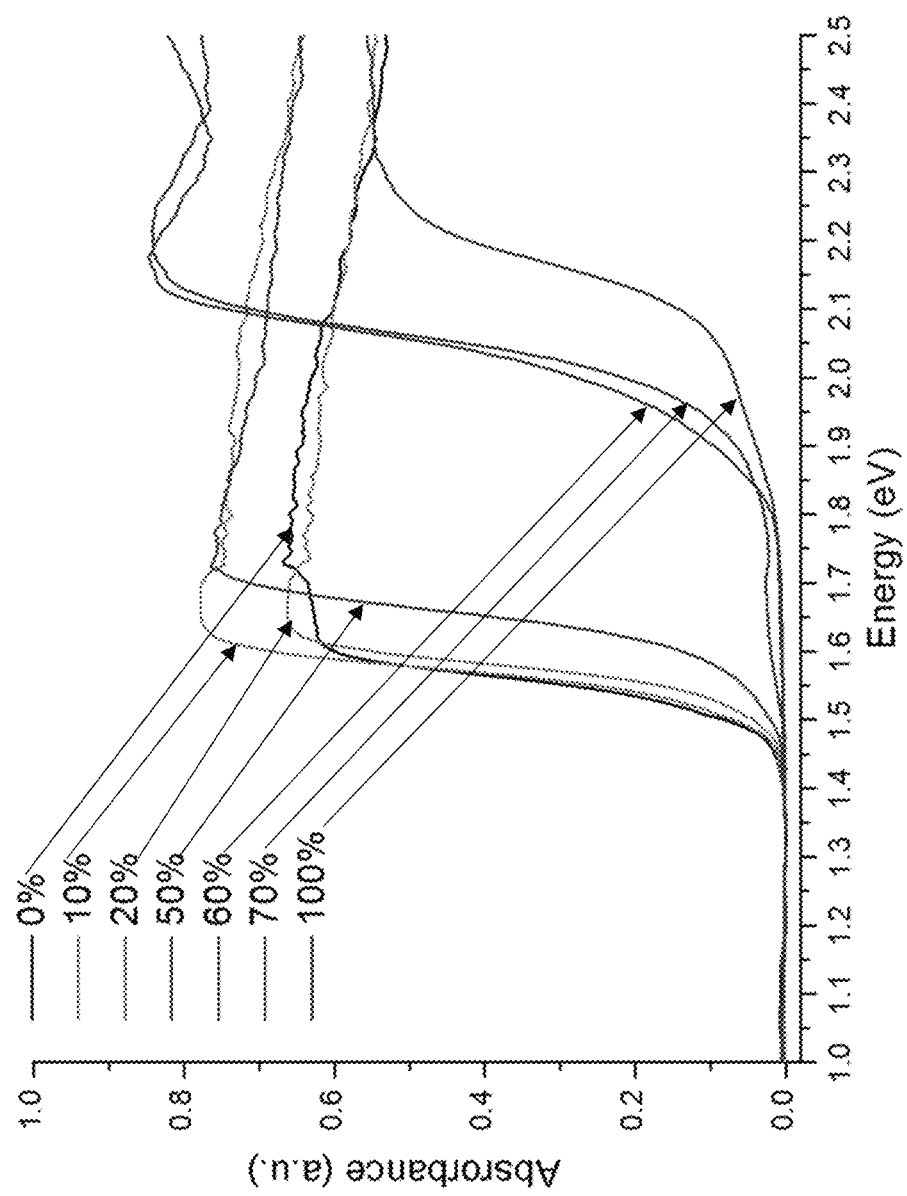
FIG. 14 shows UV-VIS absorption spectra of all materials from Example 1 along with the pure compound en/$MAPbI_3$.
Figure 15:
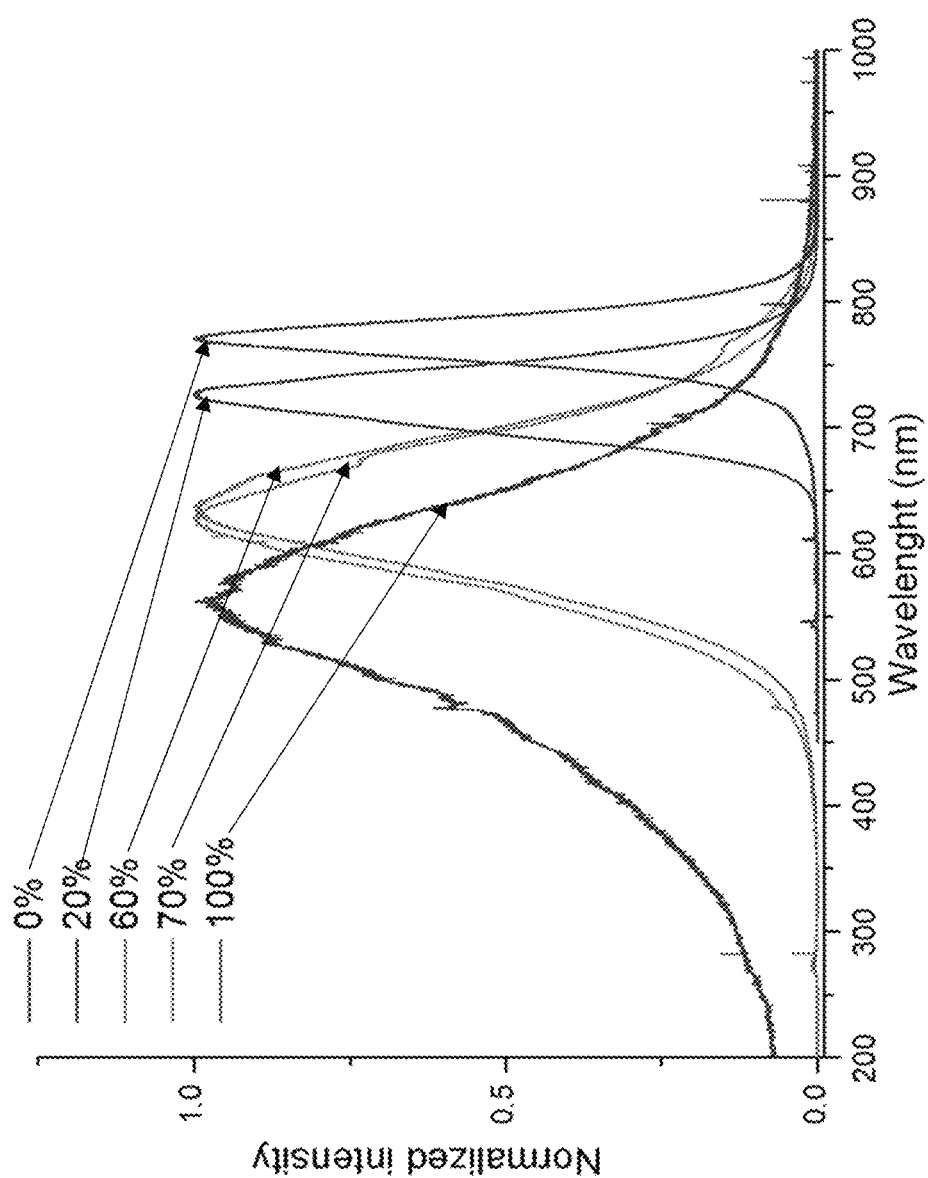
FIG. 15 depicts photoluminescence spectra of the examined materials from Example 1.

Following this, UV-VIS spectroscopy measurements were performed in order to determine the band gap of each compound. With increasing amounts of en, the band gaps shifted to higher values, up to a 38% increase compared to the pure materials (see FIGS. 10, 12 and 14). Additionally, photoluminescence measurements validated this result, as a shift in PL peaks with increasing amounts of en was also observed (see FIGS. 11, 13 and 15). Those findings showed that en may be a part of the framework of those compounds.

To verify the hypothesis that en was actually part of the framework and was responsible for those variations in electronic properties of those compounds. $^1$H-NMR and density measurements were performed. NMR spectroscopy validated the presence of en in those materials. As the nominal concentration of en in a sample increased, the experimental determined amount of en also increased. Furthermore, density measurements revealed that as the amount of en in the samples increased, the crystal density was diminished (see Tables 4, 5 and 6). Those results showed that en was indeed part of the 3-D structure of the perovskites.

Utilization of the compound FASnI$_3$ with 10% en for the assembly of a solar cell device gave rise to a very high-power conversion efficiency of 7.14%, compared to the best performing Sn based perovskite solar cells (see Table 3).

A comparison of the refined unit cell dimensions for the en-materials along with their calculated band gaps is shown in Tables 7-9.

TABLE 4

Comparison of the initial, nominal ratio of en and the experimentally determined ratio from $^1$H-NMR spectroscopy, along with the determined crystal density for all materials. The experimental crystal density was determined using a commercially available pycnometer.

| MASnI$_3$ + en % | Initial en ratio | NMR en ratio | crystal density |
| --- | --- | --- | --- |
| 0 | | | 3.649 |
| 10 | 0.1 | 0.05 | 3.649 |
| 20 | 0.2 | 0.09 | 3.591(1) |
| 50 | 0.5 | 0.21 | 3.536(1) |
| 60 | 0.60 | 0.24 | 3.505(1) |
| 80 | 0.80 | 0.35 | 3.469(1) |
| 100 | 1 | 0.40 | 3.301(1) |

TABLE 5

Comparison of the initial, nominal ratio of en and the experimentally determined ratio from $^1$H-NMR spectroscopy, along with the determined crystal density for all materials. The experimental crystal density was determined using a commercially available pycnometer.

| FAPbI$_3$ + en % | Initial ratio | NMR ratio | crystal density |
|---|---|---|---|
| 0 | | | 4.101 |
| 10 | 0.1 | 0.06 | 4.024(1) |
| 20 | 0.2 | 0.11 | 4.000(1) |
| 50 | 0.5 | 0.21 | 3.880(1) |
| 70 | 0.7 | 0.27 | 3.642(1) |
| 100 | 1 | 0.35 | 3.620(1) |

TABLE 6

Comparison of the initial, nominal ratio of en and the experimentally determined ratio from $^1$H-NMR spectroscopy, along with the determined crystal density for all materials. The experimental crystal density was determined using a commercially available pycnometer.

| MAPbI$_3$ + en % | Initial ratio | NMR ratio | crystal density |
|---|---|---|---|
| 0 | | | 4.1590 |
| 10 | 0.1 | 0.03 | 4.121(1) |
| 20 | 0.2 | 0.10 | 4.058(1) |
| 50 | 0.50 | 0.29 | 3.710(1) |
| 60 | 0.6 | 0.35 | 3.640(1) |
| 70 | 0.7 | 0.40 | 3.624(1) |
| 100 | 1 | 0.44 | 3.550(1) |

TABLE 7

Comparison of the refined unit cell dimension of all en-materials along with their calculated band gaps. The increase of the en concentration leads to an increase in the unit cell dimensions and the observed band gap for all materials.

| MASnI$_3$ + en % | Unit cell dimension a (Å) | Band gap (eV) |
|---|---|---|
| 0 | 6.236 | 1.18 (black) |
| 10 | 6.234 | 1.19>> |
| 20 | 6.250 | 1.34>> |
| 30 | 6259 | 1.34>> |
| 50 | 6.26 | 1.35>> |
| 60 | 6.27 | 1.41>> |
| 80 | 6.27 | 1.44>> |
| 100 | 6.28 | 1.51>> |

TABLE 8

Comparison of the refined unit cell dimension of all en-materials along with their calculated band gaps. An increase in the en concentration leads to an increase in the unit cell dimensions and observed band gap for all materials.

| FAPbI$_3$ + en % | Unit cell dimension a (Å) | Band gap (eV) |
|---|---|---|
| 0 | 6.354 | 1.45 (black) |
| 10 | 6.354 | 1.45>> |
| 20 | 6.354 | 1.47>> |
| 30 | 6.355 | 1.47>> |
| 50 | 6.356 | 1.48>> |
| 70 | 6.354 | 1.48>> |
| 100 | 9.030 | 1.96 (dark red) |

TABLE 9

Comparison of the refined unit cell dimension of all en-materials along with their calculated band gaps. The increase of the en concentration leads to an increase to the unit cell dimension and the observed band gap for all materials.

| MAPbI$_3$ + en % | Unit cell dimension a (Å) | Band gap (eV) |
|---|---|---|
| 0 | 6.28 | 1.52 (black) |
| 10 | 6.28 | 1.55>> |
| 20 | 6.29 | 1.57>> |
| 50 | 6.32 | 1.62>> |
| 60 | 6.35 | 1.97 (dark red) |
| 70 | 6.35 | 2 (dark red) |
| 100 | 6.35 | 2.1 (orange) |

EXAMPLE 3

In this example, methods of making and the structural and physical characteristics of crystals of en-based hollow iodide perovskites are reported. The hollow perovskites were formulated as $(A)_{1-x/2}(en)_{x/2}M_{1-x/2}X_{3-x/2}$, where x is the amount of en incorporated in the perovskite. Three different types of materials are described, based on MASnI$_3$ $((MA)_{1-x/2}(en)_{x/2}(Sn)_{1-x/2}$, MAPbI$_3$ $((MA)_{1-x/2}(en)_{x/2}Pb_{1-x/2}I_{3-x/2})$, and FAPbI$_3$ $((FA)_{1-x/2}(en)_{x/2}(Pb)_{1-x/2}(I)_{3-x/2})$. These systems were studied for various amounts of ethylene diammonium (en) ranging between x=0-44%.

Synthesis

All three families of the $(A)_{1-x/2}(en)_{x/2}M_{1-x/2}X_{3-x/2}$ perovskites were synthesized using an HI/H$_3$PO$_2$ solvent mixture that can produce uniform and high-quality single crystals.

During synthesis optimization, the order of the addition of the reactants, as well as their concentration in the reaction media, played a role in obtaining hollow perovskites. The ratios of the starting materials were based on the stoichiometric formula, targeting the AMX$_3$ compositions. The targeted nominal en:A:M ratios were in the range of: (0.1-1):1:1. The addition of higher amounts of en led to the co-precipitation of light-colored secondary byproducts, identified by single-crystal diffraction to be the ethylenediammonium iodide, enI$_2$, and ethylenediammonium lead iodide, enPbI$_4$·2H$_2$O, for the cases of Sn- and Pb-based perovskites, respectively. In the case of enI$_2$, the molecular structure was 0D and consisted of single I atoms that were charge balanced by ethylenediammonium cations. In the case of enPb$_4$·2H$_2$O, the structure consisted of 1D [PbI$_4$]$^{2-}$ chains that were separated and charge balanced by ethylenediammonium cations. Water molecules were also present in the structure. The maximum amount of en that was incorporated in the structure was found not to exceed x=0.44, obtained for the $(MA)_{0.78}(en)_{0.22}(Pb)_{0.78}(I)_{2.78}$ composition. Initially, the metal source was dissolved in the boiling solvent mixture, followed by the addition of en. If the perovskitizer (A-site cation that can stabilize the perovskite structure) was added before en, then the pristine compounds were formed instantly and the addition of en had no effect on the already formed perovskite crystals. Upon the addition of the perovskitizer (MA or FA) to the hot reaction solution, black crystals formed immediately, while uniform red or orange crystals formed upon cooling of the reaction solution. The color of the crystals, $(MA)_{1-x/2}(en)_{x/2}(Pb)_{1-x/2}(I)_{3-x/2}$, x=0.35-0.44 and $(FA)_{1-x/2}(en)_{x/2}(Pb)_{1-x/2}$ $(I)_{3-x/2}$, x=0.39, depended on the amount of en, and the metal ion. When an amount of en with x≥0.35 was incorporated into the framework, it triggered a color change from black to red and orange (Tables 10-12). Note that the color change only occurred in the Pb perovskites, as only in that instance was the band gap change large enough to cause this effect.

TABLE 10

Comparison of the refined unit cell dimension of $(MA)_{1-x/2}(en)_{x/2}(Sn)_{1-x/2}(I)_{3-x/2}$ materials along with their calculated band gaps. The increase of the en concentration led to an increase to the unit cell dimension and the observed band gap for all materials.

| MASnI$_3$ + en % | Unit cell parameters a, b, c (Å) | Unit cell Volume (Å$^3$) | Band gap (eV) |
|---|---|---|---|
| 0 | 6.2360(3), 6.2360(3), 6.2430(7) | 242.77(8) | 1.21 (black cr.) |
| 5 | 6.244(1), 6.244(1), 6.244(2) | 243.5(3) | 1.25>> |
| 9 | 6.2509(3), 6.2509(3), 6.2493(6) | 244.18(8) | 1.28>> |
| 21 | 6.2605(2), 6.2605(2), 6.2738(5) | 245.89(6) | 1.35>> |
| 24 | 6.267(1), 6.267(1), 6.282(2) | 246.7(3) | 1.42>> |
| 36 | 6.2995(3), 6.2995(3), 6.2972(3) | 249.90(6) | 1.45>> |
| 40 | 6.2994(8), 6.2994(8), 6.305(2) | 250.2(2) | 1.51>> |

TABLE 11

Comparison of the refined unit cell dimensions of $(FA)_{1-x/2}(en)_{x/2}(Pb)_{1-x/2}(I)_{3-x/2}$ materials along with their calculated band gaps. An increase of the en concentration led an increase in the unit cell dimension and the observed to band gap for all materials.

| FAPbI$_3$ + en % | Unit cell parameters axbxc (Å) | Unit cell Volume Normalized (Å$^3$) | Band gap (eV) |
|---|---|---|---|
| 0 | 6.352(1), 6.358(1), 6.348(1) | 256.4(2) | 1.44 (black cr.) |
| 7 | 6.358(1), 6.355(2), 6.362(2) | 257.1(3) | 1.53>> |
| 11 | 6.3637(5), 6.3782(7), 6.3505(7) | 257.8(1) | 1.57>> |
| 21 | 6.3766(7), 6.371(3), 6.385(3) | 259.4(5) | 1.67>> |
| 27 | 6.3808(8), 6.386(3), 6.377(3) | 259.9(4) | 1.69>> |
| 29 | 6.3817(7), 6.3924(7), 6.3740(7) | 260.0(1) | 1.71>> |
| 39 | 9.038(2), 9.038(2), 12.807(5) | 262(2) | 1.94 (dark red) |

TABLE 12

Comparison of the refined unit cell dimension of $(MA)_{1-x/2}(en)_{x/2}(Pb)_{1-x/2}(I)_{3-x/2}$ materials along with their calculated band gaps. The increase of the en concentration led to an increase in the unit cell dimensions and the observed band gap for all materials.

| MAPbI$_3$ + en % | Unit cell parameters axbxc (Å) | Unit cell Volume Normalized (Å$^3$) | Band gap (ev) |
|---|---|---|---|
| 0 | 8.8617(3), 8.8617(3), 12.6492(5) | 248.3(2) | 1.52 (black cr.) |
| 3 | 8.8814(4), 8.8814(4), 12.6558(8) | 249.5(3) | 1.56>> |
| 10 | 6.306(1), 6.306(1), 6.296(2) | 250.3(3) | 1.65>> |
| 29 | 6.314(3), 6.314(3), 6.324(7) | 252.1(9) | 1.73>> |
| 35 | 6.3472(8), 6.3472(8), 6.333(2) | 255.2(2) | 1.85 (dark red) |
| 40 | 6.352(1), 6.352(1), 6.364(2) | 256.8(3) | 2 (red) |
| 44 | 6.3814(2), 6.3814(2), 6.3940(5) | 260.38(6) | 2.1 (orange) |

In the case of $(MA)_{1-x/2}(en)_{x/2}(Sn)_{1-x/2}(I)_{3-x/2}$, six analogs were synthesized with en loading x=0.05, 0.10, 0.21, 0.24, 0.36, 0.40. Uniform black crystals of α-MASnI$_3$ (non-centrosymmetric tetragonal structure, P4mm space group, or as a centrosymmetric cubic structure, Pm-3m space group) were obtained in all cases. Six $(FA)_{1-x/2}(en)_{x/2}(Pb)_{1-x/2}(I)_{3-x/2}$ analogues were synthesized with en concentrations of x=0.07, 0.11, 0.21, 0.27, 0.29, 0.39. Following the established synthetic methodology for the isolation of the conventional pristine perovskite α-FAPbI$_3$ (non-centrosymmetric orthorhombic structure, Amm2 space group, or centrosymmetric cubic structure, Pm-3m space group), yellow crystals of the δ-FAPbI$_3$ perovskitoid phase were initially precipitated, which were subsequently converted to the black α-phase upon further heating at the solvent's boiling point. (See, e.g., Stoumpos, C. C.; et al., Inorg. Chem. 2013, 52, 9019; and Kaltzoglou, A.; et al., Inorg. Chem. 2017, 56, 6302.) Removing the black crystals from the hot solution, using suction filtration, and drying them in an oven at 110° C., enabled the stabilization of the pristine black α phase of FAPbI$_3$ at room temperature for more than 1 week, while absence of the heat treatment step could lead to swift transformation to the yellow δ-phase in 24 hours. Unlike the pristine perovskite FAPbI$_3$, addition of en in the reaction medium gave rise to stable, uniform, black $(FA)_{1-x/2}(en)_{x/2}(Pb)_{1-x/2}(I)_{3-x/2}$ crystals in up to x=0.29 en loading. The presence of en, even in a small amount, such as x=0.07, stabilized the α-phase of FAPbI$_3$ (i.e. $(FA)_{0.965}(en)_{0.035}(Pb)_{0.965}(I)_{2.965}$). Interestingly, by increasing the amount of en to x=0.39, red crystals of the β-phase (non-centrosymmetric tetragonal structure, P4bm space group, or as a centrosymmetric tetragonal structure, P4/mbm, space group) precipitated. Regarding the $(MA)_{1-x/2}(en)_{x/2}(Pb)_{1-x/2}(I)_{3-x/2}$ hollow perovskites, six en loadings were examined, with x=0.03, 0.10, 0.29, 0.35, 0.40 and 0.44. At room temperature the stable MAPbI$_3$ phase was the tetragonal β-phase (tetragonal structure, I4/mcm space group). The presence of en dication enabled the stabilization of the α-MAPbI$_3$ phase at room temperature (non-centrosymmetric tetragonal structure, P4mm space group, or as a centrosymmetric cubic structure, Pm-3m space group). It was observed that en loadings higher than 0.10 gave rise to uniform black α-MAPbI$_3$ crystals. Remarkably, at x=0.35-0.40 en loading, the α-MAPbI$_3$ phase precipitated as uniform red crystals, while in the case of x=0.44 en the crystals were orange.

The phase purity of the resulting materials was confirmed by X-ray powder diffraction (PXRD). All $(MA)_{1-x/2}(en)_{x/2}(Sn)_{1-x/2}(I)_{3-x/2}$ perovskites had exactly the same PXRD pattern and were isostructural to the pristine α-MASnI$_3$ material (x=0). PXRD studies of the $(FA)_{1-x/2}(en)_{x/2}(Pb)_{1-x/2}(I)_{3-x/2}$ compounds verified their uniform phase and purity. For x values up to 0.29, the hollow perovskites were isostructural to the pristine α-FAPbI$_3$, whereas at x=0.39 the appearance of additional diffraction peaks at 2θ=22.3° and 26.4° were characteristic of the formation of the pure β-FAPbI$_3$. $(MA)_{1-x/2}(en)_{x/2}(Pb)_{1-x/2}(I)_{3-x/2}$ hollow perovskites crystallized at the β phase for x=0-0.10, while for x values up to 0.44 all materials were isostructural to the pristine α-MAPbI$_3$. This was made clear by the disappearance of the diffraction peak at 2θ=23.7°, which was characteristic of the β phase MAPbI$_3$, giving rise to uniform α-MAPbI$_3$ crystals. Except for the evaluation of phase purity, PXRD measurements revealed that there was a gradual expansion in the unit cell volume with increasing amounts of en in the structure. Indexing of the PXRD patterns of all materials sheds light on this observation in all cases (Tables 10-12).

The highest amount of en loading found among all of the hollow perovskites was for orange $(MA)_{0.78}(en)_{0.22}(Pb)_{0.78}(I)_{2.78}$. For the Pb-based compounds, x values above 0.35 of en incorporation in the structure resulted in the formation of red crystals. However, in the case of Sn hollow perovskites, with x values up to 0.40 in the crystal structure, there was no deposition of red crystals since the wider bandgap was still ~1.51 eV. All $(MA)_{1-x/2}(en)_{x/2}(Sn)_{1-x/2}(I)_{3-x/2}$ crystals were black and formed immediately upon the addition of the perovskitizer, while the red $(MA)_{1-x/2}(en)_{x/2}(Pb)_{1-x/2}(I)_{3-x/2}$ and $(FA)_{1-x/2}(en)_{x/2}(Pb)_{1-x/2}(I)_{3-x/2}$ crystals formed after some time, when the solution was cooler. The remarkable fact in the chemistry presented above is that the dication of en has not been known to stabilize the 3D perovskite AMX$_3$ structure. The compound enPbI$_4$·2H$_2$O does not have a perovskite structure and the analogous compound enSnI$_4$ has not previously been reported.

The presence of en in the crystal structure and the exact amount of en loading in a given composition was determined by $^1$H-NMR spectroscopy, by dissolving the crystals of all the $(A)_{1-x/2}(en)_{x/2}M_{1-x/2}X_{3-x/2}$ materials in a polar solvent and determining the cations ratios based on their NMR signatures. The quantification was based on both the methyl (—CH$_3$, δ=2.39 ppm) and the ammonium (—NH$_3^+$, δ=7.49 ppm) protons of the methylammonium cation versus the methylene (—CH$_2$—, δ=3.02 ppm) and ammonium (—NH$_3^+$, δ=7.77 ppm) protons of the ethylenediammonium (en) cations. In methylammonium, the integration of those peaks revealed a ratio of 1:1, since there were three protons from the methyl group (—CH$_3$) and three protons from the amine cation (—NH$_3^+$). In ethylenediammonium, the ratio of the 2 peaks was 4:6, arising from four —CH$_2$— protons and six ammonium (—NH$_3^+$) protons, indicating that en was doubly protonated in solution. The same methodology was used for all samples. The resulting compositions are tabulated in Table 13.

TABLE 13

Comparison of the nominal ratio of en % used in the synthesis and the experimentally determined one (x) from $^1$H-NMR spectroscopy for all 18 new materials.

| nominal en % | 10 | 20 | 50 | 60 | 70 | 80 | 100 |
|---|---|---|---|---|---|---|---|
| MASnI$_3$ (x) actual en % | 5 | 9 | 21 | 24 | — | 36 | 40 |
| MAPbI$_3$ actual en % (x) | 3 | 10 | 29 | 35 | 40 | — | 44 |

TABLE 13-continued

Comparison of the nominal ratio of en % used in the synthesis and the experimentally determined one (x) from $^1$H-NMR spectroscopy for all 18 new materials.

| nominal en % | 10 | 20 | 50 | 60 | 70 | 80 | 100 |
|---|---|---|---|---|---|---|---|
| FAPbI$_3$ actual en % (x) | 7 | 11 | 21 | — | 27 | 29 | 39 |

Figure 16B:
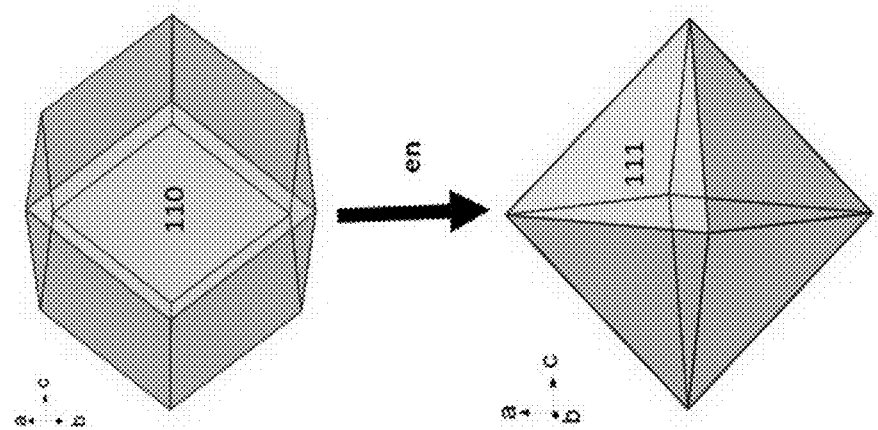
FIG. 16B is a schematic representation of the perovskite growth in rhombic dodecahedral and octahedral geometries. Relative to the idealized cubic perovskite, in rhombic dodecahedra the face diagonal of the perovskite (110 facets) was exposed, whereas the incorporation of en induced the perovskite growth from the body diagonal to expose the (111) facets in the octahedral morphology.
Figure 16A:
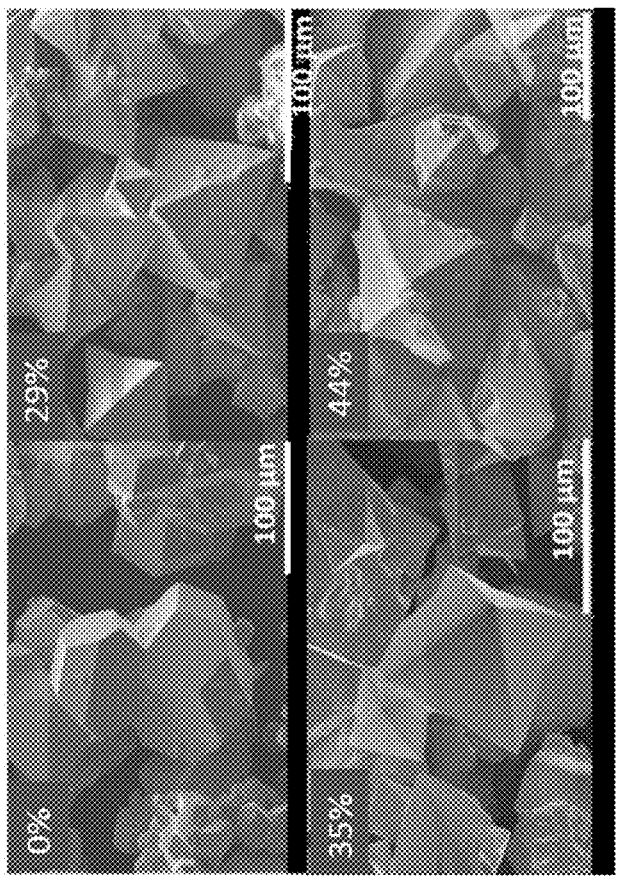
FIG. 16A shows representative SEM images of compounds $(MA)_{1-x/2}(en)_{x/2}(Pb)_{1-x/2}(I)_{3-x/2}$, x=0, 0.29, 0.35 and 0.44.
Figure 21:
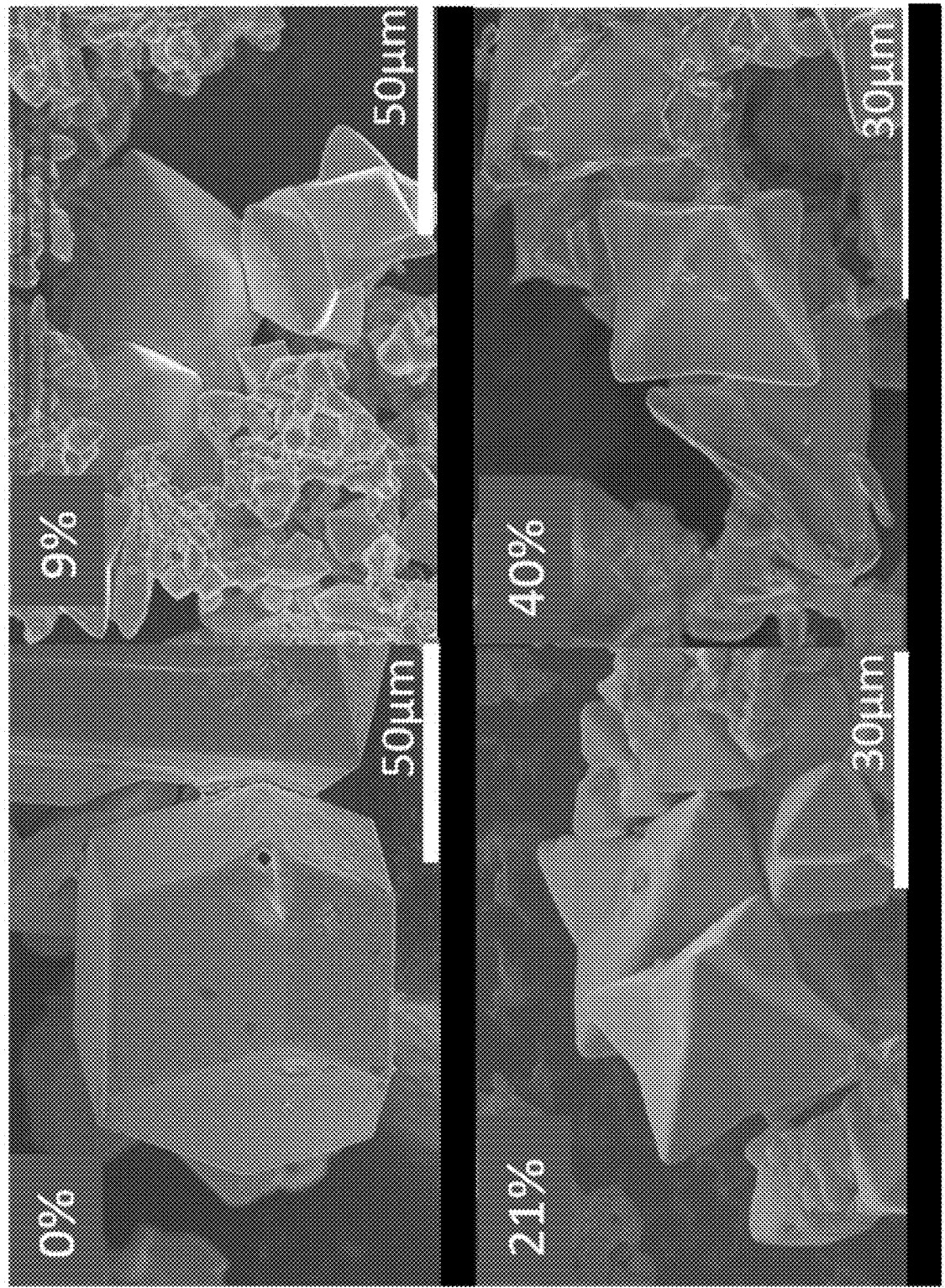
FIG. 21 shows representative SEM images of pristine perovskite a $MASnI_3$, hollow $(MA)_{0.955}(en)_{0.045}(Sn)_{0.955}(I)_{2.955}$, $(MA)_{0.895}(en)_{0.105}(Sn)_{0.895}(I)_{2.895}$ and $(MA)_{0.8}(en)_{0.2}(Sn)_{0.8}(I)_{2.8}$.
Figure 22:
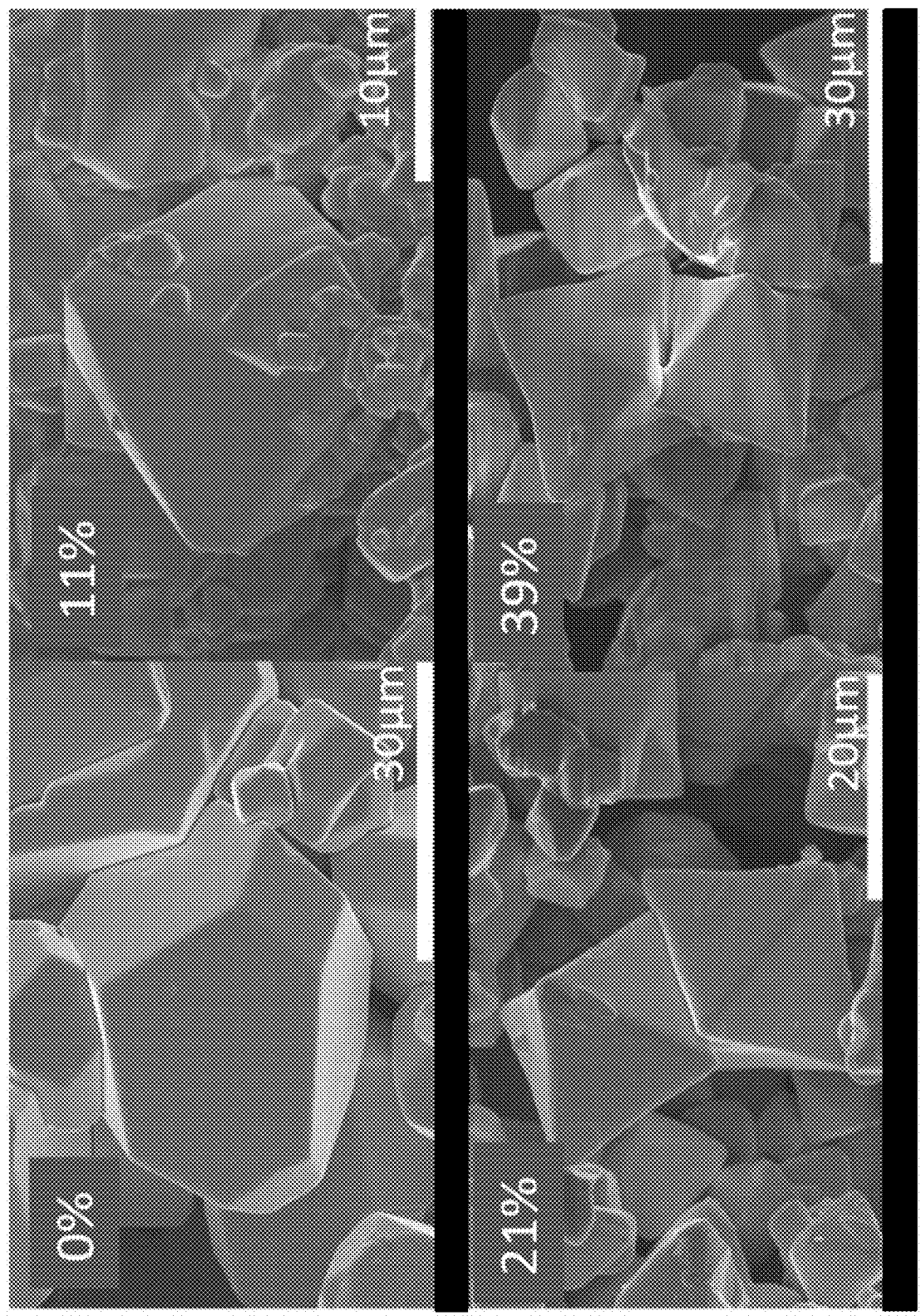
FIG. 22 shows representative SEM images of pristine perovskite a $FAPbI_3$, hollow $(FA)_{0.945}(en)_{0.55}(Pb)_{0.945}(I)_{2.945}$, $(FA)_{0.895}(en)_{0.105}(Pb)_{0.895}(I)_{2.895}$, and $(FA)_{0.805}(en)_{0.195}(Pb)_{0.895}(I)_{2.805}$.

Scanning electron microscopy (SEM) imaging revealed that the morphology of the crystals also changed upon the incorporation of en (FIG. 16A and FIGS. 21 and 22). The pristine full perovskite materials (x=0) exhibited the typical rhombic dodecahedral morphology, whereas all en containing crystals appeared as regular octahedra. The octahedral morphology observed here in the hollow perovskites is unprecedented. The octahedral morphology requires the growth of the perovskite to occur along its body diagonal (111) direction in the cubic aristotype, driven by the organization of the cations residing at the A-site (FIG. 16B). The involvement of the A-site cations in the crystal growth of the hollow perovskites suggests that the solids tended to terminate their surface at the en cations, thereby helping to improve the stability of the perovskites towards humidity.

Air Stability

The incorporation of en into the perovskite structure imparted a remarkable improvement in air stability in the tin systems. For example, the $(MA)_{0.8}(en)_{0.2}(Sn)_{0.8}(I)_{2.8}$ composition was stable for at least 9 days at ambient atmosphere. The PXRD pattern of the highly hollow perovskite after 9 days in air was exactly the same with the fresh as made sample with no traces of crystalline decomposition products. However, after 16 days in air, traces of crystalline decomposition products started to form as small diffraction peaks, which do not belong to the α-MASnI$_3$ crystal structure, appeared at 2θ values of 12.5°, 22°, 29° and 42°. For comparison, the compound $(MA)_{0.88}(en)_{0.12}(Sn)_{0.88}(I)_{2.88}$, which incorporates approximately half the amount of en in the framework, is stable in air for ~1 day only. In this case decomposition products started to appear on the second day, based on the PXRD measurements, whereas the pristine MASnI$_3$ analogue itself started to decompose after 10 minutes of air exposure. The enhanced air stability was partly also attributed to the "dilution" of the Sn$^{2+}$ ion content and the disconnected nature of the perovskite framework, which presumably slowed down the oxidation kinetics. The markedly improved air stability appeared to be a common feature of the hollow perovskites.

In the case of the red $(FA)_{0.805}(en)_{0.195}(Pb)_{0.805}(I)_{2.805}$ crystals, PXRD measurements revealed that the material was stable in air for 300 days, stabilized at the β phase.

Regarding the orange crystals of $(MA)_{0.78}(en)_{0.22}(Pb)_{0.78}(I)_{2.78}$ compound, PXRD measurements revealed that the material was stable in air for less than 330 days, as an additional diffraction peak at 2θ=11.9° and another one, appearing as a "shoulder" at 2θ=20° coming from crystalline decomposition by-products appeared.

A combination of physical and spectroscopic methods (XRD, gas pycnometry, $^1$H-NMR, TGA, SEM/Energy Dispersive X-RAY (EDX)), were used to study the hollow perovskites and to assign them the general formula $(A)_{1-x/2}(en)_{x/2}(M)_{1-x/2}(X)_{3-x/2}$. These studies revealed that the incorporation of en in the 3D perovskite structure leads to massive M and X vacancies in the 3D [MX$_3$] framework, thus the term hollow. Certain results of the studies are highlighted below. Additional information about the studies and the experimental and theoretical procedures used can be found in Spanopoulos et al., *J. Am. Chem. Soc.*, 2018, 140(17), pp. 5728-5742, the entire disclosure of which is incorporated herein by reference. As the inventors do not intend to limit the inventions described herein to the perovskites having the specific formula shown above, it should be noted that the materials may also have other chemical formulas, including the formula $(A)_{1-x}(en)_x(M)_{1-0.7x}(X)_{3-0.04x}$, wherein x may be, for example, in the range from 0.01 to 0.90.

Figure 17A:
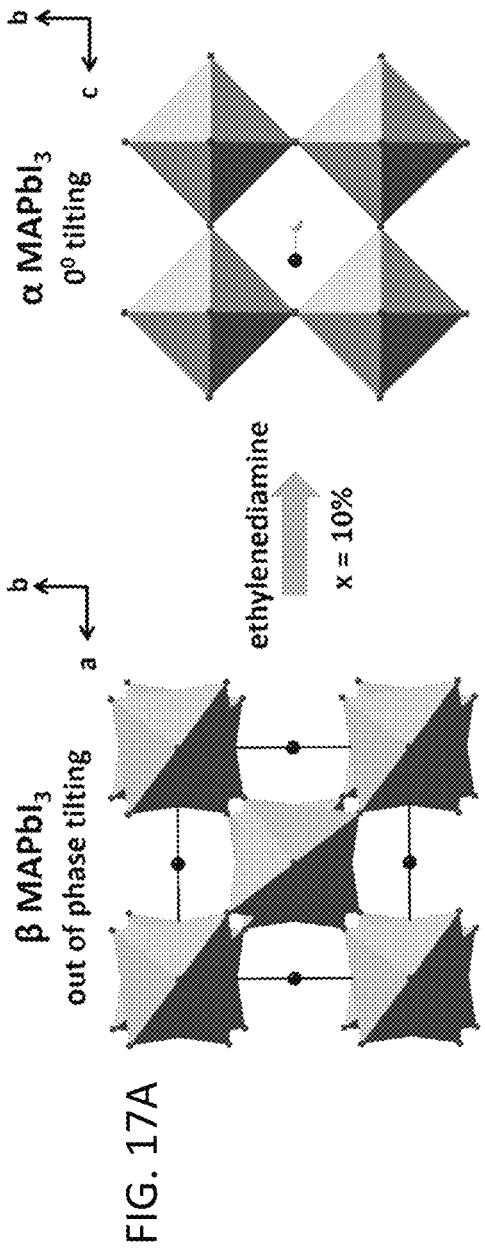
FIGS. 17A and 17B show views of the 3D structures of the lead iodide perovskites highlighting their phase transformations.
Figure 17B:
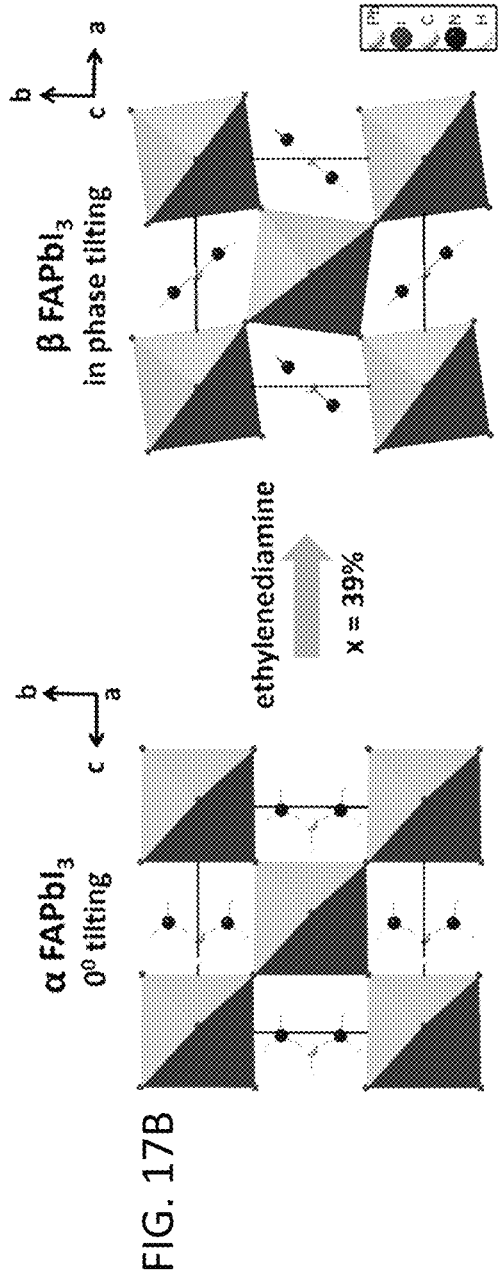

The hollow perovskites were found to undergo compositionally-controlled structural phase transitions based on their MA/en and FA/en ratio, as illustrated in FIGS. 17A and 17B. The en incorporation into the framework stabilized the $\beta$-FAPbI$_3$ at RT (298 K) and the $\alpha$-MAPbI$_3$. The phase transition for MAPbI$_3$ progressed from the initial tetragonal $\beta$-phase (I4/mcm space group) to the $\alpha$-phase (non-centrosymmetric tetragonal structure, P4mm space group, or as centrosymmetric cubic structure, Pm-3m space group) above an en loading of x=0.10.

Figures 18A, 18B:
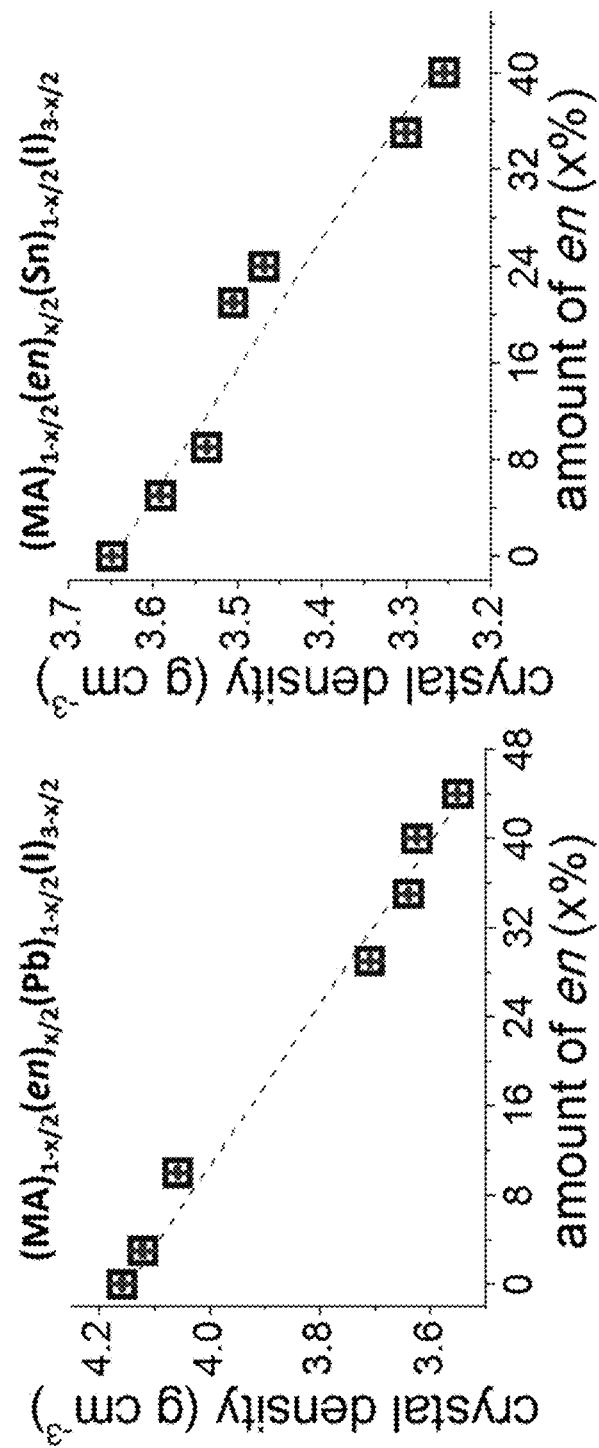
FIG. 18A shows the correlation of the percentage of en in $(MA)_{1-x/2}(en)_{x/2}(Pb)_{1-x/2}(I)_{3-x/2}$ samples towards the measured crystal density.
FIG. 18B shows the correlation of the percentage of en in $(MA)_{1-x/2}(en)_{x/2}(Sn)_{1-x/2}(I)_{3-x/2}$ samples towards the measured crystal density. There were 15% and 11% decreases in the crystal densities of the most hollow materials, in comparison to the pristine one, respectively (error bars are inside the squares).
Figure 19:
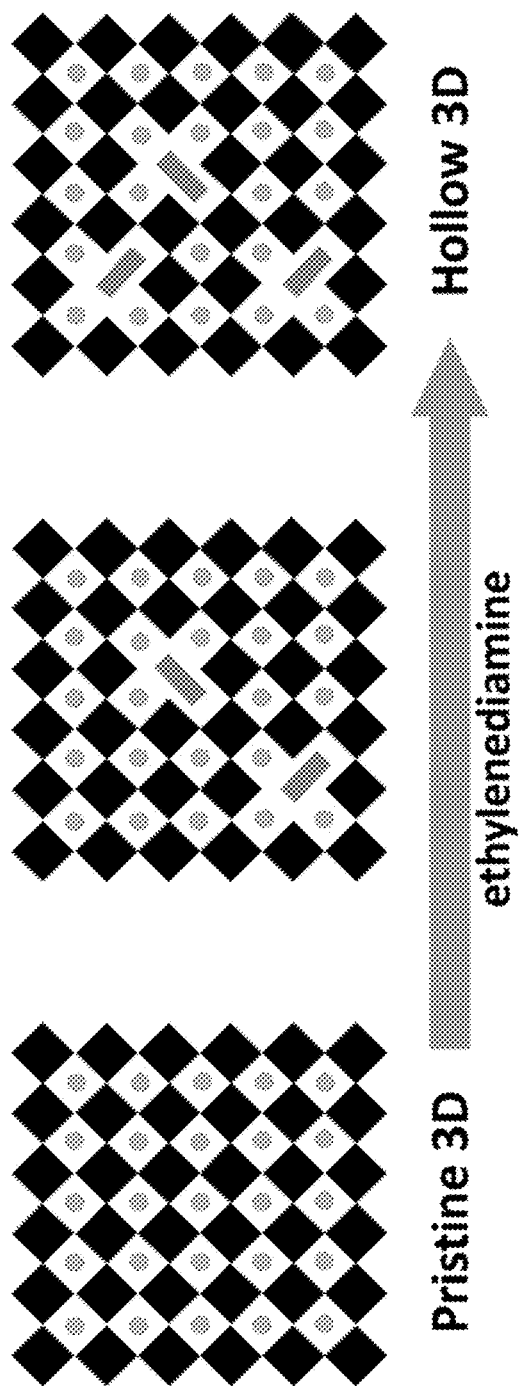
FIG. 19 is a schematic illustration of the structure of the 3D pristine $MAPbI_3$ perovskite and its transformation from a dense proper perovskite structure to a hollow 3D structure with increasing amounts of en. Cubes: [$PbI_6$] octahedra, Spheres: MA cations, Rectangles: ethylenediammonium (en) cations.
Figure 23:
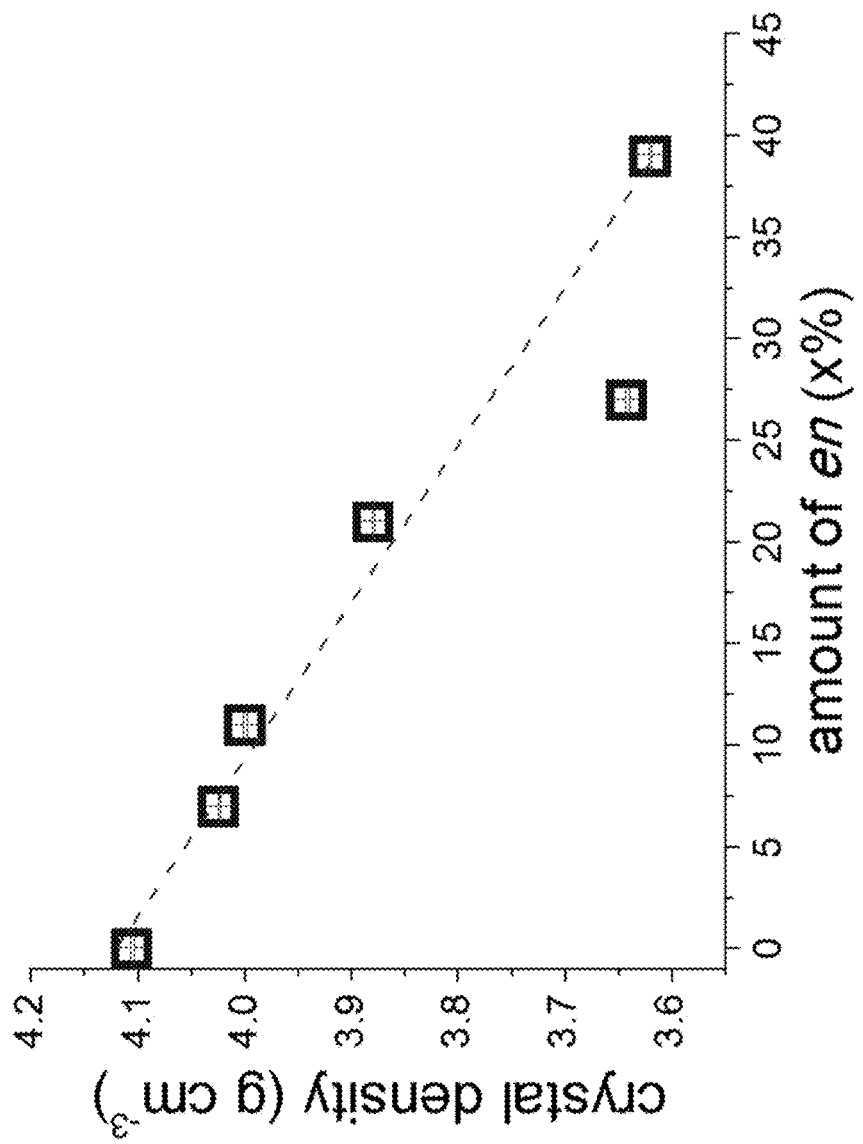
FIG. 23 shows a correlation of the percentage of en in $(FA)_{1-x/2}(en)_{x/2}(Pb)_{1-x/2}(I)_{3-x/2}$ samples towards the determined crystal density (error bars are inside the squares). There was a 12% decrease in the crystal density of the 39% containing en material in comparison to the pristine one.

Gas pycnometry was used to assess the content of en in the solids and the "hollowness" of the structure, using He as the gas displacement medium. These studies found that the density of the (MA) series perovskites decreased systematically as a function of (x), starting from $\rho$=3.640 (1) g cm$^{-3}$ for the pristine full perovskite to $\rho$=3.255(1) g cm$^{-3}$ for the x=0.40 composition, corresponding to an overall 11% decrease (FIG. 18A). The drastic decrease cannot by accounted for by a simple substitution of two MA molecules with one en cation since the mass difference in this case is negligible. Therefore, it was evident that en displaced part of the heavy atoms in the inorganic framework, including both Sn$^{2+}$ and I$^-$ ions. The same trend was also observed for the Pb analogs with maximum en loading, reaching a 12% and 15% density decrease for $(FA)_{0.815}(en)_{0.195}(Pb)_{0.815}(I)_{2.815}$ (FIG. 23) and $(MA)_{0.78}(en)_{0.22}(Pb)_{0.78}(I)_{2.78}$ (FIG. 18B), respectively (Tables 14-16). A perspective of the transformation from a pristine structure to a hollow structure is shown schematically in FIG. 19.

Based on the above results, the general composition of the materials was formulated. In order to determine which chemical composition best described best the experimental results, nine possible chemical formulae that could potentially arise from the incorporation of en in the hollow perovskites were tested and compared with the combined array of experimental results. The theoretical density of each compound, $\rho_{calc}$, was calculated by using the molecular weight of the formula and the volume of the unit cell that was determined from indexing the powder XRD patterns. In all cases the charge of en was considered to be (2+), based on the $^1$H-NMR spectra, while in one case the possibility that the charge was (+1) considered. In order to compare the results of the nine compositions and select the most accurate one, an arbitrary crystal density difference value, that works as a threshold limit was introduced. For that purpose, a difference between the calculated and experimental crystal density ($\rho_{calc}-\rho_{exp}$) above 0.1 g cm$^{-3}$ was set to be the cut off limit. The formula which had the fewest compounds below this limit and was also consistent with the fact that it is highly unlikely for an en molecule to replace only M$^{2+}$ ions in the structure, was determine to be the correct composition. Based on this analysis the perovskites were determined to have the composition $A_{(1-x/2)}en_{(x/2)}M_{(1-x/2)}I_{(3-x/2)}$ (i.e., $MA_{(1-x/2)}en_{(x/2)}Sn_{(1-x/2)}I_{(3-x/2)}$, $MA_{(1-x/2)}en_{(x/2)}Pb_{(1-x/2)}I_{(3-x/2)}$ and $FA_{(1-x/2)}en_{(x/2)}Pb_{(1-x/2)}I_{(3-x/2)}$).

TABLE 14

Comparison of the initial, nominal ratio of en (the amount that was used in the synthesis) and the experimental determined one from $^1$H-NMR spectroscopy (x), along with the determined crystal density for all $(MA)_{1-x/2}(en)_{x/2}(Sn)_{1x/2}(I)_{3-x/2}$ materials and the theoretical crystal density if all the nominal amounts of en entered the structure. The experimental crystal density was determined using a commercially available pycnometer.

| MASnI$_3$ + en % | Nominal en amount | NMR en (x) | Exp. crystal density (g cm$^{-3}$) Based on (x) | Theor. crystal density (g cm$^{-3}$) Based on nominal amount |
|---|---|---|---|---|
| 0 | | | 3.640(1) | 3.636 |
| 10 | 0.1 | 0.05 | 3.591(1) | 3.552 |
| 20 | 0.2 | 0.09 | 3.536(1) | 3.469 |
| 50 | 0.5 | 0.21 | 3.505(2) | 3.228 |
| 60 | 0.60 | 0.24 | 3.469(1) | 3.146 |
| 80 | 0.80 | 0.36 | 3.301(1) | 2.962 |
| 100 | 1 | 0.40 | 3.255(1) | 2.816 |

TABLE 15

Comparison of the initial, nominal ratio of en (the amount that was used in the synthesis) and the experimental determined one from $^1$H-NMR spectroscopy (x), along with the determined crystal density for all $(FA)_{1-x/2}(en)_{x/2}(Pb)_{1-x/2}(I)_{3-x/2}$ materials and the crystal density of all the nominal amounts of en entered into the structure. The theoretical experimental crystal density was determined using a commercially available pycnometer.

| FAPbI$_3$ + en % | Nominal en amount | NMR en (x) | Exp. crystal density (g cm$^{-3}$) Based on (x) | Theor. crystal density (g cm$^{-3}$) Based on nominal amount |
|---|---|---|---|---|
| 0 | | | 4.106(2) | 4.101 |
| 10 | 0.1 | 0.07 | 4.024(1) | 3.989 |
| 20 | 0.2 | 0.11 | 4.000(2) | 3.876 |
| 50 | 0.5 | 0.21 | 3.880(1) | 3.547 |
| 70 | 0.7 | 0.27 | 3.642(2) | 3.337 |
| 100 | 1 | 0.39 | 3.620(1) | 3.010 |

TABLE 16

Comparison of the initial, nominal ratio of en (the amount that was used in the synthesis) and the experimental determined one from $^1$H-NMR spectroscopy (x), along with the determined crystal density for all $(MA)_{1-x/2}(en)_{x/2}(Pb)_{1-x/2}(I)_{3-x/2}$ materials and the theoretical crystal density of all the nominal amounts of en entered into the structure. The experimental crystal density was determined using a commercially available pycnometer.

| MAPbI$_3$ + en % | Nominal en amount | NMR en (x) | Exp. crystal density (g cm$^{-3}$) Based on (x) | Theor. crystal density (g cm$^{-3}$) Based on nominal amount |
|---|---|---|---|---|
| 0 | | | 4.151(2) | 4.146 |
| 10 | 0.1 | 0.03 | 4.121(3) | 4.025 |
| 20 | 0.2 | 0.1 | 4.058(2) | 3.935 |
| 50 | 0.50 | 0.29 | 3.710(1) | 3.586 |
| 60 | 0.6 | 0.35 | 3.640(1) | 3.445 |
| 70 | 0.7 | 0.40 | 3.624(1) | 3.324 |
| 100 | 1 | 0.44 | 3.550(1) | 2.988 |

Optical Absorption and Photoluminescence

Optical absorption spectra for all the hollow perovskites showed that with increasing amount of en the band gap shifted to higher energy values (FIGS. 20A-20F). At the maximum en loading in the framework a ~40% increase in the energy bandgap was observed. The parameter that controls the optical properties in 3D perovskite compounds was s/p orbitals overlapping among the metal and the halide ions.

This overlap relates directly to the M-X-M φ angle. However, the shape and the nature of the A cation(s) can indirectly affect this angle, causing distortions to the metal octahedra. With a decreasing φ angle, the band gap increases and this trend is observed also during phase transitions, from α to γ and δ phases. Especially in the case of MAPbI$_3$, during its phase transitions over a wide temperature range (4.2 K to 400 K) the observed blue shift in the bandgap was relatively small (0.08 eV difference). This effect was more pronounced (0.58 eV difference) during the compositionally induced phase transitions and was attributed to the disruption of the crystal lattice by en, or possibly to an "emphanisis-like" behavior (strongly amplified by en incorporation) rather than a thermal expansion mechanism of the band gap widening. As en was incorporated into the structure and M and I atoms were removed from the 3D framework, they created discontinuities in the M-X-M-X bridges as they were replaced by M-X-vacancy-X moieties. Because of the presence of a large number of these M$^{2+}$ and I$^-$ vacancies, the orbital overlap among the remaining M/X atoms was reduced and, as a consequence, the widths of the VBM and CBM narrowed, leading to the experimentally observed increase in the bandgap.

Figures 20A, 20B:
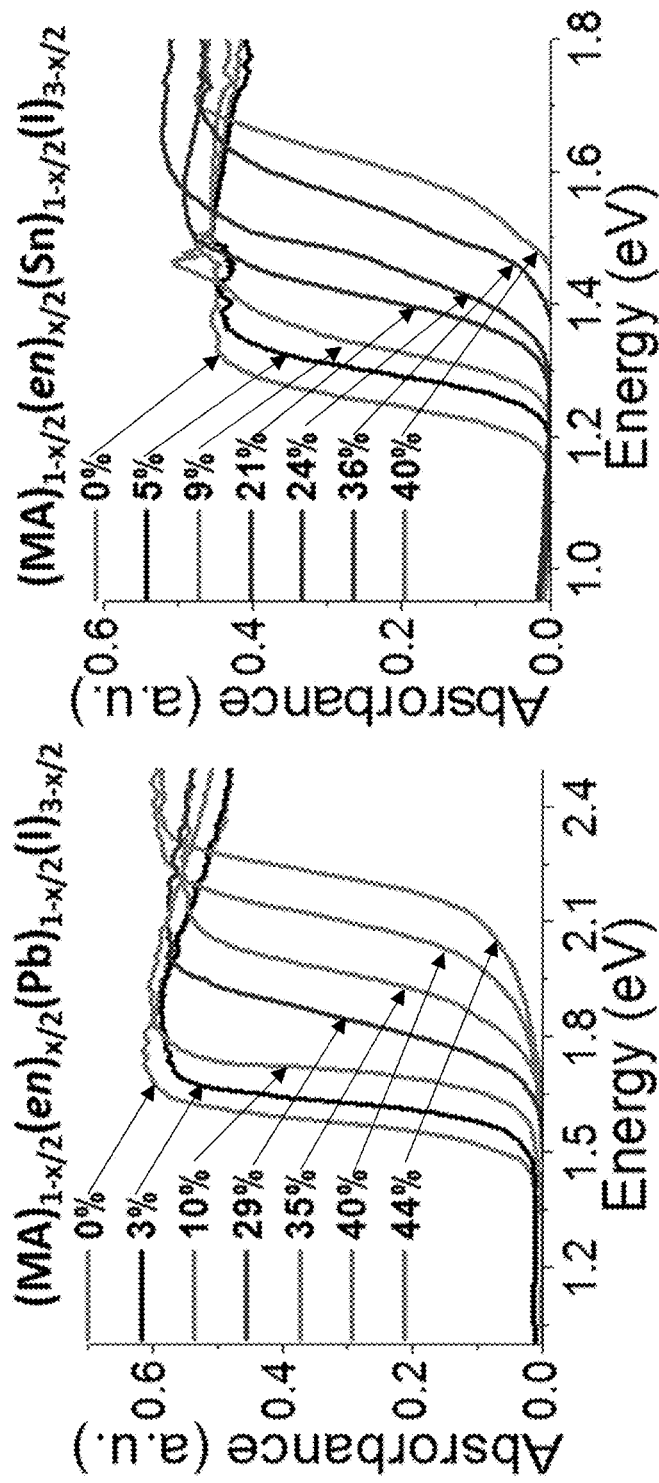
FIG. 20A shows optical absorption spectra of compound $(MA)_{1-x/2}(en)_{x/2}(Pb)_{1-x/2}(I)_{3-x/2}$.
FIG. 20B shows optical absorption spectra of compound $(MA)_{1-x/2}(en)_{x/2}(Sn)_{1-x/2}(I)_{3-x/2}$.
Figure 24:
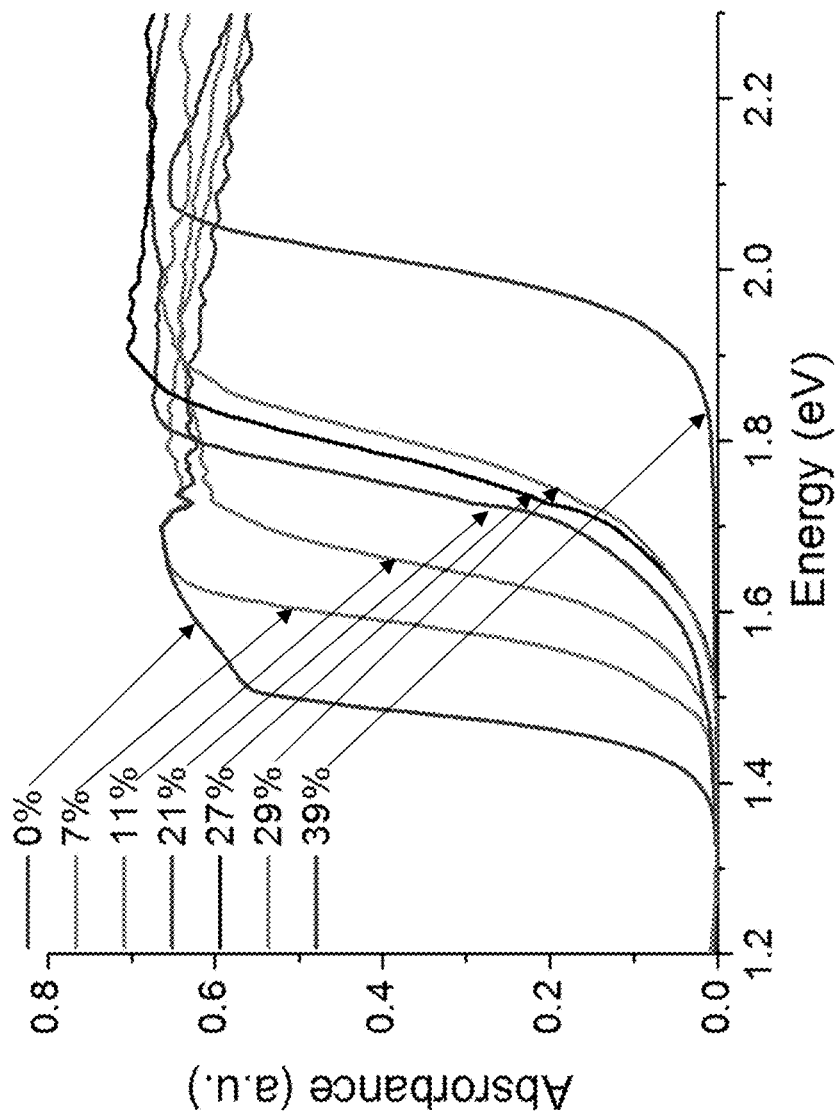
FIG. 24 shows optical absorption spectra of compounds $(FA)_{1-x/2}(en)_{x/2}(Pb)_{1-x/2}(I)_{3-x/2}$ with increasing amount of en, up to 39%.

All eighteen (18) of the hollow perovskite compounds presented in this work are direct band semiconductors as it was verified by the sharp band edge in absorption spectra and DFT calculations. (MA)$_{1-x/2}$(en)$_{x/2}$(Sn)$_{1-x/2}$(I)$_{3-x/2}$ materials exhibited band gaps ranging from 1.25 eV to 1.51 eV for x values starting from 0.05 to 0.40 (FIG. 20B). For the (MA)$_{1-x/2}$(en)$_{x/2}$(Pb)$_{1-x/2}$(I)$_{3-x/2}$ materials, the band gaps increased from 1.56 eV to 2.1 eV for x values spanning from 0.03 to 0.44 (FIG. 20A). Similarly, the (FA)$_{1-x/2}$(en)$_{x/2}$(Pb)$_{1-x/2}$(I)$_{3-x/2}$ hollow perovskites revealed bang gaps in the range of 1.53 eV to 1.94 eV for x values from 0.07 to 0.39 (FIG. 24). This corresponds to a significant increase of ~20%, ~40% and ~35% in the band gap energy, respectively. The band gap trend was reflected in the crystal color change from black to red and orange observed for the Pb-based hollow perovskites. The band gap increase can be attributed to the "hollowing out" of the perovskite framework, which is a form of aperiodic dimensional reduction of the crystal lattice.

Figures 20C, 20D:
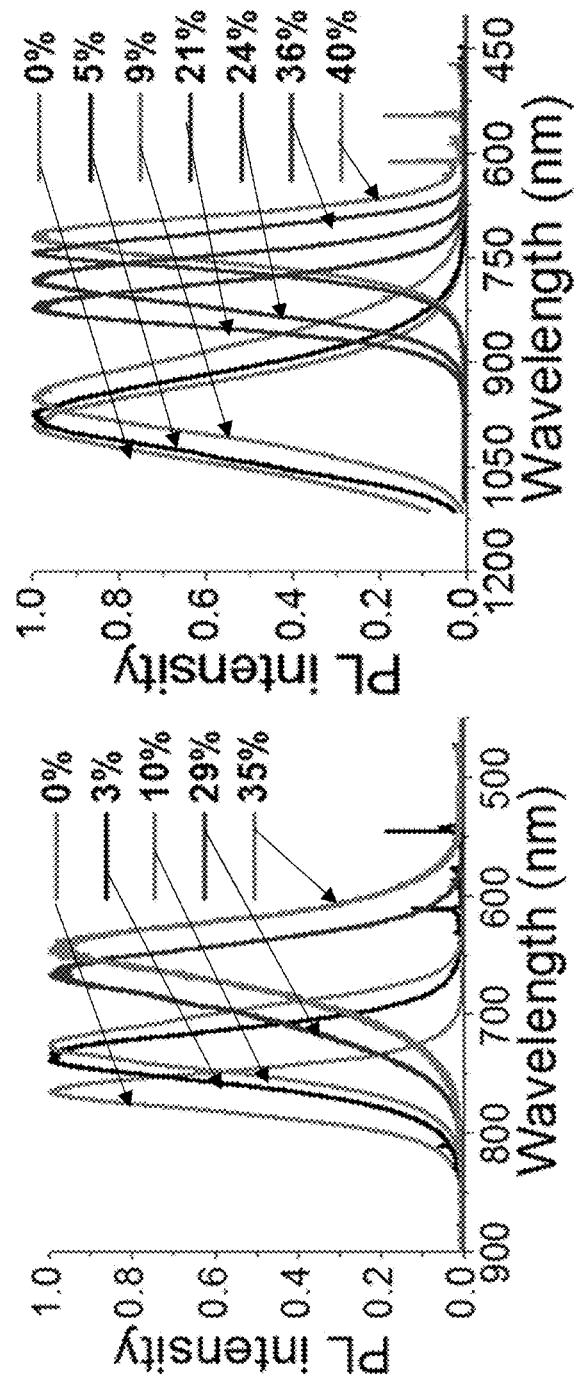
FIG. 20C shows emission spectra of compound $(MA)_{1-x/2}(en)_{x/2}(Pb)_{1-x/2}(I)_{3-x/2}$ with increasing amounts of en and correlation of amount of en % towards the recorded absorption (FIG. 20E) and emission spectra (FIG. 20F) for all hollow perovskites.
FIG. 20D shows emission spectra of compound $(MA)_{1-x/2}(en)_{x/2}(Sn)_{1-x/2}(I)_{3-x/2}$ with increasing amount of en and correlation of amount of en % towards the recorded absorption (FIG. 20E) and emission spectra (FIG. 20F) for all hollow perovskites. For comparison purposes, in FIGS. 20E and 20F, all various x values were normalized from 0 to 40% for all materials.

The hollow perovskites exhibited photoluminescence (PL) at room temperature that was blue shifted with increasing fractions of en (FIGS. 20C and 20D). Photoluminescence is an important property for photovoltaic applications, as an optimum light absorbing candidate should not only absorb light efficiently but also emit light in the same manner. Interestingly, the red and orange crystals of compounds (MA)$_{1-x/2}$(en)$_{x/2}$(Pb)$_{1-x/2}$(I)$_{3-x/2}$ and (FA)$_{1-x/2}$(en)$_{x/2}$(Pb)$_{1-x/2}$(I)$_{3-x/2}$ exhibited no PL. All the Sn-based analogues exhibited strong PL emission that covered a range from 991 nm for the pristine MASnI$_3$ to 718 nm for the (MA)$_{0.8}$(en)$_{0.2}$(Sn)$_{0.8}$(I)$_{2.8}$ (FIG. 20D). The PL emission peak of the pristine compound (no en) was centered at 1.25 eV, matching the band gap energy (1.21 eV) from the absorption spectrum. With increasing fractions of en, the two values started to diverge significantly, reaching a maximum absorption/emission energy difference of 0.22 eV for the (MA)$_{0.8}$(en)$_{0.2}$(Sn)$_{0.8}$(I)$_{2.8}$ composition, revealing an above band gap photoluminescence (Table 17). Taking into account that this material contains the highest amount of en among all hollow perovskites, it is likely that, due to the existence of a large number of defects, there could be some spatially confined domains in the structure that caused lattice strain and gave rise to stable excitonic states. Those states may have contributed to the increase of the energy of the emission spectrum.

Figure 25:
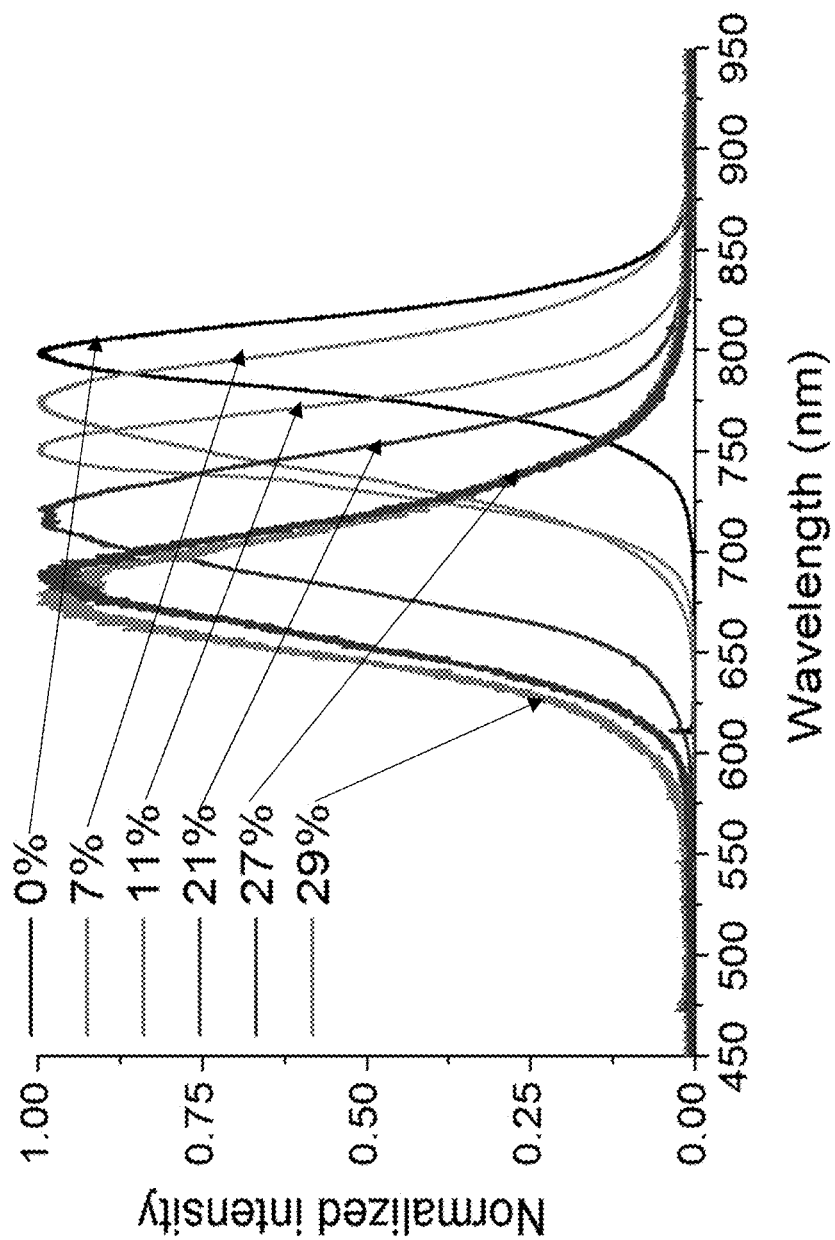
FIG. 25 shows photoluminescence spectra of $(FA)_{1-x/2}(en)_{x/2}(Pb)_{1-x/2}(I)_{3-x/2}$ materials.

The Pb-based analogs exhibited a similar blue shift with increasing amounts of en, accompanied by an analogous divergence between the absorption/emission energy. The PL peak maxima of the (FA)$_{1-x/2}$(en)$_{x/2}$(Pb)$_{1-x/2}$(I)$_{3-x/2}$ perovskites ranged between 799 nm for the pristine α-FAPbI$_3$ to 678 nm for the (FA)$_{0.855}$(en)$_{0.145}$(Pb)$_{0.855}$(I)$_{2.855}$ (FIG. 25). Likewise, the PL peaks of the (MA)$_{1-x/2}$(en)$_{x/2}$(Pb)$_{1-x/2}$(I)$_{3-x/2}$ compounds ranged between 766 nm for the pristine β-MAPbI$_3$ to 644 nm for (MA)$_{0.825}$(en)$_{0.175}$(Pb)$_{0.825}$(I)$_{2.825}$ (FIG. 20C). In both cases, all Pb based materials exhibited an above band gap PL, with a maximum energy difference of 0.12 eV and 0.13 eV for (FA)$_{0.855}$(en)$_{0.145}$(Pb)$_{0.855}$(I)$_{2.855}$ and (MA)$_{0.855}$(en)$_{0.145}$(Pb)$_{0.855}$(I)$_{2.855}$, respectively, significantly smaller than that observed for the Sn-based hollow perovskite (0.22 eV), which contained much higher amounts of en (Table 17).

Figures 20E, 20F:
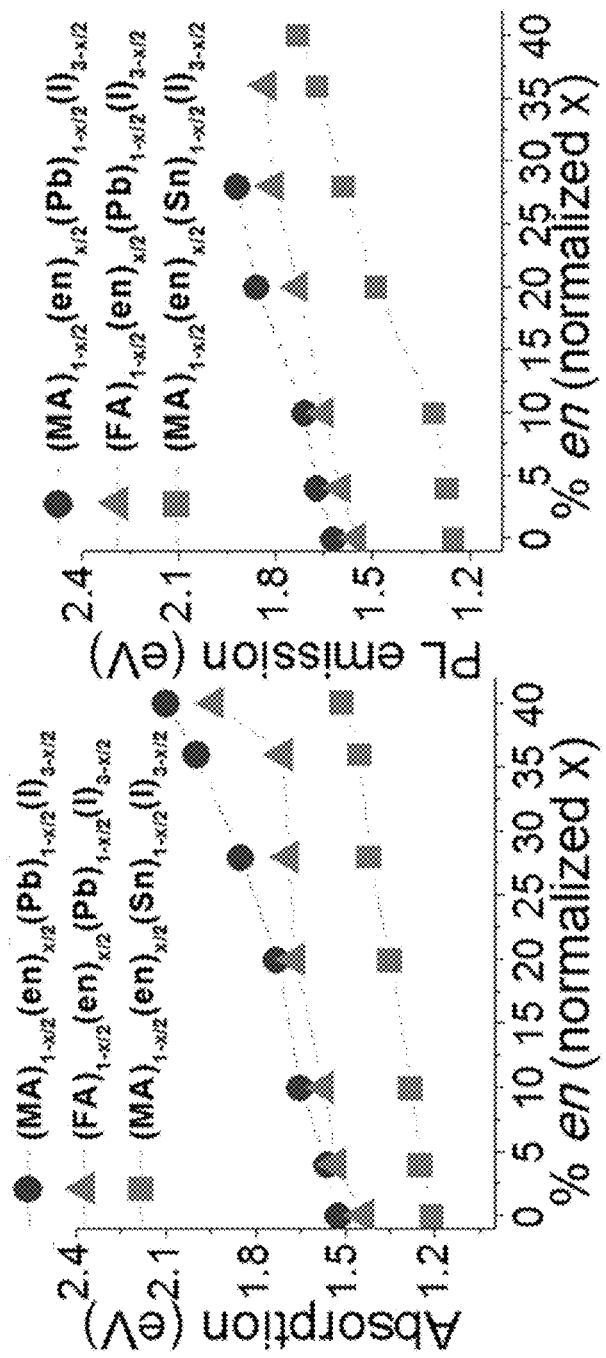

The unusual feature of the PL in hollow perovskites is that with increasing en loading, the intensity gradually diminishes and vanishes (at room temperature) for the materials with x>0.35 (FIGS. 20C and 20F). All (FA)$_{0.805}$(en)$_{0.195}$(Pb)$_{0.805}$(I)$_{2.805}$, (MA)$_{0.8}$(en)$_{0.2}$(Pb)$_{0.8}$(I)$_{2.8}$ and (MA)$_{0.78}$(en)$_{0.22}$(Pb)$_{0.78}$(I)$_{2.78}$ compositions exhibited no light emission. This could be attributed to the special crystal growth of the hollow perovskites (along (111) direction, see above), which exposed specifically the A-site cations at the crystal edges. The presence of significant amounts of en in the crystal surface led to an effective disconnection of the perovskite structure, which may be responsible for the loss of PL emission when the local concentration of en at the surface exceeds a certain limit. Because of the disorder in the structure, the presence of charged point defects that may act as nonradiative recombination centers (traps) cannot be ruled out. Furthermore, this PL emission absence could be attributed to phonon quenching by the large number of vacancies.

TABLE 17

Measured band gap energy (eV) from the absorption spectra and the corresponding PL peak positions (eV) for all hollow and pristine examined materials (x = 0). The maximum recorded energy difference values were 0.22 eV for the (MA)$_{1-x/2}$(en)$_{x/2}$(Sn)$_{1-x/2}$(I)$_{3-x/2}$ compounds, 0.12 eV for the (FA)$_{1-x/2}$(en)$_{x/2}$(Pb)$_{1-x/2}$(I)$_{3-x/2}$ compounds and 0.13 eV for the (MA)$_{1-x/2}$(en)$_{x/2}$(Pb)$_{1-x/2}$(I)$_{3-x/2}$ compounds.

| normalized | (MA)$_{1-x/2}$(en)$_{x/2}$(Sn)$_{1-x/2}$(I)$_{3-x/2}$ | | (FA)$_{1-x/2}$(en)$_{x/2}$(Pb)$_{1-x/2}$(I)$_{3-x/2}$ | | (MA)$_{1-x/2}$(en)$_{x/2}$(Pb)$_{1-x/2}$(I)$_{3-x/2}$ | |
|---|---|---|---|---|---|---|
| x % en value | Band gap (eV) | PL peak (eV) | Band gap (eV) | PL peak (eV) | Band gap (eV) | PL peak (eV) |
| 0 | 1.21 | 1.25 | 1.44 | 1.55 | 1.52 | 1.62 |
| 4 | 1.25 | 1.27 | 1.53 | 1.6 | 1.56 | 1.68 |
| 10 | 1.28 | 1.31 | 1.57 | 1.65 | 1.65 | 1.71 |

TABLE 17-continued

Measured band gap energy (eV) from the absorption spectra and the corresponding PL peak positions (eV) for all hollow and pristine examined materials (x = 0). The maximum recorded energy difference values were 0.22 eV for the $(MA)_{1-x/2}(en)_{x/2}(Sn)_{1-x/2}(I)_{3-x/2}$ compounds, 0.12 eV for the $(FA)_{1-x/2}(en)_{x/2}(Pb)_{1-x/2}(I)_{3-x/2}$ compounds and 0.13 eV for the $(MA)_{1-x/2}(en)_{x/2}(Pb)_{1-x/2}(I)_{3-x/2}$ compounds.

| normalized | $(MA)_{1-x/2}(en)_{x/2}$ $(Sn)_{1-x/2}(I)_{3-x/2}$ | | $(FA)_{1-x/2}(en)_{x/2}$ $(Pb)_{1-x/2}(I)_{3-x/2}$ | | $(MA)_{1-x/2}(en)_{x/2}$ $(Pb)_{1-x/2}(I)_{3-x/2}$ | |
|---|---|---|---|---|---|---|
| x % en value | Band gap (eV) | PL peak (eV) | Band gap (eV) | PL peak (eV) | Band gap (eV) | PL peak (eV) |
| 20 | 1.35 | 1.49 | 1.67 | 1.73 | 1.73 | 1.86 |
| 28 | 1.42 | 1.59 | 1.69 | 1.81 | 1.85 | 1.93 |
| 36 | 1.45 | 1.67 | 1.71 | 1.83 | 2 | — |
| 40 | 1.51 | 1.73 | 1.94 | — | 2.1 | — |

Materials and Methods

Starting Materials

All starting materials for synthesis were purchased commercially and were used without further purification. Lead (II) acetate trihydrate puriss. p.a., ACS, 99.5-102.0%, Tin(II) chloride dihydrate puriss. p.a., ACS, ≥98%, Methylamine hydrochloride ≥98%, Formamidine acetate 99%, Hypophosphorous acid solution 50 wt. % in $H_2O$, Hydriodic acid 57 wt. % in $H_2O$, distilled, stabilized, 99.95%, Ethylenediamine ReagentPlus®, ≥99% and Dimethyl sulfoxide-$d_6$ 99.9 atom % D were purchased from Aldrich. 20 mL glass scintillation vials were used in all the syntheses of the materials. The same batch of starting materials was used in all syntheses.

$^1$H-NMR Measurements $^1$H NMR spectra were recorded on 600 MHz Bruker, A600 spectrometer. All samples were prepared by dissolving a small portion of the dried solids (~10 mg) in a DMSO-$d_6$ solution (0.5 mL). The actual amount of en (x) that residing in the crystal structure was determined by $^1$H-NMR spectroscopy. The (x) value was used for the calculations of all the examined crystal formulas.

From NMR spectroscopy, it was possible to calculate only the ratio between en and MA, FA molecules. In order to find a way to quantify the amount of en relative to the MA, another equation was introduced that included the two molecules, namely:

$$en + MA = 1 \quad (eq. 1)$$

This means that since there were only two organic molecules in the structure, the total organic content should have been equal to 1 (or 100%). Therefore, the actual amount of en (x) is the solution of the system of the two equations, equation (1), and the ratio found from the NMR spectra. This is the amount of en that was used in all formula calculations and is mentioned in Table 13 and Tables 14-16.

XRD Measurements

Single-Crystal X-Ray Diffraction

Single crystal diffraction experiments were performed using either a STOE IPDS II or IPDS 2T diffractometer using Mo Kα radiation (λ=0.71073 Å) and operating at 50 kV and 40 mA. Integration and numerical absorption corrections were performed using the X-AREA, X-RED, and X-SHAPE programs. The structure was solved by charge flipping and refined by full-matrix least squares on $F^2$ with the Jana2006 package. (See, e.g., Petricek, V., et al., 2014, 229, 345.)

Powder X-Ray Diffraction

Powder X-ray diffraction patterns were collected on a Rigaku Miniflex system (CuKα radiation) operated at 40 kV and 15 mA. A typical scan rate was 10 sec/step with a step size of 0.02 deg. The data were manipulated with CMPR, and Rietveld analysis was performed with the Jana2006 package. (See, e.g., Toby, B., J. Appl. Crystallogr. 2005, 38, 1040.) All PXRD patterns were recorded on the same in-house instrument, except for the patterns used in PDF analysis, where they were recorded at synchrotron.

Pair Distribution Function Analysis

For the synchrotron total scattering measurements, samples of fine powder, obtained by the means described above, were transferred into Kapton capillaries (0.81 mm OD, 0.8 mm ID) and tightly compacted to ensure a maximum packing fraction. Both ends of the capillaries were sealed with epoxy and stored at RT. The synchrotron X-ray total scattering measurements were recorded on the 11-ID-B beam line at the Advanced Photon Source located at Argonne National Laboratory.

Optical Spectroscopy

Optical diffuse-reflectance measurements were performed at room temperature using a Shimadzu UV-3600 PC double-beam, double-monochromator spectrophotometer operating from 200 to 2500 nm. $BaSO_4$ was used as a non-absorbing reflectance reference. The generated reflectance-versus-wavelength data were used to estimate the band gap of the material by converting reflectance to absorbance data according to the Kubelka-Munk equation: $\alpha/S=(1-R)2/2R$, where R is the reflectance and α and S are the absorption and scattering coefficients, respectively. (See, e.g., Gate, L. F., Appl. Opt. 1974, 13, 236.)

PL Measurements

All samples were measured using a Horiba LabRam Evolution high-resolution confocal Raman microscope spectrometer (600 g/mm diffraction grating) equipped with a diode continuous wave laser (473 nm, 25 mW) and a Synapse charge-coupled device camera. The maximum power output of the laser source was filtered to 1% of the maximum power output.

TGA Measurements

The Thermogravimetric Analysis (TGA) measurements were performed on a Netzsch's Simultaneous Thermal Analysis (STA) system. An amount of ~15 mg of sample was placed inside an alumina cap and heated up to 700° C. under He flow with a heating rate of 8° C./min.

SEM/EDX

Scanning Electron Microscopy (SEM) measurements were recorded on a high-resolution field emission Hitachi SU8030. A Hitachi S3400N-II instrument equipped with a PGT energy-dispersive X-ray analyser was used for the EDX measurements. Data were acquired with an accelerating voltage of 20 kV.

Density Measurements

A Micromeritics AccuPyc II 1340 pycnometer was utilized for the density determination of all samples. An amount of 400 mg of dry sample was loaded into an aluminum cap (1 mL) and the volume determination was performed based on He displacement. Each sample was measured 5 times, and the sample volume was recorded along with the standard deviation. The average volume of each sample was used for the density calculations.

DFT Calculations

First-principles electronic structure calculations were carried out within the density functional theory (DFT) formalism using the Projector Augmented Wave method implemented in Vienna Ab-initio Simulation Package. (See, e.g., Blöchl, P. E., *Phys. Rev. B* 1994, 50, 17953; and Kresse, G., et al., *Phys. Rev. B* 1996, 54, 11169.) The internal atomic positions were optimized until the atomic forces on each atom were less than 0.01 eV/Å with the plane-wave cutoff energy of 350 eV and a 4×3×3 F-centered Monkhorst-Pack k-point grid, while the volume and shape of the unit cell were fixed. Multiple possible orientations of $PbI_2$ vacancies in the single-vacancy supercells and multiple configurations of $PbI_2$ vacancies in two-vacancy supercells were considered, and lowest-energy configurations were selected for further band structure analysis. For the exchange-correlation function, the generalized gradient approximation (GGA) was employed within Perdew-Burke-Ernzerhof (PBE) formalism and the spin-orbit coupling (SOC) was included in the calculation. (See, e.g., Perdew, J. P., et al., *Phys. Rev. Lett.* 1996, 77, 3865.)

Syntheses

Syntheses of $(MA)_{1-x/2}(en)_{x/2}(Sn)_{1-x/2}(I)_{3-x/2}$ (x: 0%, 5%, 9%, 21%, 24%, 36%, 40%)

α-MASnI$_3$: 679.95 mg (3 mmol) of $SnCl_2 \cdot 2H_2O$ were dissolved in a solution consisting of 8 mL of 57% w/w aqueous HI and 1.5 mL of 50% aqueous $H_3PO_2$, by heating to boiling under constant magnetic stirring. Then 202.56 mg (3 mmol) of methylamine hydrochloride were added to the hot yellow solution, leading to the formation of black crystals. The crystals were collected by suction filtration and dried in a vacuum oven at 110° C. for 12 h. Yield: 637 mg, (40% based on Sn).

x=5%: 679.95 mg (3 mmol) of $SnCl_2 \cdot 2H_2O$ were dissolved in a 57% w/w aqueous HI solution (8 mL) by heating to boiling under constant magnetic stirring for about 5 minutes. Then 20 μL of ethylenediamine (0.3 mmol) were added to 50% aqueous $H_3PO_2$ (1.5 mL) at RT. This solution was added to the hot reaction solution. Subsequent addition of 202.56 mg (3 mmol) of methylamine hydrochloride to the hot yellow solution lead to the formation of black crystals. Stirring was continued for 5 min. The crystals were collected by suction filtration and dried in a vacuum oven at 110° C. for 12 h. Yield: 630 mg, (39.5% based on Sn).

x=9%: 679.95 mg (3 mmol) of $SnCl_2 \cdot 2H_2O$ were dissolved in a 57% w/w aqueous HI solution (8 mL) by heating to boiling under constant magnetic stirring for about 5 minutes. Then 40 μL of ethylenediamine (0.6 mmol) were added to 50% aqueous $H_3PO_2$ (1.5 mL) at RT. This solution was added to the hot reaction solution. Subsequent addition of 202.56 mg (3 mmol) of methylamine hydrochloride to the hot yellow solution led to the formation of black crystals. Stirring was continued for 5 min. The crystals were collected by suction filtration and dried in a vacuum oven at 110° C. for 12 h. Yield: 640 mg, (40.1% based on Sn).

x=21%: 679.95 mg (3 mmol) of $SnCl_2 \cdot 2H_2O$ were dissolved in a 57% w/w aqueous HI solution (8 mL) by heating to boiling under constant magnetic stirring for about 5 minutes. Then 100 μL of ethylenediamine (1.5 mmol) were added to 50% aqueous $H_3PO_2$ (1.5 mL) at RT. This solution was added to the hot reaction solution. Subsequent addition of 202.56 mg (3 mmol) of methylamine hydrochloride to the hot yellow solution led to the formation of black crystals. Stirring was continued for 5 min. The crystals were collected by suction filtration and dried in a vacuum oven at 110° C. for 12 h. Yield: 646 mg, (40.5% based on Sn).

x=24%: 679.95 mg (3 mmol) of $SnCl_2 \cdot 2H_2O$ were dissolved in a 57% w/w aqueous HI solution (8 mL) by heating to boiling under constant magnetic stirring for about 5 minutes. Then 120 μL of ethylenediamine (1.8 mmol) were added to 50% aqueous $H_3PO_2$ (1.5 mL) at RT. This solution was added to the hot reaction solution. Subsequent addition of 202.56 mg (3 mmol) of methylamine hydrochloride to the hot yellow solution led to the formation of black crystals. Stirring was continued for 5 min. The crystals were collected by suction filtration and dried in a vacuum oven at 110° C. for 12 h. Yield: 635 mg, (39.8% based on Sn).

x=36%: 679.95 mg (3 mmol) of $SnCl_2 \cdot 2H_2O$ were dissolved in a 57% w/w aqueous HI solution (8 mL) by heating to boiling under constant magnetic stirring for about 5 minutes. Then 160 μL of ethylenediamine (2.4 mmol) were added to 50% aqueous $H_3PO_2$ (1.5 mL) at RT. This solution was added to the hot reaction solution. Subsequent addition of 202.56 mg (3 mmol) of methylamine hydrochloride to the hot yellow solution led to the formation of black crystals. Stirring was continued for 5 min. The crystals were collected by suction filtration and dried in a vacuum oven at 110° C. for 12 h. Yield: 620 mg, (38.9% based on Sn).

x=40%: 679.95 mg (3 mmol) of $SnCl_2 \cdot 2H_2O$ were dissolved in a 57% w/w aqueous HI solution (8 mL) by heating to boiling under constant magnetic stirring for about 5 minutes. Then 200 μL of ethylenediamine (3 mmol) were added to 50% aqueous $H_3PO_2$ (1.5 mL) at RT. This solution was added to the hot reaction solution. Subsequent addition of 202.56 mg (3 mmol) of methylamine hydrochloride to the hot yellow solution led to the formation of black crystals. Stirring was continued for 5 min. The crystals were collected by suction filtration and dried in a vacuum oven at 110° C. for 12 h. Yield: Yield: 610 mg, (38.3% based on Sn).

Syntheses of $(FA)_{1-x/2}(en)_{x/2}(Pb)_{1-x/2}(I)_{3-x/2}$ (x: 0%, 7%, 11%, 21%, 27%, 29%, 39%)

α-FAPbI$_3$: 1137 mg (3 mmol) of $Pb(CH_3CO_2)_2 \cdot 3H_2O$ were dissolved in a solution consisting of 8 mL of 57% w/w aqueous HI and 1.2 mL of 50% aqueous $H_3PO_2$, by heating to boiling under constant magnetic stirring. Then 312 mg (3 mmol) of formamidine acetate were added to the hot yellow solution, leading to the formation of yellow crystals (δ phase). The reaction mixture was heated for additional 10 min, where all the yellow crystals turned black (a phase). The crystals were collected immediately by suction filtration and dried in a vacuum oven at 110° C. for 12 h. Yield: 1044 mg, (55% based on Pb).

x=7%: 1137 mg (3 mmol) of $Pb(CH_3CO_2)_2 \cdot 3H_2O$ were dissolved in a 57% w/w aqueous HI solution (8 mL) by heating to boiling under constant magnetic stirring for about 5 minutes. Then 20 μL of ethylenediamine (0.3 mmol) were added to 50% aqueous $H_3PO_2$ (1.2 mL) at RT. This solution was added to the hot reaction solution. Subsequent addition of 312 mg (3 mmol) of formamidine acetate to the hot yellow solution led to the formation of black crystals.

Stirring was continued for 5 min. The crystals were collected by suction filtration and dried in a vacuum oven at 110° C. for 12 h. Yield: 1065 mg, (56% based on Pb).

x=11%: 1137 mg (3 mmol) of $Pb(CH_3CO_2)_2 \cdot 3H_2O$ were dissolved in a 57% w/w aqueous HI solution (8 mL) by heating to boiling under constant magnetic stirring for about 5 minutes. Then 40 μL of ethylenediamine (0.6 mmol) were added to 50% aqueous $H_3PO_2$ (1.2 mL) at RT. This solution was added to the hot reaction solution. Subsequent addition of 312 mg (3 mmol) of formamidine acetate to the hot yellow solution led to the formation of black crystals. Stirring was continued for 5 min. The crystals were collected by suction filtration and dried in a vacuum oven at 110° C. for 12 h. Yield: 1101 mg, (58% based on Pb).

x=21%: 1137 mg (3 mmol) of $Pb(CH_3CO_2)_2 \cdot 3H_2O$ were dissolved in a 57% w/w aqueous HI solution (8 mL) by heating to boiling under constant magnetic stirring for about 5 minutes. Then 100 μL of ethylenediamine (1.5 mmol) were added to 50% aqueous $H_3PO_2$ (1.2 mL) at RT. This solution was added to the hot reaction solution. Subsequent addition of 312 mg (3 mmol) of formamidine acetate to the hot yellow solution led to the formation of black crystals. Stirring was continued for 5 min. The crystals were collected by suction filtration and dried in a vacuum oven at 110° C. for 12 h. Yield: 1006 mg, (53% based on Pb).

x=27%: 1137 mg (3 mmol) of $Pb(CH_3CO_2)_2 \cdot 3H_2O$ were dissolved in a 57% w/w aqueous HI solution (8 mL) by heating to boiling under constant magnetic stirring for about 5 minutes. Then 140 μL of ethylenediamine (2.1 mmol) were added to 50% aqueous $H_3PO_2$ (1.2 mL) at RT. This solution was added to the hot reaction solution. Subsequent addition of 312 mg (3 mmol) of formamidine acetate to the hot yellow solution led to the formation of black crystals. Stirring was continued for 5 min. The crystals were collected by suction filtration and dried in a vacuum oven at 110° C. for 12 h. Yield: 968 mg, (51% based on Pb).

x=29%: 1137 mg (3 mmol) of $Pb(CH_3CO_2)_2 \cdot 3H_2O$ were dissolved in a 57% w/w aqueous HI solution (8 mL) by heating to boiling under constant magnetic stirring for about 5 minutes. Then 160 μL of ethylenediamine (2.4 mmol) were added to 50% aqueous $H_3PO_2$ (1.2 mL) at RT. This solution was added to the hot reaction solution. Subsequent addition of 312 mg (3 mmol) of formamidine acetate to the hot yellow solution led to the formation of black crystals. Stirring was continued for 5 min. The crystals were collected by suction filtration and dried in a vacuum oven at 110° C. for 12 h. Yield: 930 mg, (49% based on Pb).

x=39%: 1137 mg (3 mmol) of $Pb(CH_3CO_2)_2 \cdot 3H_2O$ were dissolved in a 57% w/w aqueous HI solution (10 mL) by heating to boiling under constant magnetic stirring for about 5 minutes. Then 200 μL of ethylenediamine (3 mmol) were added to 50% aqueous $H_3PO_2$ (1.2 mL) at RT. This solution was added to the hot reaction solution. Following this, 312 mg (3 mmol) of formamidine acetate were added to the hot yellow solution, giving rise to the precipitation of a black powder, which was rapidly dissolved under stirring to afford a clear bright yellow solution. The stirring was then discontinued, and the solution was left to cool to room temperature. Upon cooling, dark red crystals were deposited. The crystals were collected by suction filtration and dried in a vacuum oven at 110° C. for 12 h. Yield: 720 mg, (38% based on Pb).

Syntheses of $(MA)_{1-x/2}(en)_{x/2}(Pb)_{1-x/2}(I)_{3-x/2}$ (x: 0%, 3%, 10%, 29%, 35%, 40%, 44%)

β-MAPbI$_3$: 1137 mg (3 mmol) of $Pb(CH_3CO_2)_2 \cdot 3H_2O$ were dissolved in a solution consisting of 5 mL of 57% w/w aqueous HI and 1.2 mL of 50% aqueous $H_3PO_2$, by heating to boiling under constant magnetic stirring. Then 202.56 mg (3 mmol) of methylamine hydrochloride were added to the hot yellow solution, leading to the formation of black crystals. The crystals were collected by suction filtration and dried in a vacuum oven at 110° C. for 12 h. Yield: 837 mg, (45% based on Pb).

x=3%: 1137 mg (3 mmol) of $Pb(CH_3CO_2)_2 \cdot 3H_2O$ were dissolved in a 57% w/w aqueous HI solution (5 mL) by heating to boiling under constant magnetic stirring for about 5 minutes. Then 20 μL of ethylenediamine (0.3 mmol) were added to 50% aqueous $H_3PO_2$ (1.2 mL) at RT. This solution was added to the hot reaction solution. Subsequent addition of 202.56 mg (3 mmol) of methylamine hydrochloride to the hot yellow solution led to the formation of black crystals. The crystals were collected by suction filtration and dried in a vacuum oven at 110° C. for 12 h. Yield: 818 mg, (44% based on Pb).

x=10%: 1137 mg (3 mmol) of $Pb(CH_3CO_2)_2 \cdot 3H_2O$ were dissolved in a 57% w/w aqueous HI solution (5 mL) by heating to boiling under constant magnetic stirring for about 5 minutes. Then 40 μL of ethylenediamine (0.6 mmol) were added to 50% aqueous $H_3PO_2$ (1.2 mL) at RT. This solution was added to the hot reaction solution. Subsequent addition of 202.56 mg (3 mmol) of methylamine hydrochloride to the hot yellow solution led to the formation of black crystals. The crystals were collected by suction filtration and dried in a vacuum oven at 110° C. for 12 h. Yield: 874 mg, (47% based on Pb).

x=29%: 1137 mg (3 mmol) of $Pb(CH_3CO_2)_2 \cdot 3H_2O$ were dissolved in a 57% w/w aqueous HI solution (5 mL) by heating to boiling under constant magnetic stirring for about 5 minutes. Then 100 μL of ethylenediamine (1.5 mmol) were added to 50% aqueous $H_3PO_2$ (1.2 mL) at RT. This solution was added to the hot reaction solution. Subsequent addition of 202.56 mg (3 mmol) of methylamine hydrochloride to the hot yellow solution led to the formation of black crystals. The crystals were collected by suction filtration and dried in a vacuum oven at 110° C. for 12 h. Yield: 781 mg, (42% based on Pb).

x=35%: 1137 mg (3 mmol) of $Pb(CH_3CO_2)_2 \cdot 3H_2O$ were dissolved in a 57% w/w aqueous HI solution (5 mL) by heating to boiling under constant magnetic stirring for about 5 minutes. Then 120 μL of ethylenediamine (1.8 mmol) were added to 50% aqueous $H_3PO_2$ (1.2 mL) at RT. This solution was added to the hot reaction solution. Following this, 202.56 mg (3 mmol) of methylamine hydrochloride were added to the hot yellow solution. The stirring was then discontinued, and the solution was left to cool to room temperature. Upon cooling, dark red crystals were deposited. The crystals were collected by suction filtration and dried in a vacuum oven at 110° C. for 12 h. Yield: 725 mg, (39% based on Pb).

x=40%: 1137 mg (3 mmol) of $Pb(CH_3CO_2)_2 \cdot 3H_2O$ were dissolved in a 57% w/w aqueous HI solution (5 mL) by heating to boiling under constant magnetic stirring for about 5 minutes. Then 140 μL of ethylenediamine (2.1 mmol) were added to 50% aqueous $H_3PO_2$ (1.2 mL) at RT. This solution was added to the hot reaction solution. Following this, 202.56 mg (3 mmol) of methylamine hydrochloride were added to the hot yellow solution. The stirring was then discontinued, and the solution was left to cool to room temperature. Upon cooling, red crystals were deposited. The crystals were collected by suction filtration and dried in a vacuum oven at 110° C. for 12 h. Yield: 632 mg, (34% based on Pb).

x=44%: 1137 mg (3 mmol) of $Pb(CH_3CO_2)_2 \cdot 3H_2O$ were dissolved in a 57% w/w aqueous HI solution (5 mL) by heating to boiling under constant magnetic stirring for about 5 minutes. Then 200 µL of ethylenediamine (3 mmol) were added to 50% aqueous H₃PO₂ (1 mL) at RT. This solution was added to the hot reaction solution. Following this, 202.56 mg (3 mmol) of methylamine hydrochloride were added to the hot yellow solution. The stirring was then discontinued, and the solution was left to cool to room temperature. Upon cooling, orange crystals were deposited. The crystals were collected by suction filtration and dried in a vacuum oven at 110° C. for 12 h. Yield: 465 mg, (25% based on Pb).

EXAMPLE 4

Figure 26B:
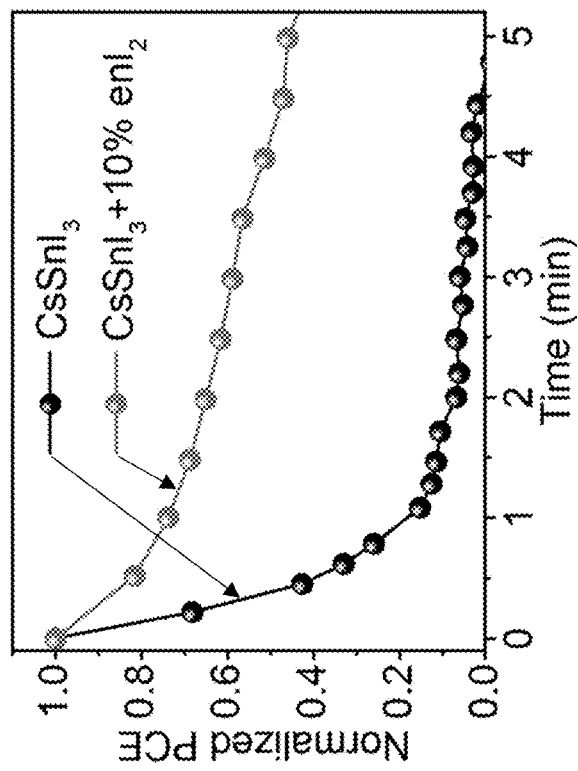
FIG. 26B shows the PCE over time for the solar cells of FIG. 26A.
Figure 26A:
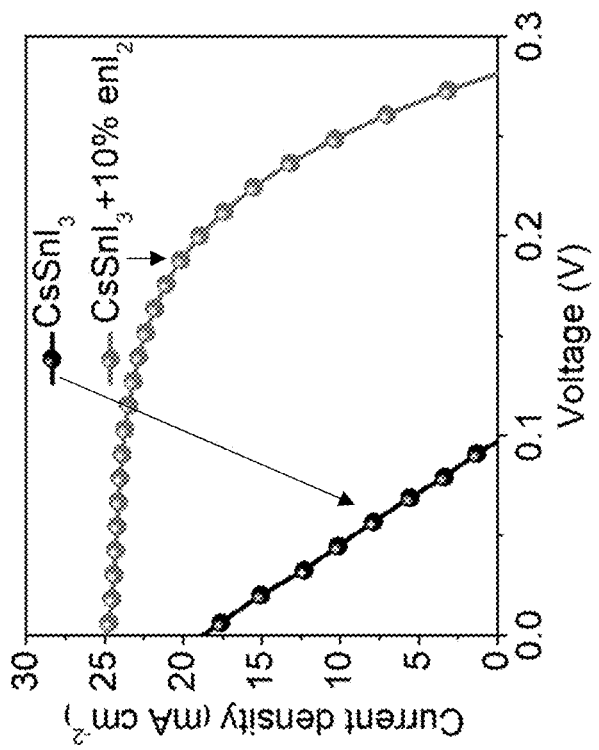
FIG. 26A shows the J-V curves for a solar cell having en/CsSnI$_3$ crystals as absorber material and for a solar cell having CsSnI$_3$ as an absorber material.

Diammonium cations were added to the synthesis of $CsSnI_3$ ($CsSnI_3$+10% $enI_2$) using the techniques described herein to form crystals of the 3D perovskite en/$CsSnI_3$. The J-V curves for: (1) a solar cell using the en/$CsSnI_3$ as an absorber; and (2) a solar cell using $CsSnI_3$ as an absorber under a reverse voltage scan are shown in FIG. 26A. The normalized PCE for the two solar cells as a function of time is shown in FIG. 26B. These aging tests were conducting under constant AM1.5G illumination in ambient air.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A crystalline halide perovskite having a three-dimensional amAMX₃ perovskite crystal structure, wherein am is an alkyl diamine cation, an aromatic diamine cation, an aromatic azole cation, a cyclic alkyl diamine cation or a hydrazinediium cation; A is an alkali metal cation, X is a halide ion, and M is an octahedrally coordinated bivalent metal atom.

2. The crystalline halide perovskite of claim 1, wherein am is the alkyl diamine cation.

3. The crystalline halide perovskite of claim 2, wherein A is Cs, M is Sn, and X is I.

4. The crystalline halide perovskite of claim 3, wherein am is ethylene diammonium.

5. The crystalline halide perovskite of claim 1, wherein am is the aromatic diamine cation.

6. The crystalline halide perovskite of claim 5, wherein A is Cs, M is Sn, and X is I.

7. The crystalline halide perovskite of claim 1, wherein am is the aromatic azole cation.

8. The crystalline halide perovskite of claim 7, wherein A is Cs, M is Sn, and X is I.

9. The crystalline halide perovskite of claim 1, wherein am is the cyclic alkyl diamine cation.

10. The crystalline halide perovskite of claim 9, wherein A is Cs, M is Sn, and X is I.

11. The crystalline halide perovskite of claim 1, wherein am is the hydrazinediium cation.

12. The crystalline halide perovskite of claim 11, wherein A is Cs, M is Sn, and X is I.

13. A crystalline halide perovskite selected from: amASnI₃, where A is methylammonium and am is an alkyl diamine cation, an aromatic diamine cation, an aromatic azole cation, a cyclic alkyl diamine cation or a hydrazinediium cation; enASnI₃, where en is ethylene diammonium and A is formamidinium; and enAPbI₃, where en is ethylene diammonium and A is formamidinium.

14. The crystalline halide perovskite of claim 13, wherein the crystalline halide perovskite is the amASnI₃.

15. The halide perovskite of claim 14, wherein am is ethylene diammonium.

16. The crystalline halide perovskite of claim 13, wherein the crystalline halide perovskite is the enASnI₃.

17. The crystalline halide perovskite of claim 13, wherein the crystalline halide perovskite is the enAPbI₃.

* * * * *